United States Patent [19]
Sanada

[11] Patent Number: 5,843,527
[45] Date of Patent: Dec. 1, 1998

[54] COATING SOLUTION APPLYING METHOD AND APPARATUS

[75] Inventor: Masakazu Sanada, Kyoto, Japan

[73] Assignee: Dainippon Screen Mfg. Co., Ltd., Japan

[21] Appl. No.: 662,216

[22] Filed: Jun. 11, 1996

[30] Foreign Application Priority Data

| Jun. 15, 1995 | [JP] | Japan | 7-174127 |
| Sep. 28, 1995 | [JP] | Japan | 7-276373 |
| Sep. 28, 1995 | [JP] | Japan | 7-276375 |
| Jan. 29, 1996 | [JP] | Japan | 8-035563 |
| Jan. 29, 1996 | [JP] | Japan | 8-035565 |
| Feb. 26, 1996 | [JP] | Japan | 8-065502 |

[51] Int. Cl.$^6$ ..................................................... B05D 3/12
[52] U.S. Cl. ....................... 427/240; 427/385.5; 437/231
[58] Field of Search ................................ 427/240, 385.5; 437/231

[56] References Cited

U.S. PATENT DOCUMENTS

| 4,267,212 | 5/1981 | Sakawaki | 427/240 |
| 5,066,616 | 11/1991 | Gordon | 427/240 |
| 5,254,367 | 10/1993 | Matsumura et al. | 427/240 |

OTHER PUBLICATIONS

"An experimental study of rivulet instabilities in centrifugal spin coating of viscous Newtonian and non–Newtonian fluids" by Nathalie Fraysse and George M. Homsy; Phys. Fluids, vol. 6, No. 4, Apr. 1994; pp. 1491–1504.

*Primary Examiner*—Janyce Bell
*Attorney, Agent, or Firm*—Ostrolenk, Faber, Gerb & Soffen, LLP

[57] ABSTRACT

A method of applying a coating solution to spinning substrates, in which a controller causes a rotary support to spin a substrate at low speed with a predetermined supplying rotational frequency. The coating solution is supplied through a coating solution supply nozzle to a region centrally of the substrate spinning at low speed. The rotational frequency of the substrate is increased to a target rotational frequency before the coating solution supplied to the substrate spreads over an entire surface of the substrate. Then, the controller causes the rotary support to spin the substrate at high speed with a predetermined film-forming rotational frequency, thereby coating the surface of the substrate with a film of desired thickness. Also, an apparatus for performing such method.

25 Claims, 28 Drawing Sheets

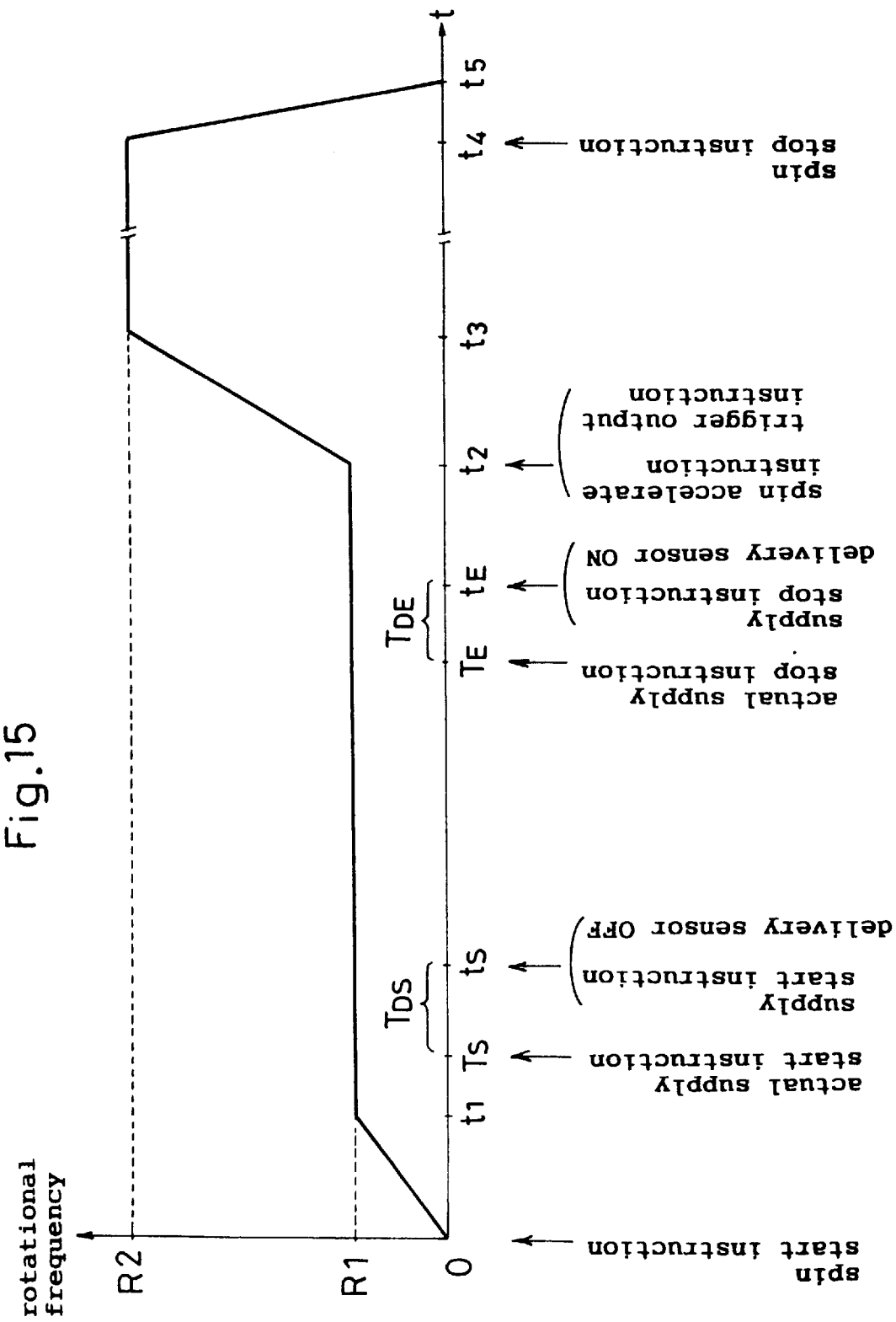

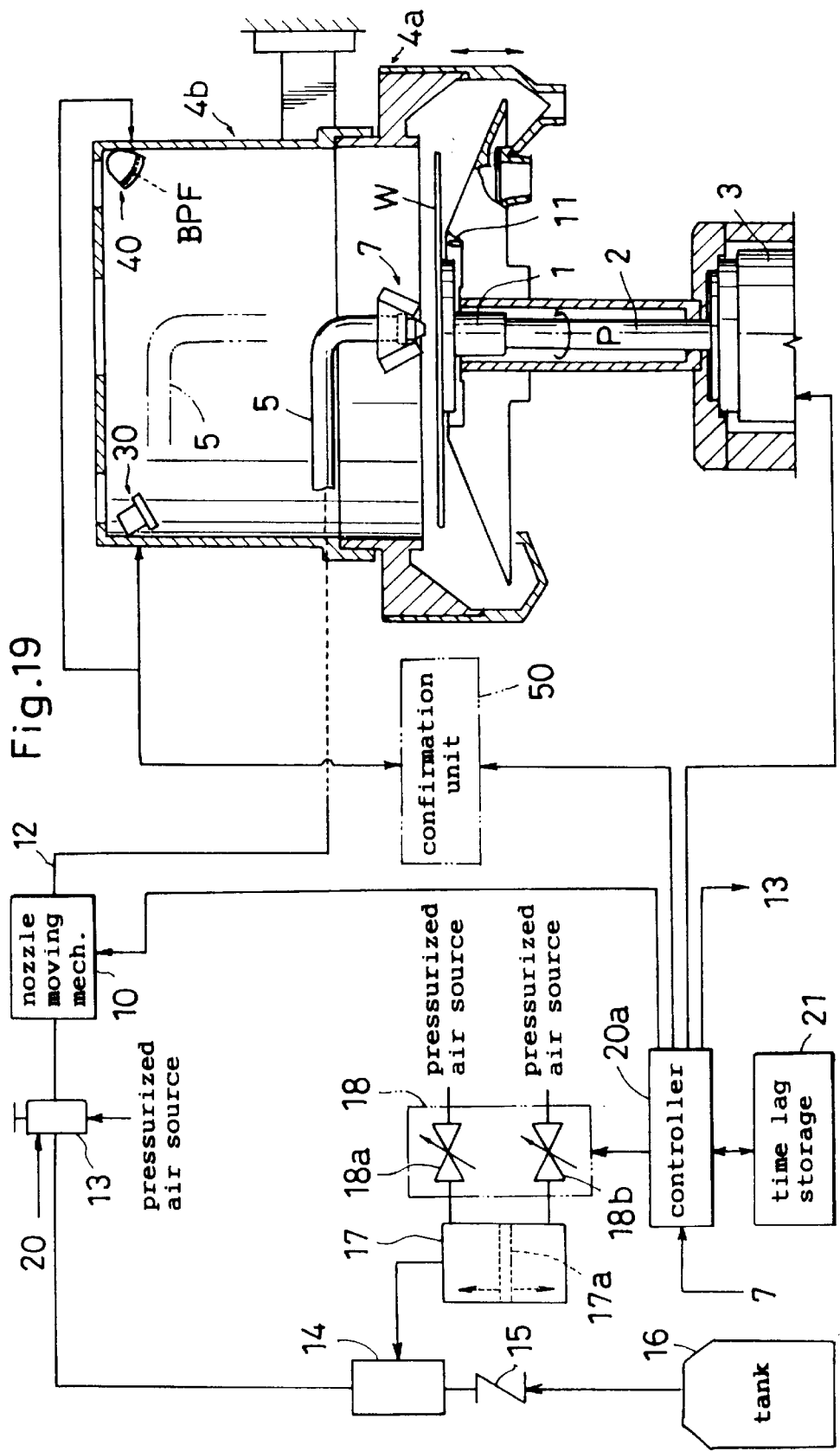

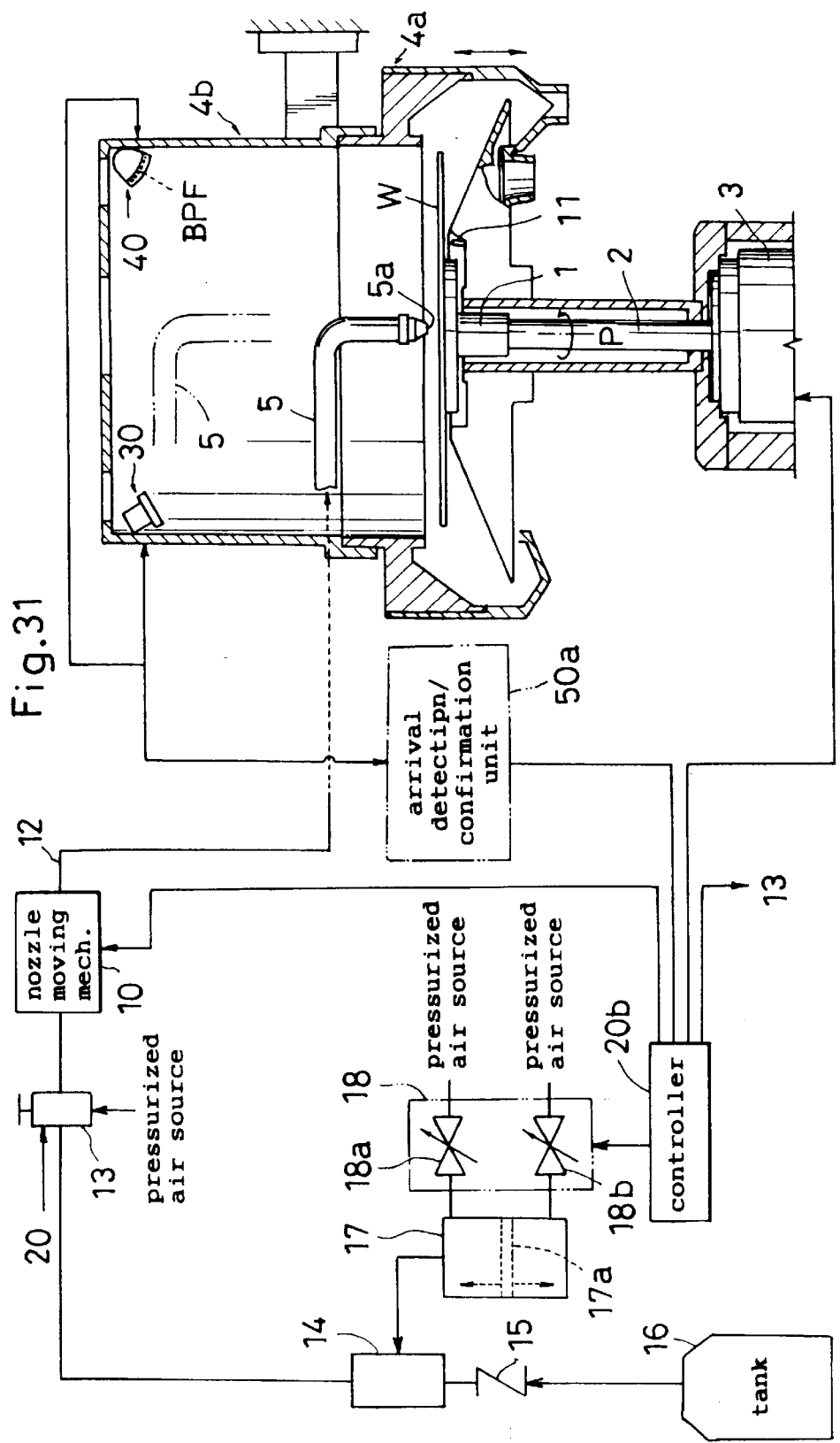

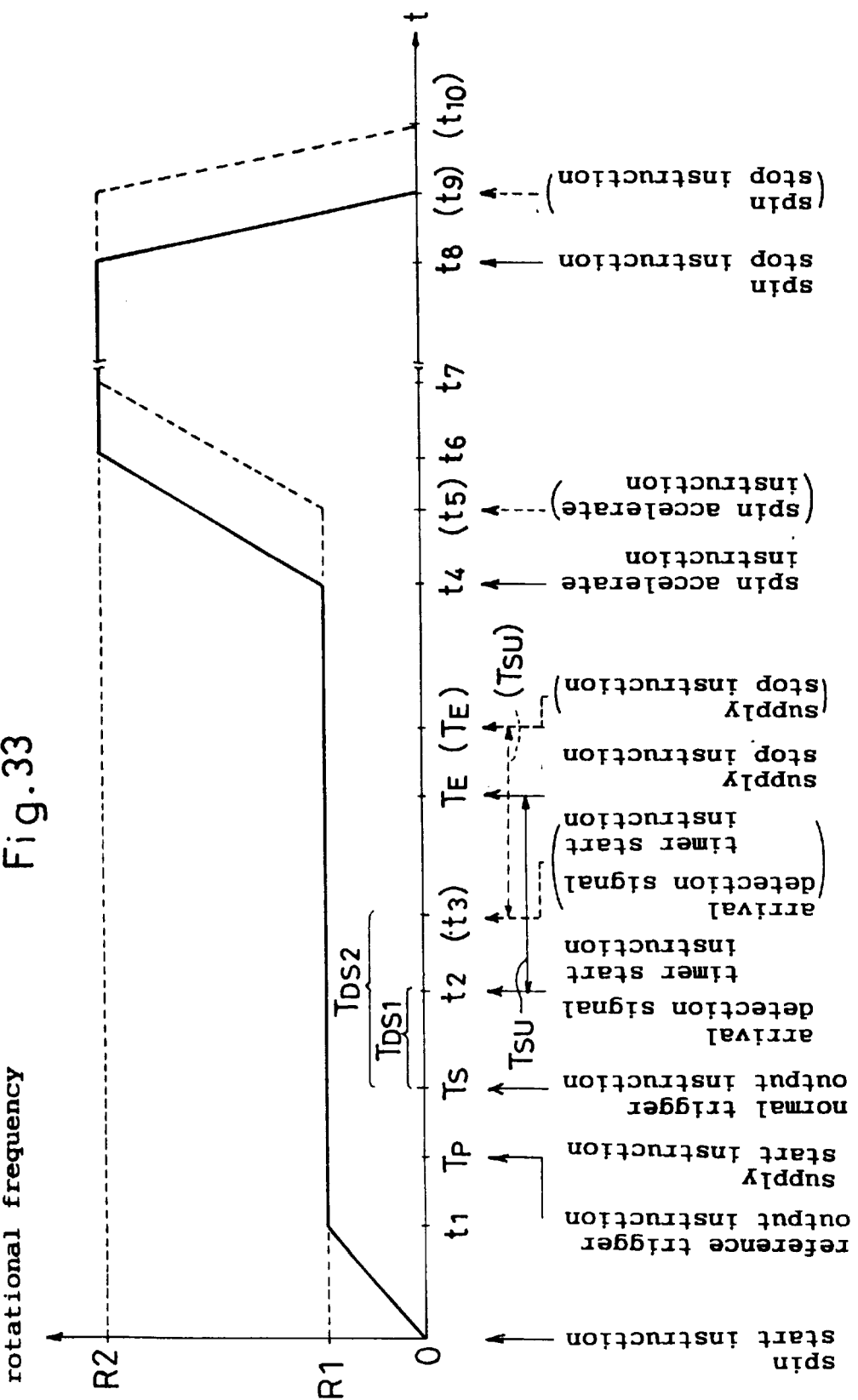

COATING SOLUTION APPLYING METHOD AND APPARATUS

BACKGROUND OF THE INVENTION

(1) Field of the Invention

This invention relates to methods and apparatus for applying a coating solution, such as a photoresist, polyimide resin for forming a passivation film, or SOG (Spin On Glass, also called a silica coating material) to substrates, such as semiconductor wafers, glass substrates for photomasks, glass substrates for liquid crystal displays or glass substrates for optical disks. More particularly, the invention relates to a coating solution applying method and apparatus for supplying a coating solution to a region around the center of a substrate spun at a predetermined low rotational frequency, to spread the coating solution over the surface of the substrate, and thereafter spinning the substrate at a predetermined high rotational frequency, thereby to form a film of the coating solution in a desired thickness on the substrate surface.

(2) Description of the Related Art

A conventional coating solution applying method of the type noted above will be described, based on the apparatus shown in FIG. 1. The following description will be made exemplifying a semiconductor wafer as a substrate under treatment, which will be referred to hereinafter simply as a wafer.

FIG. 1 shows a principal portion of a substrate spin coating apparatus. The apparatus includes a suction type spin chuck 1 for suction-supporting and spinning a wafer W in a substantially horizontal posture, and a coating solution supply nozzle 5 disposed substantially over the center of spin for supplying a photoresist solution R, which is a coating solution, to a surface of substrate W.

The apparatus of FIG. 1 controls rotational frequency as shown in the time chart of FIG. 2, to form a photoresist film in a desired thickness on the surface of wafer W.

First, the spin chuck 1 is driven by a motor, not shown, to spin the wafer W at a predetermined rotational frequency R1 (e.g. 900 rpm). At a point of time at which the spin stabilizes, photoresist solution R begins to be delivered at a substantially constant flow rate from the supply nozzle 5 (referenced $t_S$ in FIG. 2). Photoresist solution R continues to be supplied to a region around the spin center of wafer W. The supply of photoresist solution R is stopped at a point of time ($t_E$ in FIG. 2) which is a predetermined time after the photoresist supply starting point $t_S$. Then, the rotational frequency of the spin chuck 1 is increased from rotational frequency R1 to rotational frequency R2 (e.g. 3,000 rpm). This higher rotational frequency R2 is maintained for a predetermined time. Consequently, a superfluous part of photoresist solution R supplied to the surface of wafer W is dispelled, thereby forming a photoresist film in a desired thickness on the surface of wafer W. In the following description, the rotational frequency R1 of wafer W selected when supplying the photoresist solution will be called supplying rotational frequency R1, while the rotational frequency R2 selected for reducing the photoresist solution covering the entire surface of wafer W to the desired thickness will be called film-forming rotational frequency R2.

In the conventional method described above, a photoresist film is formed as a result of the behavior of photoresist solution R schematically shown in FIGS. 3A through 3F. In these figures, wafer W is shown in circles and photoresist solution R as hatched regions, for simplicity of illustration. The varied rotational frequencies of wafer W are schematically indicated by different sizes of arrows in the figures.

Immediately after commencement of the photoresist being supplied to the surface of wafer W, spinning at the slow supplying rotational frequency R1, photoresist solution R is present around the spin center of wafer W in the form of a drop Ra circular in plan view (which is hereinafter referred to as core Ra). As photoresist solution R continues to be supplied, the centrifugal force generated by the spinning spreads the core Ra concentrically toward the edge of wafer W while allowing the core Ra to substantially retain a circular shape.

The core Ra retains the circular shape for a while (e.g. for several seconds, though this depends on the rotational frequency) and thereafter undergoes conspicuous changes in shape. Specifically, photoresist solution R begins to flow in a plurality of rivulets (hereinafter referred to as "fingers Rb") extending radially from the edge of circular core Ra toward the edge of wafer W. These numerous fingers Rb, by the centrifugal force, continue to grow toward the edge of wafer W with an increase in the diameter of core Ra (FIG. 3A). The fingers Rb have a larger turning radius, and are therefore subjected to a greater centrifugal force, than the core Ra. Consequently, the fingers Rb grow toward the edge of wafer W faster than the enlargement of core Ra (FIG. 3B).

As photoresist solution R continues to be supplied to the wafer W spinning at the same supplying rotational frequency R1, leading ends of fingers Rb reach the edge of wafer W (FIG. 3C). With the fingers Rb having reached the edge of wafer W, the photoresist solution R flows from the core Ra through the fingers Rb to the edge of wafer W to be scattered away (in scattering photoresist solution Rc).

As the diameter of the core Ra increases further, the fingers Rb become broader (as shown in two-dot-and-dash lines in FIG. 3C and FIG. 3D). As a result, regions between the fingers Rb not covered by photoresist solution R gradually diminish, until finally the entire surface of wafer W is covered by photoresist solution R (core Ra and fingers Rb) (FIG. 3E). Timing is determined beforehand for stopping the delivery of photoresist solution R through the supply nozzle 5 at this point of time (reference $t_E$ in FIG. 2).

After the entire surface of wafer W is covered with photoresist solution R as above, the rotational frequency of wafer W is increased from the supplying rotational frequency R1 to the faster, film-forming rotational frequency R2. A superfluous part of photoresist solution R covering the surface of wafer W is dispelled (as excess photoresist solution Rd), thereby forming a photoresist film R' in a desired thickness on the surface of wafer W (FIG. 3F).

The conventional method described above has the following drawback.

When the numerous fingers Rb reach the edge of wafer W, as shown in FIG. 3C, a large portion of photoresist solution R subsequently supplied becomes scattering photoresist solution Rc, which flowing from the core Ra through the fingers Rb to be cast off into the ambient. A large quantity of photoresist solution R must therefore be supplied before the entire surface of wafer W is covered by the photoresist solution R, leading to an excessive consumption of photoresist solution R. That is, the photoresist film R' of desired thickness is obtained as a result of an inefficient use of photoresist solution R. A coating solution, such as photoresist solution, is far more expensive than a treating solution, such as a developer or a rinse. Thus, a reduction in the quantity of unused, and scattered coating solution is an important consideration in achieving low manufacturing costs of semiconductor elements, semiconductor devices and the like.

SUMMARY OF THE INVENTION

This invention has been made having regard to the state of the art noted above, and its object is to provide a coating solution applying method and apparatus incorporating improved rotational frequency controls to drastically reduce the quantity of coating solution supplied to form a coating film in a desired thickness.

The above object is fulfilled, according to this invention, by a method of applying a coating solution to spinning substrates, comprising the steps of:

(a) operating a control device to spin a substrate supported by a rotary supporting device, at low speed with a predetermined supplying rotational frequency;

(b) supplying the coating solution through a coating solution supplying device to a region centrally of the substrate spinning at low speed;

(c) operating the control device to increase the rotational frequency of the substrate to a target rotational frequency before the coating solution supplied to the substrate spreads over an entire surface of the substrate spinning at low speed; and (d) operating the control device to spin the substrate supported by the rotary supporting device, at high speed with a predetermined film-forming rotational frequency, thereby coating the surface of the substrate with a film of desired thickness.

While the control device causes a substrate supported by a rotary supporting device to spin at low speed with a predetermined supplying rotational frequency, the coating solution is supplied through the coating solution supplying device to a region centrally of the substrate. Then, the spin is accelerated from the low supplying rotational frequency to the higher film-forming rotational frequency, thereby forming a film of desired thickness on the surface of the substrate. In the course of this process, as described above, numerous fingers Rb begin to grow in rivulets from the edge of circular core Ra of coating solution R toward the edge of wafer W (see FIGS. 3A and 3B). After the fingers Rb reach the edge of wafer W (FIG. 3C), the photoresist solution R flows through the fingers Rb to be scattered away (in scattering photoresist solution Rc) (FIGS. 3C and 3D). Consequently, the coating solution is wasted in very large quantity.

To avoid this inconvenience, the control device is operated to increase the rotational frequency of wafer W to the target rotational frequency before the coating solution R supplied to the surface of wafer W spreads by the low supplying rotational frequency and covers the entire surface of wafer W, i.e. before the core Ra in the circular shape as shown in FIG. 3A covers the entire surface of wafer W with the integration of core Ra and fingers Rb as shown in FIG. 3C.

This operation will be described, taking for example a case of increasing the rotational frequency of wafer W from the supplying rotational frequency (low-speed spin) to the target rotational frequency (high-speed spin) when the fingers Rb extend from the core Ra, as shown in FIG. 3B, to provide a condition suited for the operation. This rotational frequency control results in a behavior of the coating solution as schematically shown in FIG. 7.

If the low supplying rotational frequency R1 were maintained as in the prior art, the core Ra and fingers Rb would enlarge and grow, under the centrifugal force, from the hatched region in FIG. 7 toward the edge of wafer W as shown in two-dot-and-dash lines in FIG. 7. When, in this condition, the rotational frequency is increased (accelerated) to the target rotational frequency, the fingers Rb are subjected to a force of inertia, i.e. a force acting in the opposite direction to the spinning direction (indicated by solid-line arrow R1 in FIG. 7). The combination of centrifugal and inertial forces bends the fingers Rb circumferentially, thereby enlarging widths thereof, as shown in dotted lines in FIG. 7, while the centrifugal force causes the leading ends of fingers Rb to grow toward the edge of wafer W. The diameter of core Ra increases also.

The fingers Rb not only grow toward the edge of wafer W, but also widens circumferentially of wafer W. Consequently, spaces between the fingers Rb rapidly diminish before the fingers Rb reach the edge of wafer W, thereby shortening the time taken for the coating solution to cover the entire surface of wafer W (hereinafter referred to as "coating time). A short coating time means a short time from commencement of the coating solution supply to cessation of the coating solution supply with the coating solution covering the entire surface of wafer W. In other words, a reduced time is consumed after the fingers Rb reach the edge of wafer W till the coating solution supply is stopped. The coating solution is scattered away from the edge of wafer W in a correspondingly reduced quantity. Thus, a film of desired thickness may be formed with a reduced quantity of coating solution.

As described above, the rotational frequency of the substrate is increased to the target rotational frequency before the coating solution supplied to the substrate surface spreads by the low supplying rotational frequency and covers the entire substrate surface. This operation applies a force of inertia to the rivulets extending radially of the coating solution in a concentric circle, thereby rapidly diminishing the spaces between the radially extending rivulets. Consequently, the coating solution covers the entire substrate surface in a reduced time. A reduced quantity of coating solution flows through the radial rivulets and thus less is scattered from the substrate. Thus, a film of desired thickness may be formed with a reduced quantity of coating solution. Since the coating solution, which is more expensive than a treating solution such as a developer or a rinse, may be used in a reduced quantity, semiconductor elements, semiconductor devices and the like may be manufactured at reduced cost and with improved throughput.

In the method according to this invention, the step of increasing the rotational frequency of the substrate to the target rotational frequency, preferably, is initiated after a point of time at which radial flows of the coating solution begin to occur from the edge of the coating solution supplied to the surface of the substrate and spread thereon in a circular shape in plan view, and before the radial flows reach the edge of the substrate.

According to this method, the rotational frequency of the substrate begins to increase toward the target rotational frequency after the radial rivulets begin to grow from the coating solution supplied to the surface of the substrate and spread in the substantially circular shape in plan view (core Ra), i.e. after forming the state shown in FIG. 3C, and before the radial rivulets of the coating solution (fingers Rb) reach the edge of the substrate, i.e. before reaching the state shown in FIG. 3C. With this method, a force of inertia is effectively applied to the fingers Rb to enlarge the widths thereof, thereby achieving a further reduction in the quantity of coating solution flowing through the fingers Rb to the edge of the substrate to be scattered therefrom. Thus, a reduced quantity of coating solution is required for forming a film of desired thickness.

Preferably, the target rotational frequency equals the film-forming rotational frequency.

The rotational frequency of the substrate is increased from the predetermined low, supplying rotational frequency for receiving the coating solution to the predetermined high, film-forming rotational frequency as a target frequency for forming a film of desired thickness. The rotational frequency of the substrate is increased before the radial rivulets of the coating solution supplied reach the edge of the substrate. In the course of the rotational frequency increase, a force of inertia acts on the radial rivulets of the coating solution to enlarge the widths thereof, whereby the entire substrate surface is rapidly covered by the coating solution. Consequently, a reduced quantity of coating solution is scattered away after flowing through the radial rivulets reaching the edge of the substrate. Thus, a film of desired thickness may be formed with a reduced quantity of coating solution.

In the method according to this invention, the target rotational frequency may be higher than the film-forming rotational frequency.

To apply a force of inertia to the radial rivulets of the coating solution, the rotational frequency of the substrate is increased to the target rotational frequency higher than the film-forming rotational frequency for forming a film of desired thickness. A strong force of inertia may be applied to the radial rivulets of the coating solution in the course of the increase to the target rotational frequency, thereby rapidly enlarging the widths of the rivulets circumferentially of the substrate. This results in a further reduced time for covering the entire substrate surface with the coating solution, which reduces the quantity of unused coating solution scattering to the ambient through the radial rivulets of the coating solution having reached the edge of the substrate. Thus, a film of desired thickness may be formed with a reduced quantity of coating solution.

In the method according to this invention, the target rotational frequency may be lower than the film-forming rotational frequency.

To apply a force of inertia to the coating solution extending radially (fingers Rb), the rotational frequency of the substrate is increased to the target rotational frequency lower than the film-forming rotational frequency for forming a film of desired thickness. A force of inertia is applied to the radial fingers Rb in the course of the frequency increase, thereby enlarging the widths of the fingers Rb. This results in the coating solution rapidly covering the entire substrate surface. Since a relatively weak centrifugal force is applied to the fingers Rb, it takes a long time for the fingers Rb to reach the edge of the substrate. In other words, there occurs a short period from the time the fingers Rb reach the edge of the substrate to the time the substrate surface is covered by the coating solution and the coating solution supply is stopped. A correspondingly reduced quantity of coating solution is scattered away after flowing through the fingers Rb. Thus, a film of desired thickness may be formed with a reduced quantity of coating solution. After the entire substrate surface is covered by the coating solution, the rotational frequency of the substrate is switched from the target rotational frequency to the film-forming rotational frequency for forming a film of desired thickness. Consequently, a superfluous part of the coating solution is discarded to realize a film of desired thickness.

In the method according to this invention, the rotational frequency is increased from the supplying rotational frequency to the target rotational frequency, preferably, with an acceleration of 7,500 to 50,000 rpm/sec.

The range of acceleration is set to 7,500 to 50,000 rpm/sec. for increasing the rotational frequency from the supplying rotational frequency to the target rotational frequency. If the acceleration for increasing the rotational frequency to the target rotational frequency is too low, the force of inertia will not be strong enough to enlarge the widths of the fingers sufficiently. If the acceleration is too high, an excessive force of inertia will scatter the coating solution from the substrate surface, or the fingers will grow, under centrifugal force, toward the edge of the substrate at a greater rate than the enlargement of the widths of the fingers, thereby scattering the coating solution in an increased quantity through the fingers. Thus, by increasing the rotational frequency with an acceleration in the above range, the coating solution may be prevented from scattering away, and a force of inertia may be applied effectively to the fingers while suppressing the growth of the fingers toward the edge of the substrate. With the suppression of scattering away of the coating solution, a further reduced quantity of coating solution is required for forming a film of desired thickness.

In another aspect of this invention, there is provided an apparatus for applying a coating solution to spinning substrates, comprising:

- a rotary supporting device for horizontally supporting and spinning a substrate;
- a coating solution supplying device for supplying the coating solution to a region centrally of the substrate; and
- a control device operable, based on a processing program containing a plurality of instructions including a supply start instruction and specifying a series of processes stored in advance, for spinning the substrate supported by the rotary supporting device, at low speed with a predetermined supplying rotational frequency, executing the supply start instruction to supply the coating solution through the coating solution supplying device, increasing the rotational frequency of the substrate to a target rotational frequency before the coating solution supplied to the substrate spreads over an entire surface of the substrate, and spinning the substrate at high speed with a predetermined film-forming rotational frequency, thereby coating the surface of the substrate with a film of desired thickness.

Based on a processing program containing a plurality of instructions including a supply start instruction and specifying a series of processes stored in advance (the program being also called a spin coat program" which specifies the type of coating solution, rotational frequencies for coating, times for coating, and so on), the control device supplies the coating solution through the coating solution supplying device to the central region of the substrate supported in horizontal posture by the rotary supporting device and spinning at low speed with the predetermined supplying rotational frequency, and spins the substrate at high speed with the film-forming rotational frequency to form a film of desired thickness on the substrate surface. Before the coating solution supplied to the substrate surface covers the entire substrate surface, the control device increases the rotational frequency of the substrate to the target rotational frequency to apply a force of inertia to the rivulets of the coating solution extending radially from the coating solution in a concentric circle. The force of inertia acts to rapidly diminish the spaces between the radial rivulets of the coating solution. Consequently, the coating solution covers the entire substrate surface in a reduced time. A reduced quantity of coating solution flows through the radial rivulets and thus less is scattered from the substrate. Thus, a film of desired thickness may be formed with a reduced quantity of coating solution. Since the coating solution, which is more expensive than a treating solution such as a developer or a rinse, may be used in a reduced quantity, semiconductor elements, semiconductor devices and the like may be manufactured at reduced cost and with improved throughput. That is, this apparatus can advantageously implement the coating solution applying method according to this invention.

Preferably, the above apparatus further comprises a measurement control device for measuring and storing a start time lag and a stop time lag, the measurement control device including:

a delivery detecting device for detecting delivery and non-delivery of the coating solution from the coating solution supplying device;

a time lag measuring device for measuring a period of time (start time lag) from execution of the supply start instruction by the control device to detection of delivery of the coating solution by the delivery detecting device, and a period of time (stop time lag) from execution of a supply stop instruction by the control device to detection of non-delivery of the coating solution by the delivery detecting device; and a time lag storing device for storing the start time lag and the stop time lag measured by the time lag measuring device;

wherein the control device is operable, when supplying the coating solution to the substrate based on the processing program, for advancing execution of the supply start instruction by the start time lag stored in the time lag storing device, and advancing execution of the supply stop instruction by the stop time lag stored in the time lag storing device.

Before describing the functions of this apparatus, a conventional apparatus will be discussed.

In the conventional coating solution applying apparatus, a controller, based on a processing program specifying a series of processes stored in advance, executes a spin start instruction to spin a substrate at low speed with a predetermined supplying rotational frequency, for example. Then, the controller executes a supply start instruction to start delivering a coating solution through a coating solution supply nozzle, and executes a supply stop instruction to stop the delivery of the coating solution. Subsequently, the substrate is spun at high speed with a film-forming rotational frequency, thereby coating the entire surface of the substrate with a film of desired thickness.

When the controller executes the supply start instruction, the coating solution is delivered from a nozzle tip to the substrate surface by action of an air cylinder and a bellows pump. The air cylinder is operable by pressurized air fed thereto from a pressurized air source which is one of utilities installed in a cleanroom, to actuate the bellows pump. When the controller executes the supply stop instruction, the pressurized air is exhausted from the air cylinder to stop the delivery of the coating solution from the nozzle tip. The air cylinder has speed control valves connected thereto for adjusting flow rates of the pressurized air to and from the air cylinder.

Further, a suckback valve is connected to the coating solution supply nozzle, which is operable upon cessation of the coating solution delivery to slightly draw back part of the coating solution remaining inside the nozzle. This action is taken to avoid the inconvenience of the coating solution inadvertently dripping from the nozzle tip to the substrate. When delivering the coating solution through the supply nozzle, the action of the suckback valve is canceled substantially simultaneously with operation of the air cylinder. Conversely, when stopping the delivery, the suckback valve is operated as the pressurized air is exhausted from the air cylinder. This suckback valve, as is the air cylinder, is operable by pressurized air fed thereto from a pressurized air source which is one of the utilities installed in the cleanroom.

In the above apparatus, the coating solution is not delivered immediately upon execution of the supply start instruction by the controller, but there occurs a time lag until the coating solution is actually delivered from the tip of the coating solution supply nozzle. In practice, the coating solution is delivered from the supply nozzle with a delay at least corresponding to the time lag from the point of time the controller executes the supply start instruction. Thus, the prepared processing program may not enable a desired process to be performed accurately.

To avoid this inconvenience, the processing program is prepared for the conventional apparatus by taking the above time lag into account. That is, the point of time for executing the supply start instruction is advanced by the time lag, so that the coating solution be delivered at an intended point of time. This measure is hereinafter referred to as a manual time lag correction. Specifically, it is assumed, for example, that the time lag is $T_{DS}$ where the coating solution should be delivered from the supply nozzle at a point of time $T_S$ at which the spin of the substrate sufficiently stabilizes at the supplying rotational frequency after execution of the spin start instruction. Then, the processing program is prepared for allowing the supply start instruction to be executed at a point of time $T_S-T_{DS}$.

However, such a manual time lag correction results in the following inconveniences.

As noted above, the air cylinder and suckback valve involved in the coating solution supply are operable by the pressurized air source which is one of the utilities installed in the cleanroom. This pressurized air source usually is shared by other apparatus installed in the cleanroom. Its pressure undergoes subtle variations occurring on hourly basis (hourly variations) or on daily basis (daily variations) with its use situations. Since the variable utility is used to control starting and stopping of the coating solution supply, the above time lag may be prolonged or shortened with the variations in the utility pressure. Consequently, the manual time lag correction noted above cannot fully overcome the above inconvenience. An accurate process may be realized from the above processing program during certain hours (or on certain days), but not during other hours (or on other days). This produces varied results of treatment among different lots or within a lot despite use of the same processing program.

The air cylinder and suckback valve involved in the coating solution supply are operable at adjustable speeds. The time lag is variable also as a result of readjustment of the operating speeds of these components. Then, the above manual time lag correction requires the processing program to be amended whenever such readjustment is made. The manual time lag correction cannot fully overcome the above inconvenience.

The above description considers only the time lag in delivery of the coating solution. The air cylinder has the speed control valves for adjusting flow rates of the pressurized air to and from the air cylinder. Depending on this adjustment, there occurs, besides the time lag (start time lag) in delivery of the coating solution, a time lag from execution of the supply stop instruction by the controller to actual cessation of the delivery of the coating solution (stop time lag). With the delivery of the coating solution not stopped at a desired point of time, a desired coating treatment cannot be effected according to the processing program. Moreover, the stop time lag results in an excess supply of the coating solution to the substrate, which constitutes an wasteful consumption of the coating solution more expensive than a developer and a rinsing solution.

In the recent semiconductor manufacturing industry, in particular, high precision processing is required as the process becomes increasingly refined and the substrate ever larger. The processing program has become extremely delicate and precise. The manual time lag correction in supply of the coating solution as practiced with the conventional apparatus entails complicated and troublesome programming, or makes the whole programming impossible.

The apparatus according to this invention is capable of eliminating the above inconveniences while obtaining a film of desired thickness with a reduced quantity of coating solution. The functions of this apparatus will be described next.

First, the measurement control device measures time lags in supplying the coating solution as follows. The time lag measuring device starts a measuring operation at a point of time at which the control device executes the supply start instruction contained in the processing program, to measure a period of time (start time lag) taken till the delivery detecting device detects the coating solution delivered through the coating solution supplying device. The start time lag measured is stored in the time lag storing device. This start time lag corresponds to a deviation (delay) from an intended point of time for delivering the coating solution from the coating solution supplying device. As noted hereinbefore, this time lag results from a variation due to the operating speeds of the delivery mechanism and the like of the coating solution supplying device. Further, the time lag measuring device starts a measuring operation at a point of time at which the control device executes the supply stop instruction contained in the processing program, to measure a period of time (stop time lag) taken till the coating solution ceases to be delivered from the coating solution supplying device, i.e. till the delivery of the coating solution from the coating solution supplying device is stopped completely. As is the start time lag, the stop time lag measured is stored in the time lag storing device. This stop time lag corresponds to a deviation (delay) from an intended point of time for stopping the delivery of the coating solution from the coating solution supplying device. This time lag results from a variation due to the same cause as the start time lag.

The following process takes place when the control device carries out the processing program to supply the coating solution to the substrate.

When supplying the coating solution to the substrate based on the processing program, the control device actually executes the supply start instruction (actual supply start instruction) and the supply stop instruction (actual supply stop instruction) at corrected points of time which are advanced by the two time lags measured and stored in the time lag storing device, respectively. As noted above, these time lags are the start time lag corresponding to a delay from execution of the coating solution supply start instruction to actual delivery of the coating solution through the coating solution supplying device, and the stop time lag corresponding a delay from execution of the coating solution supply stop instruction to actual cessation of the delivery. Before the control device executes the instructions contained in the processing program, the point of time for executing the supply start instruction is known. In executing this supply start instruction, the point of time for executing this instruction is corrected, i.e. advanced by the start time lag, to determine an actual supply start instruction to be executed.

Similarly, in executing the supply stop instruction, the point of time for executing this instruction is corrected, i.e. advanced by the stop time lag stored in the time lag storing device, to determine an actual supply stop instruction to be executed.

In this way, the actual supply start instruction and actual supply stop instruction are executed by correcting (by advancing) the execution timing of the supply start instruction and supply stop instruction by the respective time lags measured. Consequently, the points of time at which the supply start instruction and supply stop instruction in the processing program are supposed to be executed before the correction are shifted to the point of time at which the coating solution is actually delivered through the coating solution supplying device and to the point of time at which the coating solution is actually stopped being delivered from the coating solution supplying device. This apparatus does not require a troublesome operation as practiced in the prior art when making a manual time lag correction to the points of time for executing the supply start instruction and supply stop instruction contained in the processing program. The processing program may be prepared with desired instruction executing timing, and the coating solution may be supplied and stopped at precise points of time.

A wasteful consumption of the coating solution may be suppressed since there occurs hardly any delay from the supply stop instruction to cessation of the coating solution supply. A photoresist solution is more expensive than a rinsing solution and the like, and therefore a substantial reduction may be achieved in the substrate manufacturing cost.

With the process performed accurately based on the intended processing program, the rotational frequency of the substrate may be increased from the supplying rotational frequency to the target rotational frequency at a precise point of time before the coating solution supplied to the substrate surface covers the entire substrate surface. That is, the point of time for increasing the rotational frequency to the target rotational frequency may be determined accurately since this apparatus may be regarded as being free from the above start time lag, with no variation occurring with the supplying device when the coating solution is actually delivered from the coating solution supplying device. As a result, in treating a plurality of substrates, a force of inertia may be applied when the radial rivulets of the coating solution have the same shape on each different substrate. A reduced quantity of coating solution flows through the radial rivulets extending to the edge of the substrate to be scattered therefrom. Thus, a film of desired thickness may be formed with a reduced quantity of coating solution, and a plurality of substrates may be coated in a uniform state.

Preferably, the measurement control device is operable, when the control device repeatedly executes the processing program to treat the substrates successively, for measuring a start time lag and a stop time lag during treatment of each substrate, and storing the start time lag and the stop time lag in the time lag storing device as a new start time lag and a new stop time lag, respectively, the control device being operable, when treating a next substrate, for advancing execution of the supply start instruction by the new start time lag stored in the time lag storing device, and advancing execution of the supply stop instruction by the new stop time lag stored in the time lag storing device.

When the control device repeatedly executes the processing program to treat a plurality of substrates successively (hereinafter referred to as a product substrate process), the measurement control device measures a start time lag and a stop time lag during treatment of each substrate, and stores these time lags in the time lag storing device as a new start time lag and a new stop time lag, respectively. That is, the measurement control device measures time lags from the points of time of execution of the (actual) supply start instruction and (actual) supply stop instruction corrected based on the two time lags stored previously, to the points of time at which the coating solution is actually delivered and stopped in treatment of each substrate. These time lags are stored as new time lags. When the control device processes a first substrate, for example, the control device executes the supply start instruction and supply stop instruction as actual supply start instruction and actual supply stop instruction at points of time corrected based on the two time lags measured in advance by the measurement control device and stored in the time lag storing device. During treatment of this first substrate, the measurement control device measures a start time lag from the actual supply start instruction and a stop time lag from the actual supply stop instruction, and stores these time lags as new time lags.

When processing a next substrate, the control device corrects the execution timing of the supply start instruction and supply stop instruction based on the previous time lags and new time lags stored in the time lag storing device. For example, when the control device processes the second substrate after the first substrate, the control device executes the actual supply start and actual supply stop instruction at points of time corrected based on the two time lags measured and stored previously and the two new time lags measured and stored during the treatment of the first substrate. The two time lags stored previously are due to the delivery mechanism of the coating solution supplying device, and are variable on hourly basis or daily basis. Thus, these previous time lags could vary with a period of time from the time of their measurement to the product substrate process. The time lags due to this variation correspond to the new time lags measured during the treatment of the immediately preceding substrate. Therefore, this variation may be absorbed by correcting the execution timing of the two instructions based on the new time lags and the time lags stored previously. It is thus possible to make an accurate correction also to deviations of the coating solution supply/stop timing due to hourly or daily variations. A reduced quantity of coating solution is required for obtaining a film of desired thickness, and a desired process based on the processing program may be secured with high precision over a long period of time. This produces the effect of suppressing variations in treatment among different lots or within a lot of substrates.

Preferably, the above apparatus further comprises an image pickup device for picking up an image of the surface of the substrate in response to an instruction from the control device, an image fetching device for fetching the image as a still picture, and a display device for displaying the still picture.

To determine validity of the processing program prepared with the manual time lag correction noted hereinbefore, it is necessary, when treating substrates based on the processing program, to pick up images of spreading behavior of the coating solution by means of a high-speed video camera or the like and observe the motion pictures in slow reproduction. It takes some time before validity of the processing program is determined. That is, it is necessary to make a timewise comparison between the pictures in slow reproduction and the processing program to determine precisely which points of time in the processing program are reflected in the pictures in slow reproduction. This is an extremely complicated and difficult operation. When the processing program is found improper, the program must be prepared all over again by repeating a series of steps for imaging and observing the spreading behavior of the coating solution, which is time-consuming and troublesome.

In successively treating a plurality of product substrates after a desired processing program is prepared, it is necessary to pick up images of spreading behavior of the coating solution by means of a high-speed video camera, as noted above, in order to determine whether the processing program provides proper treatment for the respective substrates. For the reason discussed above, this operation is extremely complicated and troublesome. Such a determining operation is practically impossible.

In the apparatus according to this invention, the image pickup device picks up an image of spreading behavior of the coating solution delivered to the surface of the substrate, and the image fetching device fetches the image as a still picture. By observing the still picture displayed on the display device, the operator may determine a way in which the coating solution, at a given point of time, spreads from the central region toward the edge of the substrate, i.e. behavior of the coating solution, as the substrate is spun. Thus, the behavior of the coating solution may easily be compared with the processing program in respect of time, to determine whether the substrate is properly treated based on the corrected processing program. The operator may manually stop the apparatus if the still picture shows that the treatment is improper. Thus, an improper coating process is precluded from being applied to succeeding wafers.

Preferably, the control device is operable for outputting a trigger signal at a predetermined point of time based on the processing program, the image pickup device being operable only when the trigger signal is outputted.

The control device outputs a trigger signal at a predetermined point of time while executing the processing program including the coating solution supply start instruction and supply stop instruction. The image pickup device picks up an image of the substrate surface only when the trigger signal is outputted, and therefore the display device displays a still picture of the substrate surface of that point of time. By observing this still picture, the operator may determine a state of the coating solution on the substrate surface occurring at that point of time. Trigger output timing may be set to a crucial point of time in the processing program to facilitate a comparison between still picture and processing program. The operator may readily determine properness of treatment based on the processing program simply by observing such a still picture. This feature provides an improvement in substrate quality.

Preferably, the supplying rotational frequency is increased to the target rotational frequency at the predetermined point of time for outputting the trigger signal.

The point of time for increasing the rotational frequency of the substrate from the low, supplying rotational frequency to the high, target rotational frequency is a crucial point of time at which the rivulets of the coating solution delivered to the substrate surface widens circumferentially of the substrate. By picking up an image of the substrate surface at this point of time, the operator may determine a behavior of the coating solution growing toward the edge of the substrate while spreading circumferentially thereof. The operator may readily determine properness of treatment based on the processing program, which contributes toward improved substrate quality.

Preferably, the apparatus further comprises a measurement control device for measuring and storing a start time lag and a stop time lag, the measurement control device including:

an arrival detecting device for detecting arrival and non-arrival at the substrate of the coating solution delivered from the coating solution supplying device;

a time lag measuring device for measuring a period of time (start time lag) from execution of the supply start instruction by the control device to detection of arrival of the coating solution by the arrival detecting device, and a period of time (stop time lag) from execution of a supply stop instruction by the control device to detection of non-arrival of the coating solution by the arrival detecting device; and a time lag storing device for storing the start time lag and the stop time lag measured by the time lag measuring device;

wherein the control device is operable, when supplying the coating solution to the substrate based on the processing program, for advancing execution of the supply start instruction by the start time lag stored in the time lag storing device, and advancing execution of the supply stop instruction by the stop time lag stored in the time lag storing device.

First, the measurement control device measures time lags in supplying the coating solution as follows. The time lag measuring device starts a measuring operation at a point of time at which the control device executes the supply start instruction contained in the processing program, to measure a period of time (start time lag) taken till the arrival detecting device detects arrival at the substrate of the coating solution supplied from the coating solution supplying device. The start time lag measured is stored in the time lag storing device. This start time lag corresponds to a deviation (delay) from an intended point of time for delivering the coating solution from the coating solution supplying device. This time lag results from a variation due to the operating speeds of the delivery mechanism and the like of the coating solution supplying device. Further, the time lag measuring device starts a measuring operation at a point of time at which the control device executes the supply stop instruction contained in the processing program, to measure a period of time (stop time lag) taken till the coating solution delivered from the coating solution supplying device ceases to arrive at the substrate, i.e. till the coating solution is stopped and the supply from the tip end of the supplying device to the substrate surface is stopped completely. As is the start time lag, the stop time lag measured is stored in the time lag storing device. This stop time lag corresponds to a deviation (delay) from an intended point of time for stopping the supply of the coating solution to the substrate. This time lag results from a variation due to the same cause as the start time lag.

The following process takes place when the control device carries out the processing program to supply the coating solution to the substrate.

When supplying the coating solution to the substrate based on the processing program, the control device actually executes the supply start instruction (actual supply start instruction) and the supply stop instruction (actual supply stop instruction) at corrected points of time which are advanced by the two time lags measured and stored in the time lag storing device, respectively. As noted above, these time lags are the start time lag corresponding to a delay from execution of the coating solution supply start instruction to actual arrival of the coating solution at the substrate, and the stop time lag corresponding a delay from execution of the coating solution supply stop instruction to actual cessation of the arrival of the coating solution at the substrate. Before the control device executes the instructions contained in the processing program, the point of time for executing the supply start instruction is known. In executing this supply start instruction, the point of time for executing this instruction is corrected, i.e. advanced by the start time lag, to determine an actual supply start instruction to be executed. Similarly, in executing the supply stop instruction, the point of time for executing this instruction is corrected, i.e. advanced by the stop time lag stored in the time lag storing device, to determine an actual supply stop instruction to be executed.

In this way, the actual supply start instruction and actual supply stop instruction are executed by correcting (by advancing) the execution timing of the supply start instruction and supply stop instruction by the respective time lags measured. Consequently, the points of time at which the supply start instruction and supply stop instruction in the processing program are supposed to be executed before the correction are shifted to the point of time at which the coating solution actually arrives at the substrate surface and to the point of time at which the coating solution actually stops arriving at the substrate surface. This apparatus does not require a troublesome operation as practiced in the prior art when making a manual time lag correction to the points of time for executing the supply start instruction and supply stop instruction contained in the processing program. The processing program may be prepared with desired instruction executing timing, and the coating solution may be supplied and stopped at precise points of time. Generally, a certain space is provided between the coating solution supplying device and the substrate surface. Strictly speaking, a delay due to this space occurs from the point of time of execution of each instruction to arrival or cessation of arrival of the coating solution at the substrate surface. However, the two time lags measured include the delay due to this space since the arrival detecting device detects arrival and cessation of arrival of the coating solution at the substrate surface. This feature enable a timing correction with improved precision.

As noted above, the actual supply start instruction and actual supply stop instruction are executed by correcting the execution timing of the supply start instruction and supply stop instruction by the respective time lags measured. The points of time at which the supply start instruction and supply stop instruction in the processing program are supposed to be executed before the correction are shifted to the point of time at which the coating solution actually arrives at the substrate surface and to the point of time at which the coating solution actually stops arriving at the substrate surface.

The supply start instruction and supply stop instruction contained in the processing program may be executed without correcting the intended points of time through a manual time lag correction. The processing program may be prepared with desired instruction executing timing, and the coating solution may be supplied and stopped at precise points of time. As a result, substrates may be treated precisely according to the desired processing program.

A wasteful consumption of the coating solution may be suppressed since there occurs hardly any delay from the supply stop instruction to cessation of the coating solution supply. A photoresist solution is more expensive than a rinsing solution and the like, and therefore a substantial reduction may be achieved in the substrate manufacturing cost.

With the process performed accurately based on the intended processing program, the rotational frequency of the substrate may be increased from the supplying rotational frequency to the target rotational frequency at a precise point of time before the coating solution supplied to the substrate surface covers the entire substrate surface. That is, the point of time for increasing the rotational frequency to the target rotational frequency may be determined accurately since this apparatus may be regarded as being free from the above start time lag, with no variation occurring with the supplying device when the coating solution is actually delivered from the coating solution supplying device and arrives at the substrate. As a result, in treating a plurality of substrates, a force of inertia may be applied when the radial rivulets of the coating solution have the same shape on each different substrate. A reduced quantity of coating solution flows through the radial rivulets extending to the edge of the substrate to be scattered therefrom. Thus, a film of desired thickness may be formed with a reduced quantity of coating solution, and a plurality of substrates may be coated in a uniform state.

Preferably, the measurement control device is operable, when the control device repeatedly executes the processing program to treat the substrates successively, for measuring a start time lag and a stop time lag during treatment of each substrate, and storing the start time lag and the stop time lag in the time lag storing device as a new start time lag and a new stop time lag, respectively, the control device being operable, when treating a next substrate, for advancing execution of the supply start instruction by the new start time lag stored in the time lag storing device, and advancing execution of the supply stop instruction by the new stop time lag stored in the time lag storing device.

The apparatus may further comprise an image pickup device for picking up an image of the surface of the substrate in response to an instruction from the control device, an image fetching device for fetching the image as a still picture, and a display device for displaying the still picture.

Preferably, the control device is operable for outputting a trigger signal at a predetermined point of time based on the processing program, the image pickup device being operable only when the trigger signal is outputted.

Preferably, the supplying rotational frequency is increased to the target rotational frequency at the predetermined point of time for outputting the trigger signal.

The apparatus may further comprise a delivery detecting device for detecting delivery of the coating solution from the coating solution supplying device;

wherein the control device is operable, when successively executing the instructions contained in the processing program, for starting supply of the coating solution to the substrate through the coating solution supplying device by executing the supply start instruction, and starting execution of subsequent instructions in response to detection of delivery of the coating solution by the delivery detecting device.

When the control device executes the supply start instruction while spinning the substrate supported by the rotary supporting device, the coating solution, ideally, is delivered at once through the coating solution supplying device. In practice, however, the coating solution is delivered after a certain time lag (i.e. start time lag variable on hourly basis or daily basis) from the point of time at which the supply start instruction is executed. After executing the supply start instruction, the control device executes subsequent instructions in response to detection of the coating solution by the delivery detecting device. Thus, a transition from the supply start instruction to the subsequent instructions may be made dependent on the point of time at which the coating solution is delivered. The start time lag and variations thereof may thereby be absorbed.

The absorption of the start time lag and variations thereof enables a constant coating solution supplying time. This in turn enables precise timing of the increase in the rotational frequency of the substrate from the supplying rotational frequency to the target rotational frequency. As a result, in treating a plurality of substrates, a force of inertia may be applied when the radial rivulets of the coating solution have the same shape on each different substrate. A reduced quantity of coating solution is scattered from the substrate to the ambient without being used. Thus, a film of desired thickness may be formed with a reduced quantity of coating solution. A plurality of substrates may be coated in a uniform state among different lots or within a lot. A steady process may be secured over a long period of time.

The apparatus may further comprise an arrival detecting device for detecting arrival at the substrate of the coating solution delivered from the coating solution supplying device;

wherein the control device is operable, when successively executing the instructions contained in the processing program, for starting supply of the coating solution to the substrate through the coating solution supplying device by executing the supply start instruction, and starting execution of subsequent instructions in response to detection of arrival of the coating solution by the arrival detecting device.

When the control device executes the supply start instruction while spinning the substrate supported by the rotary supporting device, the coating solution, ideally, arrives at the substrate at once through the coating solution supplying device. In practice, however, the coating solution arrives at the substrate after a certain time lag (i.e. start time lag variable on hourly basis or daily basis) from the point of time at which the supply start instruction is executed. After executing the supply start instruction, the control device executes subsequent instructions in response to detection of the coating solution by the arrival detecting device. Thus, a transition from the supply start instruction to the subsequent instructions may be made dependent on the point of time at which the coating solution arrives at the substrate. The start time lag and variations thereof may thereby be absorbed.

In this way, the control device executes the subsequent instructions in response to arrival of the coating solution at the substrate, whereby the transition to the subsequent instructions may be made dependent on the point of time at which the coating solution arrives at the substrate. The time lag occurring in the arrival of the coating solution and variations thereof may thereby be absorbed, which enables a constant coating solution supplying time. This in turn enables precise timing of the increase in the rotational frequency of the substrate from the supplying rotational frequency to the target rotational frequency. As a result, in treating a plurality of substrates, a force of inertia may be applied when the radial rivulets of the coating solution have the same shape on each different substrate. A reduced quantity of coating solution is scattered from the substrate to the ambient without being used. Thus, a film of desired thickness may be formed with a reduced quantity of coating solution. A plurality of substrates may be coated in a uniform state among different lots or within a lot. A steady process may be secured over a long period of time.

Preferably, the arrival detecting device includes an image pickup device for picking up images of the surface of the substrate, an image fetching device for fetching the images as still pictures, and a density determining device for recognizing arrival of coating solution at the surface of the substrate based on density variations in the still pictures.

The image pickup device picks up an image of the substrate surface, and the image fetching device fetches the image as a still picture. When the coating solution arrives at the substrate, the still picture undergoes a density variation due to a difference in reflectance between the substrate surface and the coating solution. Arrival of the coating solution at the substrate may be detected at a point of time at which the density variation occurs as detected by the density determining device. In response to the detection of arrival, the control device executes the instructions subsequent to the supply start instruction.

This arrival detecting device is less vulnerable to adverse influences such as of diffused reflection from the substrate surface than where a reflection type sensor is used to detect arrival based on presence or absence of light reflected from the substrate surface.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

FIG. 15 is a time chart showing a product wafer process;

FIG. 19 is a block diagram and vertical sectional view showing an outline of a substrate spin coating apparatus in a second embodiment of the present invention;

FIG. 31 is a block diagram and vertical sectional view showing an outline of a substrate spin coating apparatus in a fourth embodiment of the present invention;

FIG. 33 is a time chart showing a coating process;

DETAILED DESCRIPTION OF THE PREFERRED EMBODIMENTS

Preferred embodiments of this invention will be described in detail hereinafter with reference to the drawings.

<Coating Solution Applying Method>

Figure 4:
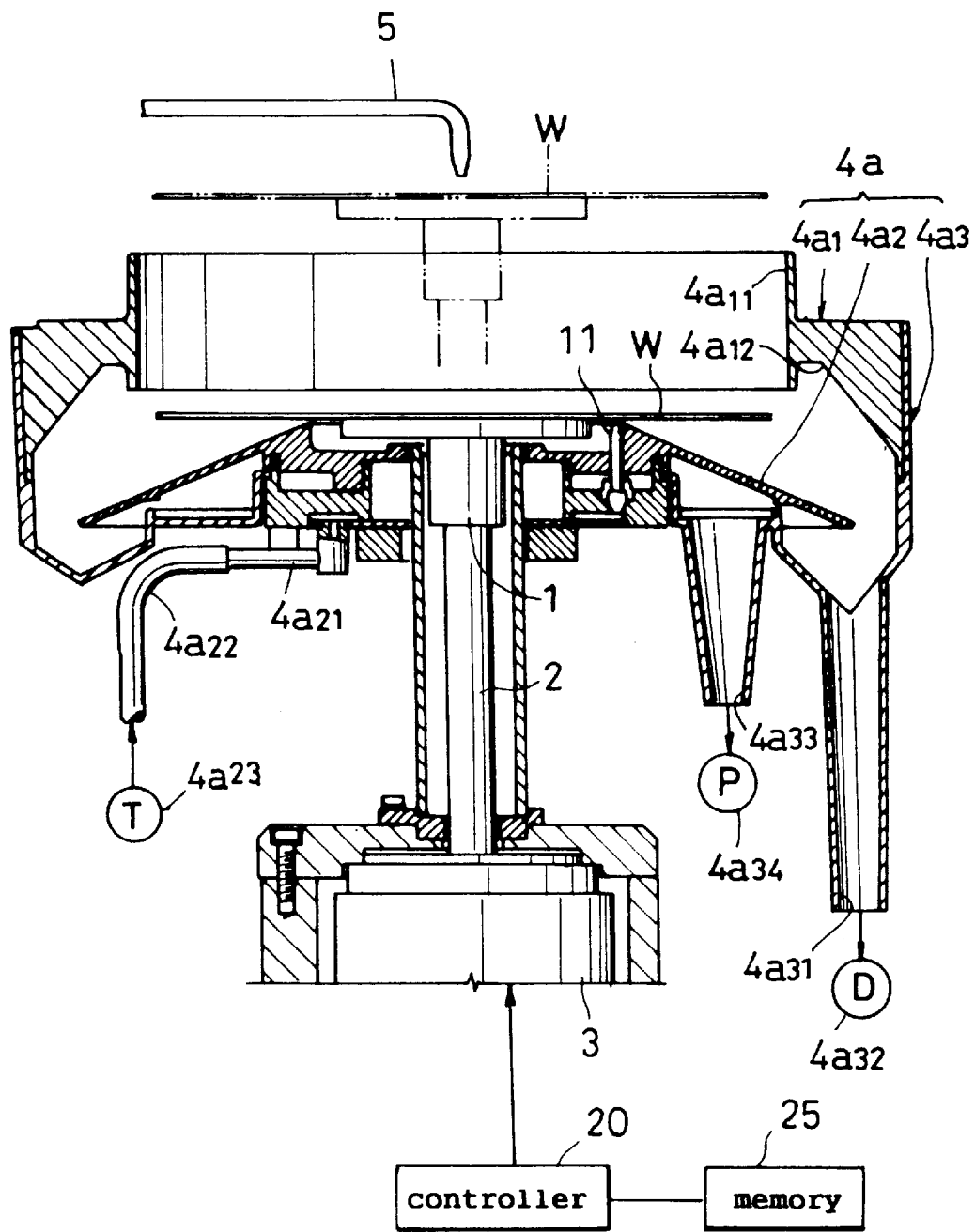
FIG. 4 is a block diagram and vertical sectional view showing an outline of a substrate spin coating apparatus employing a method according to the present invention.

FIG. 4 is a block diagram and vertical sectional view showing an outline of a substrate spin coating apparatus for executing a coating solution applying method embodying the present invention.

Reference numeral 1 in FIG. 4 denotes a suction type spin chuck for suction-supporting a substrate or wafer W in a substantially horizontal posture. This spin chuck 1 is attached to a hollow rotary shaft 2 to be rotatable by an electric motor 3. The spin chuck 1 is surrounded by a scatter preventive cup 4a for preventing a coating solution such as a photoresist solution from scattering into the ambient. When a transport device, not shown, places untreated wafer W on the spin chuck 1 or removes treated wafer W from the spin chuck 1, a lift device, not shown, vertically moves the rotary shaft 2 and scatter preventive cup 4a relative to each other, whereby the spin chuck 1 is raised above the scatter preventive cup 4a (as shown in two-dot-and-dash lines in FIG. 4). The spin chuck 1, rotary shaft 2 and electric motor 3 constitute the rotary supporting device of this invention.

The scatter preventive cup 4a includes an upper cup $4a_1$, a circular flow straightener $4a_2$ and a lower cup $4a_3$. The upper cup $4a_1$ defines an upper opening $4a_{11}$, and a slant surface $4a_{12}$ for downwardly guiding sprays of the photoresist solution or the like produced by spinning wafer W.

The flow straightener $4a_2$ straightens and downwardly guides air flows entering through the opening $4a_{11}$ and descending round the edge of wafer W. The sprays of the photoresist solution or the like guided downward by the slant surface $4a_{12}$ of upper cup $4a_1$ are entrained by these air flows to enter the lower cup $4a_3$.

The lower cup $4a_3$ has a liquid outlet $4a_{31}$ formed in a bottom thereof. The liquid outlet $4a_{31}$ is connected to a drain tank $4a_{32}$ for collecting the photoresist solution and the like scattered by a spin of wafer W. Further, a cup vent $4a_{33}$ is formed in the bottom of lower cup $4a_3$. The cup vent $4a_{33}$ is connected to an exhaust pump $4a_{34}$ to draw mist of the photoresist solution and the like along with air from inside the scatter preventive cup $4a$.

Back rinse nozzles 11 are arranged inside the circular flow straightener $4a_2$ for delivering a cleaning solution toward the back side surface of wafer W to remove photoresist solution flowing to the back side surface and any mist adhering thereto. The back rinse nozzles 11 receive the cleaning solution from a cleaning solution source $4a_{23}$ through a tube fitting $4a_{21}$ and a supply pipe $4a_{22}$.

A coating solution supply nozzle 5 is disposed above the opening $4a_{11}$ of scatter preventive cup 4a and is substantially dispersed over the spin center of wafer W for delivering the photoresist solution to the wafer W. This supply nozzle 5 corresponds to the coating solution supplying device of the present invention. A supply mechanism, not shown, for supplying the photoresist solution in a predetermined quantity to the nozzle 5, the lift device, not shown, for vertically moving the spin chuck 1 and scatter preventive cup 4a relative to each other in time of transporting wafer W, and the electric motor 3 are controlled by a controller 20 corresponding to the control device of the present invention. The controller 20 controls the above components based on a processing program (also called a spin coat program determining rotational frequencies, types of coating solution to be supplied, supply timing and so on) stored in a memory 25 and incorporating time charts described hereinafter.

A photoresist applying process will be described next with reference to the time chart of FIG. 5 and schematic views shown in FIGS. 6A through 6F. A processing program corresponding to this time chart provides a plurality of instructions including a supply start instruction, and is stored in the memory 25 shown in FIG. 4. The instructions in this processing program are successively executed by the controller 20. It is assumed that the wafer W to be treated is already placed on the suction type spin chuck 1 and that the supply nozzle 5 is standing by adjacent and above the spin center of wafer W. For expediency of illustration, the schematic views of FIGS. 6A through 6F show wafer W as circles and the photoresist solution as hatched regions.

First, the electric motor 3 is started. Specifically, the controller 20 causes the motor 3 to rotate forward to spin the wafer W counterclockwise in plan view. The rotational frequency R3 selected at this time is 1,500 rpm in this example. This rotational frequency R3 is hereinafter referred to as supplying rotational frequency R3. This step corresponds to step (a) in the method according to the present invention.

Figure 6A:
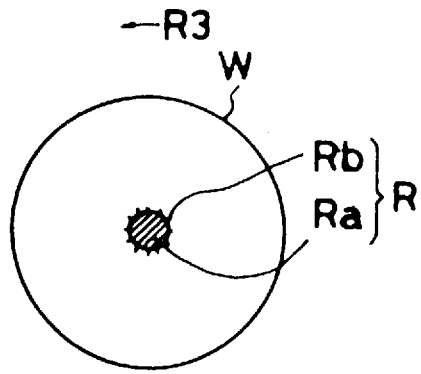
FIGS. 6A, 6B, 6C, 6D, 6E and 6F are schematic views showing a behavior of a photoresist solution.

At a point of time $t_S$ after the spinning wafer W stabilizes at supplying rotational frequency R3 (i.e. after several seconds), the supply start instruction is executed to start supplying the photoresist solution through the supply nozzle 5 to the surface of wafer W. At this point of time, the photoresist solution is present around the spin center of wafer W in the form of a drop Ra circular in plan view (which is hereinafter referred to as core Ra) (FIG. 6A). This step corresponds to step (b) in the method according to the invention.

As the photoresist solution continues to be supplied to the region around the spin center of wafer W, the centrifugal force generated by the spin spreads the core Ra concentrically toward the edge of wafer W while allowing the core Ra substantially to retain the circular shape.

The core Ra retains the circular shape for a while (e.g. for several seconds), and thereafter undergoes conspicuous changes in shape as follows.

Figure 6B:
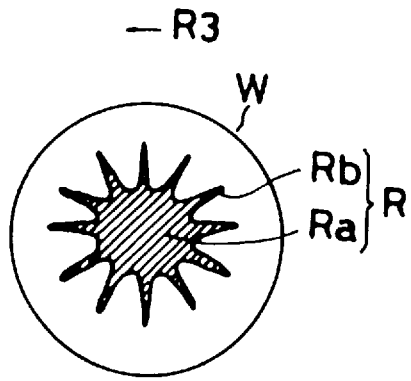

The photoresist solution begins to flow in a plurality of rivulets Rb (hereinafter referred to as fingers Rb) extending radially from the edge of circular core Ra toward the edge of wafer W (FIGS. 6A and 6B). These numerous fingers Rb, by the centrifugal force, continue to grow toward the edge of wafer W with an increase in the diameter of the core Ra. Since the fingers Rb are subjected to a greater centrifugal force than the core Ra, the fingers Rb grow toward the edge of wafer W faster than the enlargement of the core Ra (FIG. 6B).

Then, before the entire surface of wafer W is covered by photoresist solution R supplied (and upon lapse of time Ta from point of time $t_S$ in FIG. 5), the rotational frequency of wafer W is increased from the supplying rotational frequency R3 (1,500 rpm) to a higher rotational frequency R4. This rotational frequency R4 is hereinafter referred to as target rotational frequency R4 which is 3,000 rpm in this example. A control is effected to complete the switching from supplying rotational frequency R3 (1,500 rpm) to target rotational frequency R4 (3,000 rpm) in approximately 0.07 sec. (referenced Tb in FIG. 5). This step corresponds to step (c) in the method according to this invention.

Figure 7:
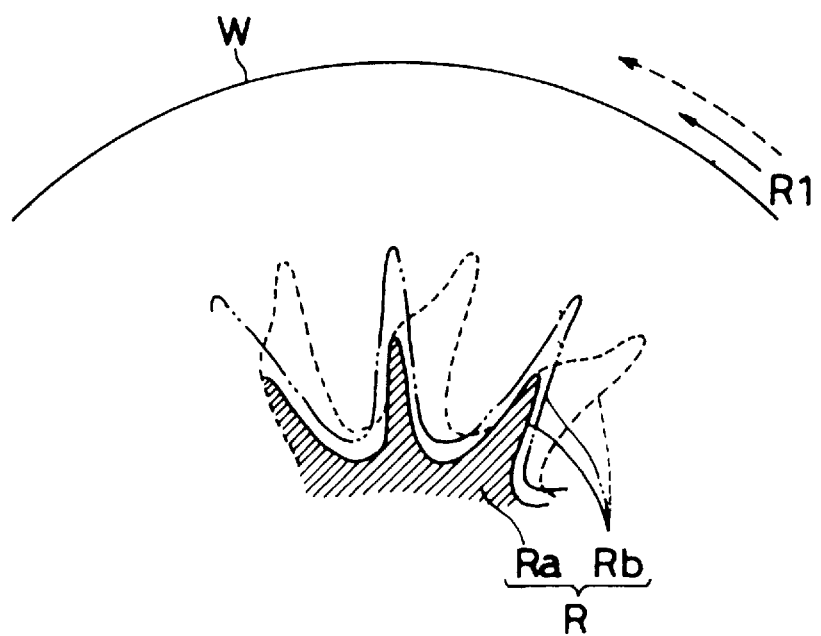
FIG. 7 is an explanatory view of the photoresist applying method.

By increasing the rotational frequency from supplying rotational frequency R3 to target rotational frequency R4, the fingers Rb are subjected to a force of inertia due to an acceleration occurring in the course of increasing the rotational frequency, as well as the centrifugal force, generated by the spin. The resultant force causes the fingers Rb, which would otherwise grow linearly toward the edge of wafer W, to grow in directions curved circumferentially, thereby enlarging widths thereof. The diameter of core Ra increases also (FIG. 6C and FIG. 7).

Figure 6C:
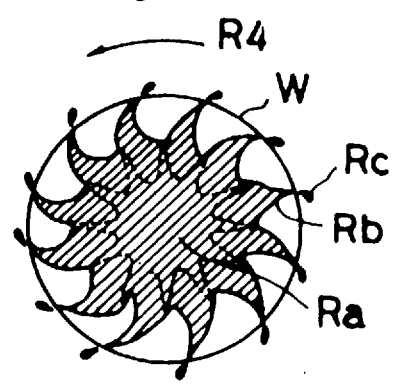
Figure 6D:
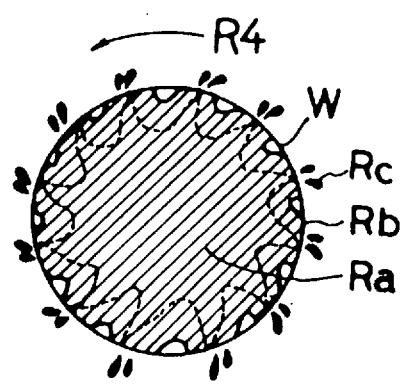
Figure 6E:
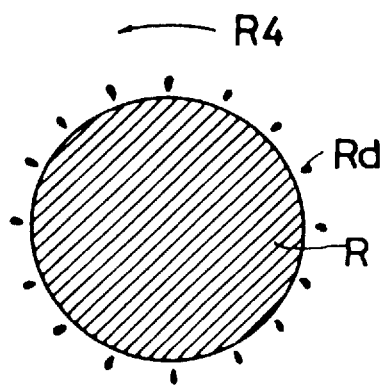

When the leading ends of the numerous fingers Rb reach the edge of wafer W as shown in FIG. 6C, the photoresist solution R scatters from these leading ends outwardly of wafer W (in scattering photoresist solution Rc). However, since the fingers Rb are bent circumferentially owing to the acceleration, the core Ra and fingers Rb grow and spread in unison toward the edge of wafer W. Thus, the time taken for the photoresist solution to cover the entire surface of wafer W is much shorter than in the prior art (FIGS. 6C, 6D and 6E).

At a point of time ($t_E$ in FIG. 5) that the entire surface of wafer W is covered with photoresist solution R, the controller 20 executes a supply stop instruction in the processing program to stop the delivery of photoresist solution R through the supply nozzle 5. The target rotational frequency R4 is maintained for a predetermined time to dispel a superfluous part of photoresist solution R covering the entire surface of wafer W (superfluous photoresist solution Rd), thereby forming a photoresist film R' in a desired thickness on the surface of wafer W (FIG. 6F). It is to be noted that the above target rotational frequency R4 is the same as the film-forming rotational frequency. This step corresponds to step (d) in the method according to this invention.

The point of time $t_E$ for stopping the deliver of photoresist solution R is determined by actually delivering photoresist solution R to wafer W, measuring the time taken for photoresist solution R to cover the entire surface of wafer W, and writing the supply stop instruction into the processing program based on the result of measurement. The time taken from the point of time $t_S$ for starting supply of photoresist solution R may be stored in the memory 25 or set to a timer or the like, to stop the supply upon lapse of that time after commencement of the supply.

Thus, the time taken for the photoresist solution R to cover the entire surface of wafer W may be reduced by supplying the photoresist solution R while spinning the wafer W at the low, supplying rotational frequency R3, and increasing the rotational frequency to target rotational frequency R4 to apply a force of inertia to the fingers Rb before the entire surface of wafer W is covered with photoresist solution R. Since this control reduces the time taken from the point of time the fingers Rb reach the edge of wafer W to termination of the photoresist supply, a diminished quantity of photoresist solution R is dispelled and scattered through the fingers Rb outwardly of the wafer W. As a result, a desired thickness of photoresist film may be obtained from a drastically reduced supply of photoresist solution.

The above coating solution applying method was actually used in coating wafer W with the photoresist solution. On that occasion, 8-inch wafers were used, and i-Line Resist PFI manufactured by Sumitomo Kagaku Kogyo K.K. was employed as photoresist solution. The period of time for supplying the photoresist solution was set to 3 sec. (from $t_S$ to $t_E$ in FIG. 5). The photoresist solution was supplied at a constant flow rate. The processing program used was set to switch the rotational frequency from 1,500 rpm (supplying rotational frequency R3) to 3,000 rpm (target rotational frequency R4 (=film-forming rotational frequency)).

Experiment was conducted with the above conditions by varying the time Ta for starting to increase the rotational frequency to target rotational frequency R4, after the point of time $t_S$ for executing the supply start instruction to supply the photoresist solution to the wafer W. It has been found as a result that the coating time needed is minimal or near minimal when the time Ta for switching the rotational frequencies is in the range of roughly 0.1 to 0.6 sec.

A longer coating time was needed when the target rotational frequency R4 (3,000 rpm=film forming rotational frequency) was employed from the first or when the supplying rotational frequency R3 (1,500 rpm) was maintained unchanged, than when the rotational frequency was increased within the above range. The behavior of photoresist solution R supplied to the surface of wafer W was observed during the above experiment. It has been found that the above range of time (0.1 to 0.6 sec) corresponds to a period of time from the point of time at which the fingers Rb are formed peripherally of the core Ra as shown in FIG. 6A to the point of time at which the fingers Rb reach the edge of wafer W as shown in FIG. 6C. That is, a force of inertia may be applied to the fingers Rb by increasing the rotational frequency of wafer W toward target rotational frequency R4 during the period from the point of time at which the fingers Rb are formed to the point of time at which the fingers Rb reach the edge of wafer W, thereby to reduce the time taken for the photoresist solution R to cover the entire surface of wafer W. This achieves a drastic reduction in the unnecessary quantity of photoresist solution R.

Figure 5:
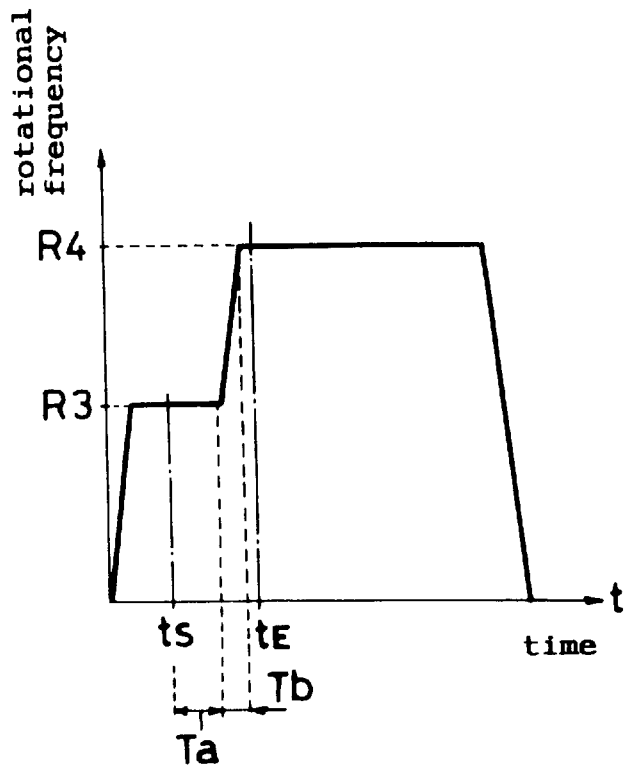
FIG. 5 is a time chart showing a photoresist applying method according to the present invention.
Figure 6F:
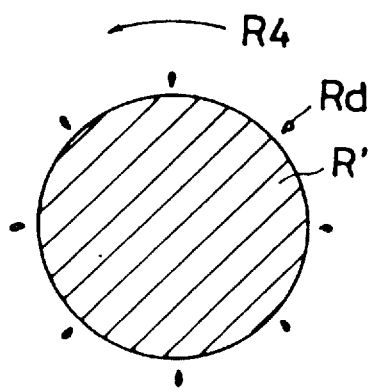

Further, experiment was conducted to vary the period for increasing the rotational frequency from supplying rotational frequency R3 to target rotational frequency R4 (i.e. acceleration time Tb or acceleration of the spin; see FIG. 5). It has been found as a result that acceleration time Tb in the range of 0.03 to 0.2 sec. can achieve a reduction in the coating time needed. That is, the rotational frequency of wafer W should preferably be increased rapidly (for reduced acceleration time Tb) to shorten the coating time. It has also been found, however, that if the acceleration is too rapid, a long time is consumed in coating, thereby increasing the unnecessary quantity of photoresist solution. It is considered due to the behavior of the photoresist solution described hereunder that a long coating time is needed when acceleration time is too short, i.e. when acceleration of the spin is too rapid.

The fingers Rb extending from the core Ra toward the edge of wafer W are scattered away from the surface of wafer W by rapid acceleration. It is also conceivable that the fingers Rb are once bent circumferentially, but thereafter grow linearly toward the edge of wafer W, by centrifugal force, with the widths of the fingers Rb increasing circumferentially only to limited extents.

Based on the above findings, a preferred range of spin acceleration in increasing the rotational frequency from supplying rotational frequency R3 to target rotational frequency R4 is as follows:

minimum acceleration=(3,000 rpm−1,500 rpm)/0.2 sec= 7,500 rpm/sec; and maximum acceleration=(3,000 rpm−1,500 rpm)/0.03 sec= 50,000 rpm/sec.

With these conditions, such as the wafer size and the type of photoresist solution, a preferred range of spin acceleration is 7,500 to 50,000 rpm/sec for increasing the rotational frequency to target rotational frequency R4.

A first modification of the foregoing rotational frequency control will be described next with reference to the time chart shown in FIG. 8.

Figure 8:
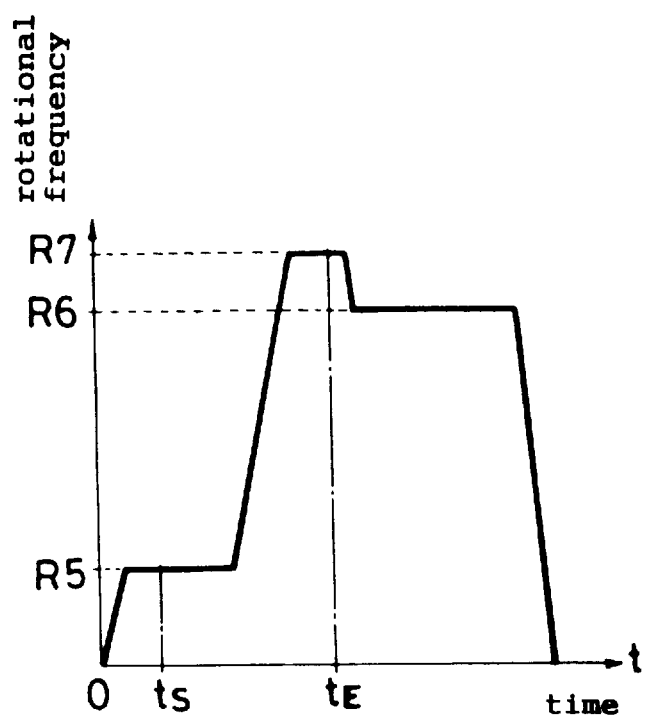
FIG. 8 is a time chart showing a first modification of the applying method.

As shown in FIG. 8, the first modification provides supplying rotational frequency R5 (e.g. 1,500 rpm) when supplying the photoresist solution, target rotational frequency R7 (e.g. 4,000 rpm) when applying a force of inertia to the fingers Rb, and film-forming rotational frequency R6 (e.g. 3,000 rpm) when obtaining a desired film thickness. That is, the target rotational frequency R7 for applying a force of inertia to the fingers Rb is higher than the supplying rotational frequency R5 for supplying the photoresist solution and the film-forming rotational frequency R6 for obtaining a desired film thickness.

Such rotational frequency control can apply an increased force of inertia to the fingers Rb extending radially, thereby to expedite enlargement in the width of fingers Rb circumferentially of wafer W. This further reduces the time taken for the photoresist solution to cover the entire surface of the wafer, and reduces the quantity of unused photoresist solution. As a result, a desired thickness of photoresist film may be obtained with a drastically reduced quantity of photoresist solution supplied.

A second modification of the rotational frequency control will be described next with reference to the time chart shown in FIG. 9.

Figure 9:
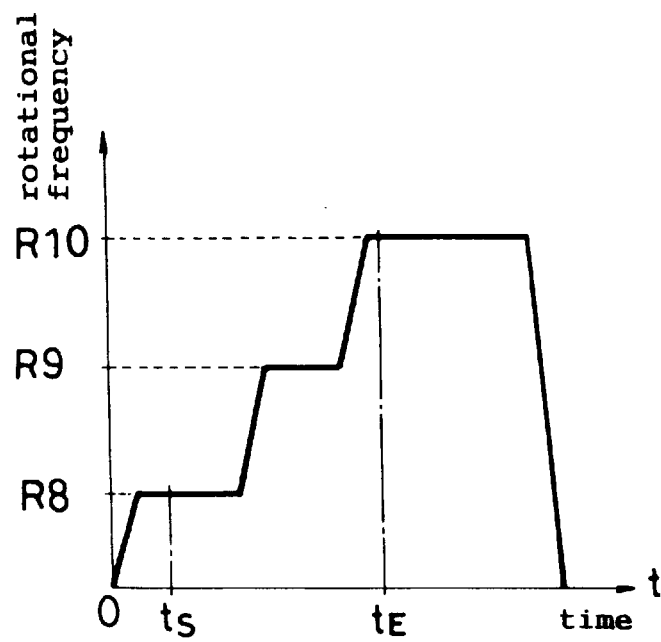
FIG. 9 is a time chart showing a second modification of the applying method.

As shown in FIG. 9, this modification provides supplying rotational frequency R8 (e.g. 1,500 rpm) when supplying the photoresist solution, target rotational frequency R9 (e.g. 2,000 rpm) when applying a force of inertia to the fingers Rb, and film-forming rotational frequency R10 (e.g. 3,000 rpm) when obtaining a desired film thickness. That is, the target rotational frequency R9 for applying a force of inertia to the fingers Rb is higher than the supplying rotational frequency R8 for supplying the photoresist solution and lower than the film-forming rotational frequency R10 for obtaining a desired film thickness.

Such rotational frequency control can retard the fingers Rb reaching the edge of wafer W, thereby to limit the quantity of photoresist solution scattering to the ambient. Consequently, the quantity of unused photoresist solution may be further reduced.

A selection among the rotational frequency controls of FIGS. 5, 8 and 9 may be made empirically, taking the size and surface conditions of the wafer and characteristics of the photoresist solution into account.

Next, a comparison is made between the photoresist applying method of this invention described above and the conventional applying method.

The conventional method uses a processing program providing a lower rotational frequency (supplying rotational frequency) of 900 rpm when supplying a photoresist solution, and a higher rotational frequency (film-forming rotational frequency) of 1,500 rpm for obtaining a desired film thickness. In this case, the quantity of photoresist solution required for covering the entire surface of a wafer is 3 to 6 cc.

The photoresist applying method according to this invention gives the results set out below. The target rotational frequency refers to a rotational frequency toward which the supplying rotational frequency is increased in order to apply a force of inertia to the fingers Rb. In each of the following examples (1) to (3), the target rotational frequency equals the film-forming rotational frequency.

|     | supply r.f. | target r.f. | film-forming r.f. | required quant. of solution |
| --- | --- | --- | --- | --- |
| (1) | 1,500 rpm | 3,000 rpm | 3,000 rpm | 1.1 cc |
| (2) | 1,500 rpm | 4,000 rpm | 4,000 rpm | 1.0 cc |
| (3) | 2,000 rpm | 4,000 rpm | 4,000 rpm | 0.99 cc |
| (4) | 1,500 rpm | 3,000 rpm | 6,000 rpm | 0.81 cc |

These controls invariably assure a satisfactory degree of uniformity in the thickness of photoresist film.

It will be seen that the method according to this invention obtains a desired thickness of photoresist film from approximately one third of the quantity of photoresist solution required in the conventional method, and that the quantity of photoresist solution scattering outwardly of the wafer during the coating process is drastically reduced. Thus, the photoresist solution more expensive than a developer and a cleaning solution may be used in a greatly reduced quantity, to achieve low manufacturing costs of semiconductor elements, semiconductor devices and the like and to improve throughput.

The rotational frequencies noted above are given by way of example only. These frequencies should be determined according to the size or surface conditions of wafers (e.g. with only an oxide layer formed, or with a finely defined uneven surface having undergone various processes), the viscosity of the coating solution, and a desired thickness of film to be formed.

The target rotational frequency is not limited to one type where the rotational frequency of the wafer is increased, before the coating solution supplied to the wafer surface covers the entire wafer surface, to the target rotational frequency higher than the supplying rotational frequency (low rotational frequency). Where, for example, the supplying rotational frequency for supplying the coating solution is 1,500 rpm, and the film-forming rotational frequency for obtaining a desired film thickness is 3,000 rpm, the rotational frequency may be increased in two stages, e.g. to a first target rotational frequency of 2,000 rpm and then to a second target rotational frequency of 2,500 rpm. In this case, the coating solution is supplied while spinning the wafer at the predetermined supplying rotational frequency, and the rotational frequency is increased to the first target rotational frequency and then to the second target rotational frequency. At the final stage, a desired thickness of film may be obtained through a high-speed spin at the predetermined film-forming rotational frequency.

In the processing programs illustrated by the time charts of FIGS. 5, 8 and 9, the supply of photoresist solution is stopped (at point of time $t_E$) after the rotational frequency is increased from the supplying rotational frequency to the target rotational frequency or film-forming rotational frequency. However, the spin may be accelerated to the target rotational frequency after stopping the supply of the photoresist solution, or the supply of the photoresist solution may be stopped during the acceleration to the target rotational frequency. That is, it will serve the purpose if acceleration produces the effect of bending the fingers Rb circumferentially.

In the foregoing embodiment, and in the first and second modifications thereof, a photoresist solution is used as a coating solution. This invention is not limited thereto, but may use a different coating solution (e.g. polyimide resin) for forming a passivation film, or a SOG (Spin On Glass) solution.

<Coating Solution Applying Apparatus>

Next, apparatus suited for executing the foregoing coating solution applying method will be described with reference to a first to a fourth embodiments. While these apparatus invariably are suited for executing the above coating solution applying method, each has its own unique features. An overview of the apparatus will be discussed briefly first.

<Overview of the Apparatus>

The apparatus in the first and second embodiments are concerned with time lags in supplying and stopping the photoresist solution. The time lags (there being two types as noted hereinafter, i.e. a time lag in supplying and a time lag in stopping the photoresist solution) are measured in advance, and the photoresist solution supply start instruction and supply stop instruction are executed earlier based on the time lags. The difference between the first and second embodiments lies in whether the time lags are measured with reference to "delivery" of the photoresist solution or to "arrival" of the photoresist solution.

The apparatus in the third and fourth embodiments are concerned only with a time lag in supplying the photoresist solution, i.e. a point of time the photoresist solution is actually supplied after execution of the supply start instruction. Other instructions are suspended after execution of the supply start instruction, until the photoresist solution is actually supplied. These embodiments differ from the first and second embodiments in that the time lag relating to stopping of the photoresist solution is not taken into account. The difference between the third and fourth embodiments lies in whether the point of time at which the photoresist solution is actually supplied is detected with reference to "delivery" of the photoresist solution or to "arrival" of the photoresist solution.

First Embodiment

Figure 10:
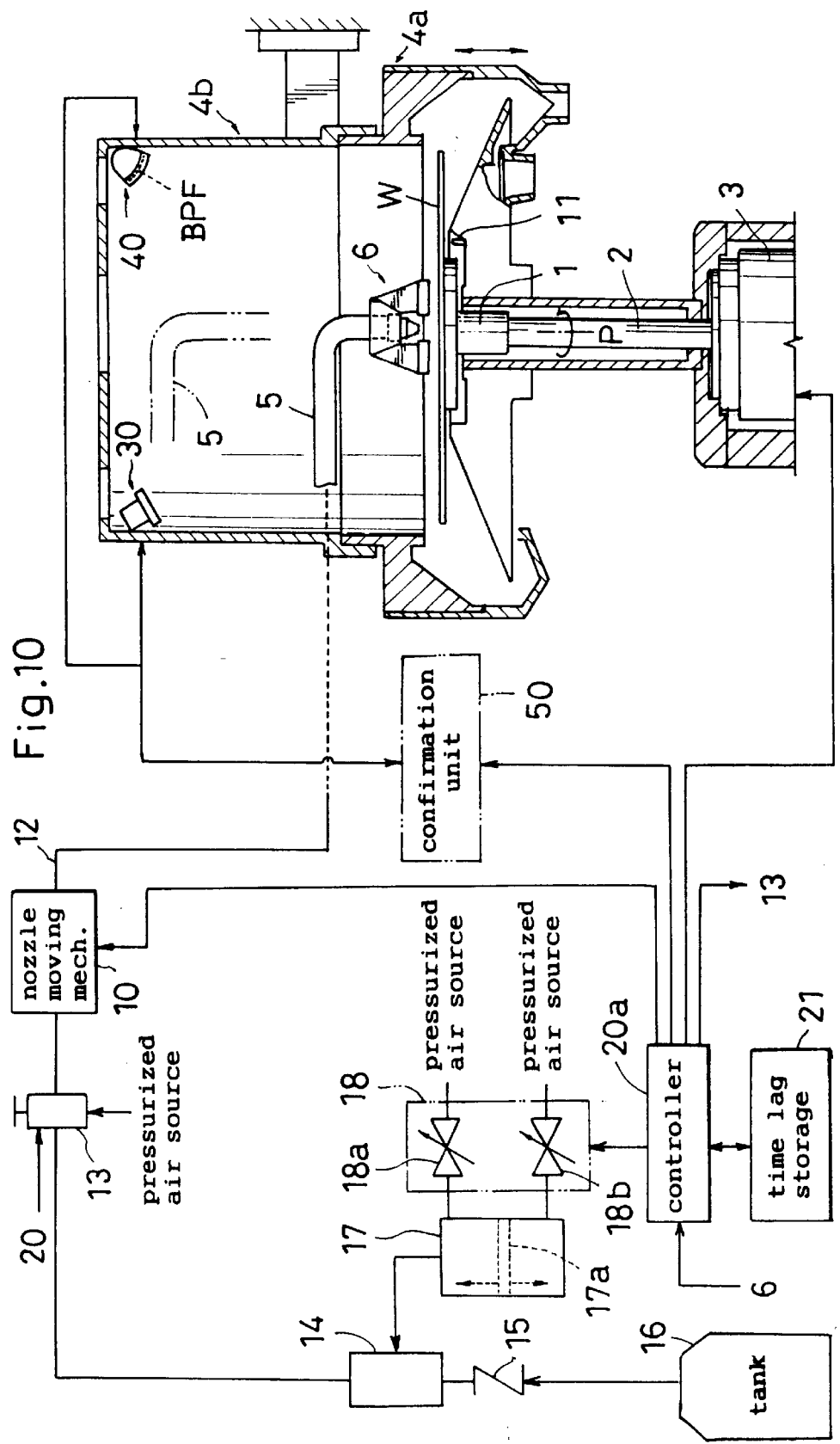
FIG. 10 is a block diagram and vertical sectional view showing an outline of a substrate spin coating apparatus in a first embodiment of this invention.

FIG. 10 is a block diagram and vertical section showing an outline of a substrate spin coating apparatus which is one example of the coating solution applying apparatus according to the present invention.

Reference numeral 1 in FIG. 10 denotes a suction type spin chuck for suction-supporting a wafer W in a substantially horizontal posture. This spin chuck 1 is attached to a rotary shaft 2 rotatable by an electric motor 3. Thus, the wafer W suction-supported by the spin chuck 1 is spun in the substantially horizontal posture about a spin center P. The electric motor 3 is operable under control of a controller 20a described hereinafter.

The spin chuck 1 is surrounded by a scatter preventive cup 4a for preventing a coating solution, such as a photoresist solution and a cleaning solution used for cleaning the back side surface of wafer W, from scattering into the ambient. An upper lid 4b fixed to a frame of the apparatus extends over an upper opening of the scatter preventive cup 4a. The upper lid 4b defines a plurality of openings in an upper region thereof for receiving downflows. When a transport mechanism not shown places untreated wafer W on the spin chuck 1 or removes treated wafer W from the spin chuck 1, a lift mechanism not shown lowers only the scatter preventive cup 4a away from the upper lid 4b, whereby the spin chuck 1 projects upward through the upper opening of the scatter preventive cup 4a. Alternatively, the upper lid 4b and rotary shaft 2 may be raised, by a lift mechanism, not shown, relative to a fixed scatter preventive cup 4b.

A coating solution supply nozzle 5 is disposed outside the scatter preventive cup 4a to be movable between a supply position on the spin center P and above wafer W placed on the spin chuck 1 and a standby position retracted sideways from the wafer W.

Figure 11:
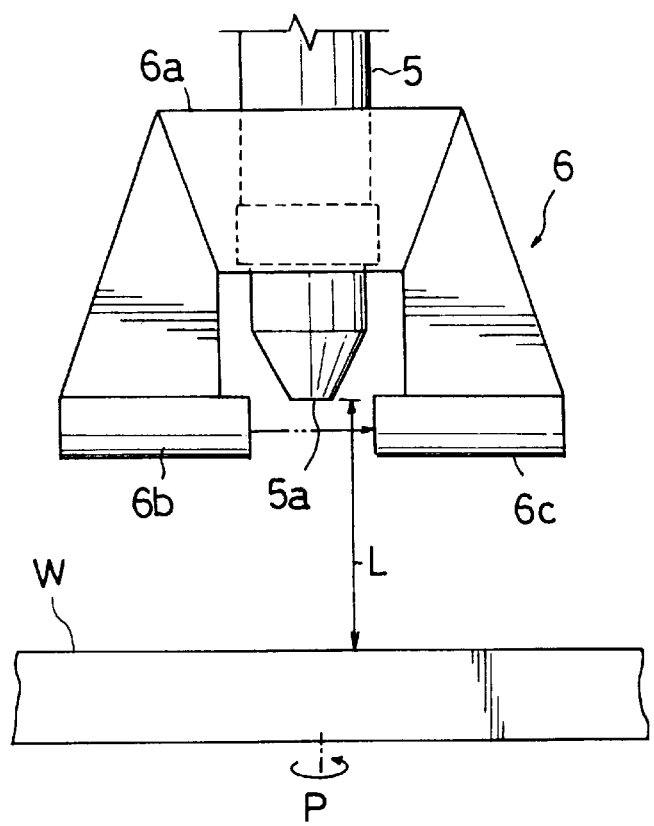
FIG. 11 is a view showing a delivery detecting sensor.

The supply nozzle 5 has a delivery detecting sensor 6 attached to a downwardly extending tip portion thereof. As shown in FIG. 11, the sensor 6 includes a light projector 6b and a light receiver 6c attached to the tip portion of the supply nozzle 5 through a mounting element 6a. The light projector 6b and light receiver 6c are opposed to each other across the supply nozzle 5. Light in the infrared wavelength region projected from the light projector 6b enters the light receiver 6c containing a photodiode sensitive to the infrared wavelength region and thereabouts. In this apparatus, for example, the delivery detecting sensor 6 outputs a detection signal which is turned on when the light is received. Thus, the detection signal is turned off when the photoresist solution is delivered through a discharge opening 5a of the supply nozzle 5. The detection signal is turned on when the photoresist solution ceases its flow through the discharge opening 5a of the supply nozzle 5. The delivery detecting sensor 6 corresponds to the delivery detecting device of the present invention.

The coating solution supply nozzle 5 is movable by a nozzle moving mechanism 10 between the supply position and standby position. In the supply position, the discharge opening 5a of the nozzle 5 shown in FIG. 11 is located at a distance L upward from the surface of wafer W. The distance L is approximately 4 mm, for example. Preferably, this distance is adjustable according to the viscosity of the photoresist solution, size of wafer W and surface condition of wafer W, to avoid irregularities occurring when the photoresist solution dripped to the surface of wafer spreads over the entire surface.

Further, back rinse nozzles 11 are arranged inside the scatter preventive cup 4a, below the wafer W and adjacent the spin center P, for delivering a cleaning solution toward the back side surface of wafer W to remove unwanted part of the photoresist solution scattering in mist and adhering to the back side surface or flowing round to the back side surface. The back rinse nozzles 11 deliver the cleaning solution under control of the controller 20a described hereinafter.

The coating solution supply nozzle 5 is connected through a supply pipe 12, a suckback valve 13, a bellows pump 14 and a check valve 15 to a coating solution tank 16 storing the photoresist solution. The suckback valve 13 is operable by pressurized air fed thereto from a pressurized air source which is one of utilities installed in a cleanroom. With this operation, part of the photoresist solution remaining in the tip portion of the supply nozzle 5 is slightly drawn back to prevent inadvertent dripping onto the wafer W and curing of the photoresist solution exposed from the discharge opening 5a. When the pressurized air is exhausted therefrom, the suckback valve 13 becomes inoperative, i.e. cancels the action to draw the photoresist solution back from the supply nozzle 5. The operation of the suckback valve 13 is controlled by an electric signal outputted from the controller 20a. The suckback valve 13 performs the suckback action with an adjustable pressure. Thus, operating speeds of the suckback valve 13 in drawing back the photoresist solution and in canceling the action after input of the electric signal are variable with the degree of pressure adjustment and the pressure of the pressurized air source.

The bellows pump 14 is operable by a double-acting air cylinder 17 to cause the photoresist solution to flow from the coating solution tank 16 into the supply pipe 12. The check valve 15 prevents the photoresist solution from flowing back to the tank 16 during the above feeding operation. The double-acting air cylinder 17 is operable by pressurized air supplied from the pressurized air source through a speed control valve assembly 18. The valve assembly 18 includes seed control valves 18a and 18b for supplying and exhausting the pressurized air to/from the two spaces partitioned by a piston 17a. The valve assembly 18 is manually adjustable to adjust flow rates of pressurized air supplied from the pressurized air source and exhausted from the air cylinder 17. The operating speed of the air cylinder 17 is variable with the degree of pressure adjustment and the pressure of the pressurized air source. This results in an adjustment of operation of the bellows pump 14, the speed of its operation to supply or stop the photoresist solution from the supply nozzle 5. The supply nozzle 5, supply pipe 12, bellows pump 14, check valve 15, coating solution tank 16, double-acting air cylinder 17 and speed control valve assembly 18 constitute the coating solution supplying device of this invention.

The speed control valve assembly 18 is operable by an electric signal from the controller 20a to feed pressurized air from the pressurized air source to the double-acting air cylinder 17, and is made inoperative by the electric signal to exhaust the pressurized air from the air cylinder 17. The controller 20a includes a clock, timer and RAM not shown. The RAM stores the processing program and the like prepared in advance. This processing program is executed based on the clock and timer.

A time lag storage 21 stores, as a start time lag, a deviation (delay) from a point of time the controller 20a executes the supply start instruction (instruction to start supplying the photoresist solution from the supply nozzle 5 to the wafer W) in the processing program to a point of time the photoresist solution is actually delivered from the discharge opening 5a of the supply nozzle 5. The time lag storage 21 also stores, as a stop time lag, a deviation (delay) from a point of time the controller 20a executes the supply stop instruction (instruction to stop the photoresist solution supplied from the supply nozzle 5 to the wafer W) to a point of time the photoresist solution is actually stopped being supplied from the supply nozzle 5 to the wafer W. As described hereinafter, each of these two time lags is measured by the internal timer as time taken from execution by the controller 20a of the supply start instruction or supply stop instruction to a change in the detection signal outputted from the delivery detecting sensor 6. The controller 20a corresponds to the time lag measuring device, measurement control device and control device of this invention. The time lag storage 21 corresponds to the time lag storing device of this invention.

The upper lid 4b includes a CCD camera 30 attached to a left inner periphery thereof, and a strobe 40 attached to a right inner periphery. The CCD camera 30 includes a CCD acting as a solid-state image sensor, an electronic shutter and a lens, and its field of view covers a region around the spin center of wafer W including a spacing between the discharge opening 5a of the coating solution supply nozzle 5 and the surface of wafer W, i.e. including a position in which the photoresist solution delivered from the supply nozzle 5 reaches the wafer W. It appears from FIG. 10 as if a horizontally extending portion of the supply nozzle 5 blocked the view of the region around the spin center of wafer W. However, the CCD camera 30 and the supply nozzle 5 are staggered sideways from each other to enable imaging of the region around the spin center including the above-mentioned spacing.

The strobe 40 is used to illuminate the wafer W for image pickup since the apparatus per se is installed in a darkroom to prevent exposure of the photoresist solution. The strobe 40 is, for example, a combination of a xenon lamp and a band-pass filter BPF which passes wavelengths of 500 nm and above. The CCD camera 30 and strobe 40 are connected to a confirmation unit 50. The strobe 40 may employ, instead of the xenon lamp, a high intensity infrared light emitting diode or an infrared light emitting diode array having spectral sensitivity to the infrared and adjacent regions. Then, the band-pass filter BPF may be omitted. The strobe 40 may be designed suitably according to the spectral sensitivity with respect to the photoresist solution supplied.

Figure 12:
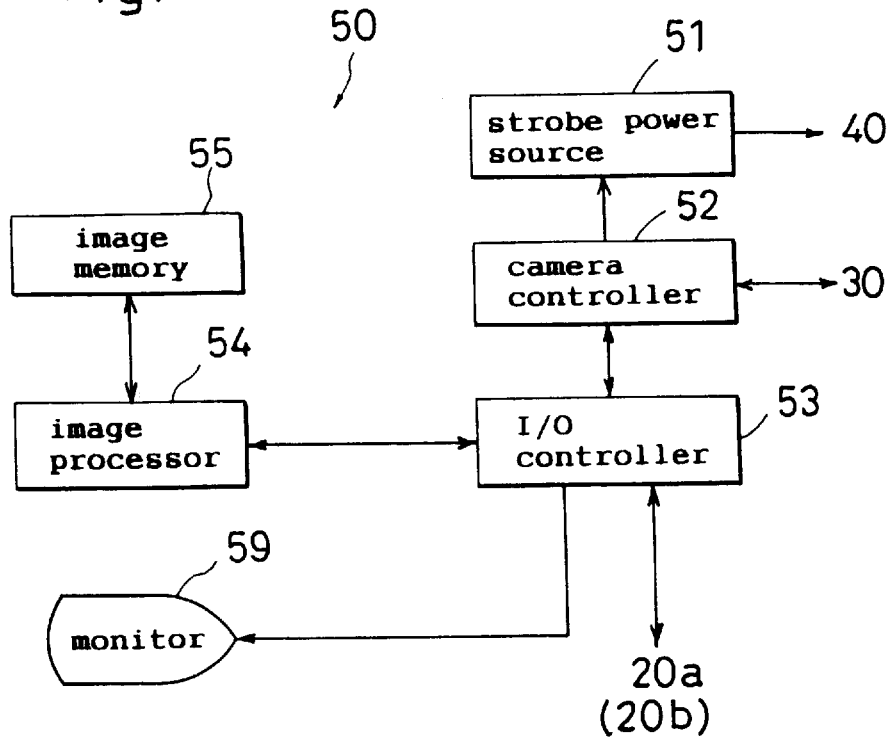
FIG. 12 is a block diagram of a confirmation unit.

The confirmation unit 50 will be described with reference to FIG. 12.

The strobe 40 is continuously lit by a predetermined supply of power from a strobe power source 51. The operation, e.g. image pickup timing, of CCD camera 30 is determined by the electric shutter operable under control of a camera controller 52. An image pickup instruction is given to the camera controller 52 from an I/O controller 53 which receives a trigger signal from the controller 20a. The controller 20a outputs the trigger signal when executing a trigger signal output instruction contained in the processing program. Upon output of the trigger signal, the CCD camera 30 is operated to pick up an image of the wafer surface. Image signals of the wafer surface are transmitted through the camera controller 52 and I/O controller 53 to an image processor 54 to be stored as a still picture in an image memory 55. The strobe 40 may be lit intermittently rather than continuously, by the strobe power source 51 supplying power to the strobe 40 only for appropriate periods of time to pick up images of wafer surfaces. Preferably, the CCD camera 30 has a field of view determined by taking the speed of this image processing into account.

The image processor 54 outputs the still picture in the image memory 55 to a monitor 59 through I/O controller 53. The operator observes the still picture displayed on the monitor 49, i.e. behavior of the photoresist solution exhibited at the point of time the trigger signal is outputted, and decides whether the coating process is conducted properly or not. An unsatisfactory still picture indicates that operations of the various components are mistimed. Then, the operator can manually stop the operation of the apparatus. In this way, an improper coating process is precluded from being applied to all succeeding wafers.

<Measuring Process>

Figure 14:
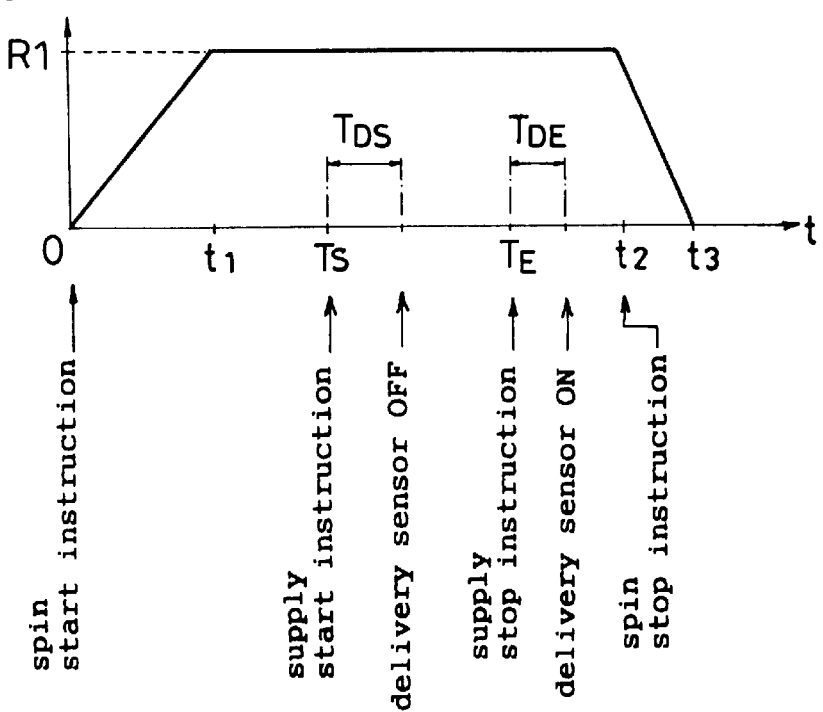
FIG. 14 is a time chart showing the measuring process.
Figure 13:
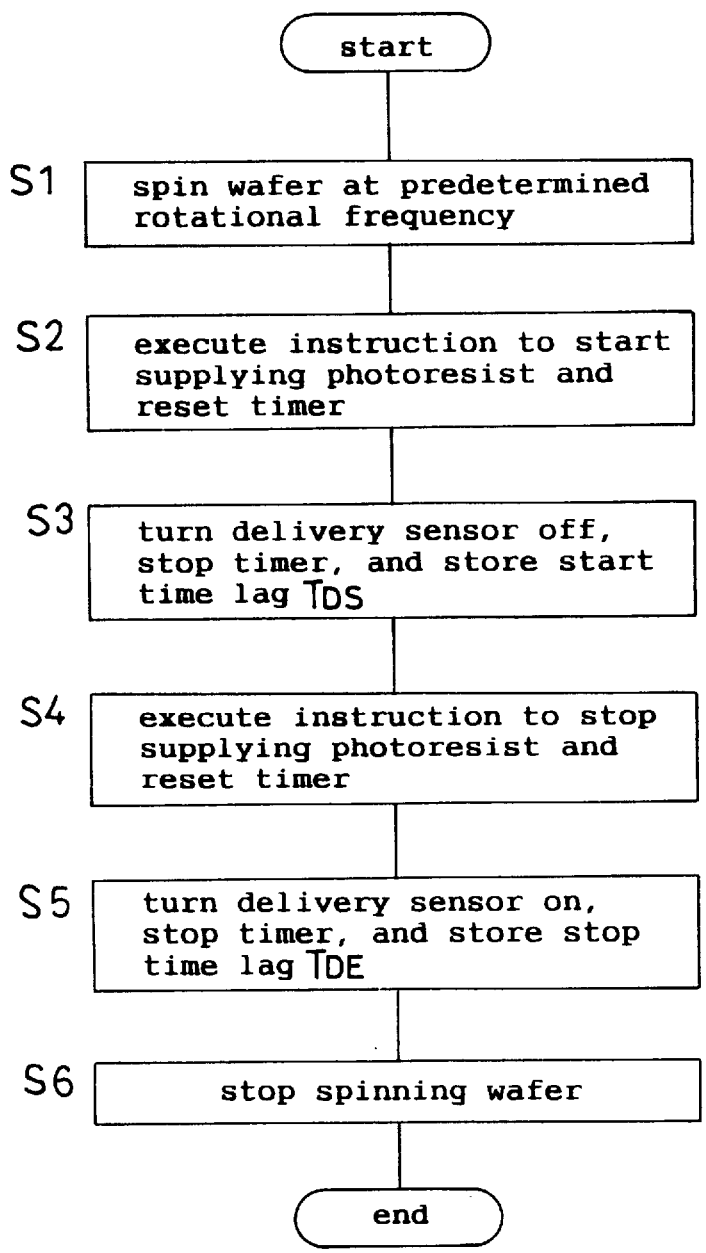
FIG. 13 is a flow chart showing a process of measuring a start time lag and a stop time lag.

The process of measuring the start time lag and stop time lag will be described next with reference to the flow chart shown in FIG. 13 and time chart shown in FIG. 14.

This measuring process is carried out before a process of coating product wafers, by using, for example, dummy wafers different from the product wafers. This measuring process measures the time lags variable with degrees of adjustment of the suckback valve 13 and speed control valve assembly 18. Preferably, the measuring process is carried out each time the apparatus is started, or periodically based on management of use periods of the apparatus, or each time the suckback valve 13 or speed control valve assembly 18 is readjusted.

It is assumed that wafer W (dummy wafer) is already placed on the spin chuck 1 by the substrate transport mechanism not shown, and is suction-supported by the spin chuck 1. It is further assumed that the coating solution supply nozzle 5 has been moved to the supply position by the nozzle moving mechanism 10, with the delivery opening 5a situated at distance L (see FIG. 11) above the spin center P of wafer W. Preferably, the dummy wafers have the same surface condition as product wafers to be processed subsequently, so that the photoresist solution, when spreading, exhibit the same behavior on the dummy wafers as on the product wafers.

At step S1, the wafer is spun at a predetermined rotational frequency. Specifically, as shown in FIG. 14 (in which the time origin corresponds to a point of time at which the controller 20a executes a spin start instruction contained in a measurement program), when the controller 20a executes the spin start instruction, the electric motor 3 is started rotating with an acceleration to reach the predetermined supplying rotational frequency R1 (e.g. 1,000 rpm) at point of time t1. This measuring process measures a time lag in supplying the photoresist solution. It is therefore unnecessary for the rotational frequency R1 to be equal to the supplying rotational frequency R1 in the "Product Wafer Process" described hereinafter. However, for expediency of description, the rotational frequency R1 is regarded as the same for both processes.

Upon lapse of a predetermined period of time from the point of time t1 at which the rotational frequency of wafer W reaches a steady state at the predetermined supplying rotational frequency R1, the controller 20a executes the instruction to start supplying the photoresist solution, and resets the internal timer (step S2). This operation is carried out to prepare for measuring a period (start time lag $T_{DS}$) from execution of the supply start instruction to actual delivery of the photoresist solution through the discharge opening 5a of the coating solution supply nozzle 5.

When the controller 20a executes the supply start instruction, the photoresist solution is delivered from the discharge opening 5a of the supply nozzle 5 as follows.

First, the suckback valve 13 is closed to cancel the suction applied to the supply nozzle 5, and one of the valves 18a of the speed control valve assembly 18 also is closed while the other valve 18b is opened. Consequently, the double-acting air cylinder 17 becomes operative to actuate the bellows pump 14 to feed a fixed quantity of photoresist solution from the coating solution tank 16 into the supply pipe 12. With this series of operations, the photoresist solution begins to be delivered from the discharge opening 5a of the supply nozzle 5. The valves 18a and 18b of the speed control valve assembly 18 are alternately closed and opened. The piston 17a of the air cylinder 17 is thereby raised and lowered to drive the bellows pump 14 repeatedly to deliver the photoresist solution in the predetermined quantity through the supply nozzle 5 each time. The leading end of the photoresist solution delivered from the discharge opening 5a intercepts the light projected from the light projector 6b. Since the light is stopped entering the light receiver 6c, the detection signal from the delivery detecting sensor 6 is turned off. At this time, the controller 20a stops the internal timer, and stores this time as start time lag $T_{DS}$ in the time lag storage 21 (step S3). This start time lag $T_{DS}$ represents a deviation from the supply start instruction, which results from the above series of operations.

After a predetermined period of time from execution of the supply start instruction, based on the measurement program, the controller 20a executes the instruction to stop the supply of the photoresist solution, and resets the internal timer (step S4). This operation is carried out to prepare for measuring a period (stop time lag $T_{DE}$) from the point of time $T_E$ of execution of the supply stop instruction to a complete stoppage of the photoresist solution delivered from the discharge opening 5a of the coating solution supply nozzle 5.

When the supply stop instruction is executed, the delivery of the photoresist solution is stopped as follows.

First, the alternate opening and closing of the two speed control valves 18a and 18b are stopped to place the air cylinder 17 in inoperative state, thereby to stop the supply of the photoresist solution. At the same time, the suckback valve 13 is opened to slightly draw the photoresist solution back from the tip portion of the supply nozzle 5. With this operation, the photoresist solution is stopped flowing from the coating solution tank 16 through the supply tube 12 and supply nozzle 5. However, the part of the photoresist solution present in the space of distance L from the discharge opening 5a to the surface of wafer W drops toward the surface of wafer W. When this drop is completed (i.e. the supply of the photoresist solution to the surface of wafer W is terminated), the light from the light projector 6b enters the light receiver 6c again to turn on the detection signal from the detecting sensor 6. Then, the controller 20a stops the internal timer, and stores this time as stop time lag $T_{DE}$ in the lag time storage 21 (step S5). This stop time lag $T_{DE}$ represents a deviation from the point of time $T_E$ of execution of the supply stop instruction, which results from the above series of operations.

At a point of time t2 which is a predetermined time from the point of time $T_E$ of execution of the supply stop instruction, the controller 20a executes a spin stop instruction to stop the electric motor 3 (step S6).

By executing the measurement program as described above, the start time lag $T_{DS}$ and stop time lag $T_{DE}$ are measured and stored in the time lag storage 21.

<Product Wafer Process>

After the measuring process described above, a plurality of product wafers are processed successively. This product wafer process will be described with reference to the time chart shown in FIG. 15.

Upon execution of a spin start instruction in the processing program prepared for this purpose, wafer W is spun with an acceleration to reach the predetermined supplying rotational frequency R1 (e.g. 1,000 rpm) at a point of time t1. At a point of time $T_S$ after the rotational frequency of wafer W reaches a steady state at the supplying rotational frequency R1, a supply start instruction is executed to start delivering the photoresist solution in the predetermined quantity. At a point of time $T_E$ a supply stop instruction is executed to stop the delivery of the photoresist solution. At a point of time t2, a spin accelerate instruction is executed to accelerate the spin of wafer W to the film-forming rotational frequency R2 (e.g. 3,000 rpm). At a point of time t4, a spin stop instruction is executed, whereby the coating process is completed at a point of time t5. It is preferable to add an instruction to the above process to deliver a cleaning solution from the back rinse nozzles 11 shown in FIG. 10, in order to remove unwanted part of the photoresist solution scattering in mist from the edge of wafer W and adhering to the back side surface of wafer W or flowing round the edge to the back side surface of wafer W to adhere thereto.

The above processing program further includes a trigger signal output instruction for causing the confirmation unit 50 to pick up an image of the surface of wafer W. This instruction is executed at the point of time t2, in parallel with the spin accelerate instruction.

In carrying out this processing program, the controller 20a executes the supply start instruction and supply stop instruction at points of time adjusted by the two time lags $T_{DS}$ and $T_{DE}$ stored in the time lag storage 21. Specifically, since the points of time $t_S$ and $t_E$ for executing the supply start instruction and supply stop instruction are known before the controller 20a carries out the processing program, the timing for executing these instructions is advanced by the respective time lags. In FIG. 15, the word "actual" is prefixed to the names of instructions actually executed with such timing adjustment. The supply start instruction and supply stop instruction without the word "actual" are written in the processing program, but not actually executed by the controller 20a.

In this way, the controller 20a actually executes the (actual) supply start instruction and supply stop instruction at points of time advanced by the time lags $T_{DS}$ and $T_{DE}$. Consequently, the detection signal from the delivery detecting sensor 6 is turned on and off at the points of time $t_S$ and $t_D$ delayed from the times of execution by the time lags $T_{DS}$ and $T_{DE}$. That is, the photoresist solution is delivered from the discharge opening 5a of the supply nozzle 5 and the delivery of the photoresist solution is stopped, respectively, at the intended supply starting point of time (at the point of time $t_S$ at which the supply start instruction is supposed to be executed) and at the intended supply stopping point of time (at the point of time $t_E$ at which the supply stop instruction is supposed to be executed) as written in the processing program. This eliminates the trouble of preparing a processing program by taking into account the supply start/stop time lags (deviations) due to degrees of adjustment of the suckback valve 13 and speed control valve assembly 18 (or manual time lag correction in the prior art). The processing program may be prepared with facility since desired timing for the supply start instruction and supply stop instruction may be written in the processing program. In the operation based on this processing program, the photoresist solution supplying/stopping timing is automatically corrected with reference to the two time lags measured, whereby the photoresist solution is supplied and stopped accurately. Further, since the photoresist solution is supplied and stopped with precise timing, an excessive supply of photoresist solution to the wafer W is substantially eliminated to achieve resourcesaving. The cost of treatment may be reduced drastically where, as in this product wafer process, a plurality of wafers are processed successively.

The controller 20a executes the spin accelerate instruction and trigger signal output instruction at the point of time t2. On the latter instruction, the controller 20a outputs the trigger signal to the confirmation unit 50. In response to the trigger signal, the confirmation unit 50 operates as shown in the flow chart of FIG. 16.

At step T1, I/O controller 53 causes CCD camera 52 through the camera controller 52 to pick up an image of the surface of wafer W. CCD camera 30 transmits image signals the camera controller 52 and I/O controller 53 to the image processor 54. The image transmitted is stored as a still picture in the image memory 55 (step T2). The still picture stored in the image memory 55 is only the image picked up in response to the trigger signal as described above. Therefore, the storage capacity of image memory 55 may be sufficient if at least this image can be stored. The image processor 54 stores the still image in the image memory 55, reads the stored still image, and outputs it to the monitor 59 through I/O controller 53 (step T3).

The still picture corresponds to the image of the surface of wafer W picked up as described above. The operator may observe in this picture the manner in which the photoresist solution spreads, to determine behavior of the photoresist solution exhibited at the time of image pickup. In this way, the operator can readily determine whether or not the wafer W is treated properly with the timing correction. The operator may manually stop the apparatus at once if the still picture displayed on the monitor 59 shows any abnormality in the behavior of the photoresist solution. Thus, an improper coating process is precluded from being applied to succeeding wafers. In this case, the measuring process described hereinbefore may be carried out again to remeasure the two time lags $T_{DS}$ and $T_{DE}$, and thereafter the product wafer process may be resumed.

The still picture corresponding to the image picked up in response to the trigger signal allows a comparison in time between the image and the processing program to be made more easily than where, as in the prior art, a motion picture picked up by a high-speed video camera is observed in slow reproduction. By observing the still picture, the operator can determine whether or not treatment is provided properly according to the processing program. In successively treating a plurality of product wafers, it is practically difficult to ascertain by the conventional technique whether each wafer is treated properly or not. Where, as in this embodiment, an image of the surface of wafer W is picked up in response to the trigger signal, confirmation may be made as to properness of treatment for each of the product wafers.

The product wafer process is preceded by the measuring process carried out each time the apparatus is started, or periodically, or when the suckback valve 13 or speed control valve assembly 18 is readjusted to cope with variations in the time lags $T_{DS}$ and $T_{DE}$. The time lags $T_{DS}$ and $T_{DE}$ measured are subject to further deviations occurring with passage of time after the measuring process. The suckback valve 13 and speed control valve assembly 18 are operable by the pressurized air source (which is one of the utilities) installed in a cleanroom to be used also by other apparatus such as a heat treating apparatus and an exposing apparatus. The above-noted deviations are due to hourly or daily variations of pressure occurring with use situations of the air source. The following steps may be taken to anticipate such variations in the time lags due to hourly or daily variations in the utilities.

After the measuring process described hereinbefore, a similar measuring process is carried out for each wafer during the product wafer process. A first wafer is treated with execution timing corrected by the time lags $T_{DS}$ and $T_{DE}$ measured during an initial measuring process. Time lags are measured again at this time. A second wafer is treated with execution timing corrected based on the time lags $T_{DS}$ and $T_{DE}$ and the new time lags measured during the treatment of the first wafer. Subsequent wafers are treated similarly. A specific example of this process will be described with reference to the time charts shown in FIGS. 17A, 17B, 18A and 18B.

It is assumed that start time lag $T_{DS}$ and stop time lag $T_{DE}$ are already stored in the time lag storage 21 as a result of the measuring process carried out as described hereinbefore. For expediency of illustration, FIGS. 17A, 17B, 18A and 18B show only a portion of the time chart in FIG. 15 covering the process from the spin start instruction to a point of time before the spin accelerate instruction. The spin accelerate instruction, trigger signal output instruction and so on are actually executed after the illustrated portion to complete the process shown in FIG. 15.

In treating the first wafer W, the actual supply start instruction is executed at the time advanced by the start time lag $T_{DS}$ from the time written in the processing program. Similarly, the actual supply stop instruction is advanced by the stop time lag $T_{DE}$ from the time written in the processing program. If there is no variation in time lags $T_{DS}$ and $T_{DE}$, the delivery detecting sensor 6 is turned off at the point of time $t_S$ of execution of the supply start instruction in the processing program shown in FIG. 17A. However, variations could occur in these time lags. Then, the start time lag $T_{DS}$ would not enable an accurate correction. As a result, for example, the detecting sensor 6 would be turned off slightly after the point of time $t_S$. To avoid this, the controller 20a resets the timer at the point of time $T_S$ for executing the actual supply start instruction, and stops the timer when the delivery detecting sensor 6 is turned off. A timer count of this time is stored in the time lag storage 21 as a new start time lag $T_{DSN}$. Similarly, a period from the point of time $T_E$ of execution of the actual supply stop instruction to the point of time at which the delivery detecting sensor 6 is turned on is stored in the time lag storage 21 as a new stop time lag $T_{DEN}$.

In treating the second wafer W, the instructions are executed at corrected times based on the time lags $T_{DS}$ and $T_{DE}$ and new time lags $T_{DSN}$ and $T_{DEN}$ stored in the time lag storage 21. A specific example of correction will be described with reference to FIG. 17B.

Figure 17A:
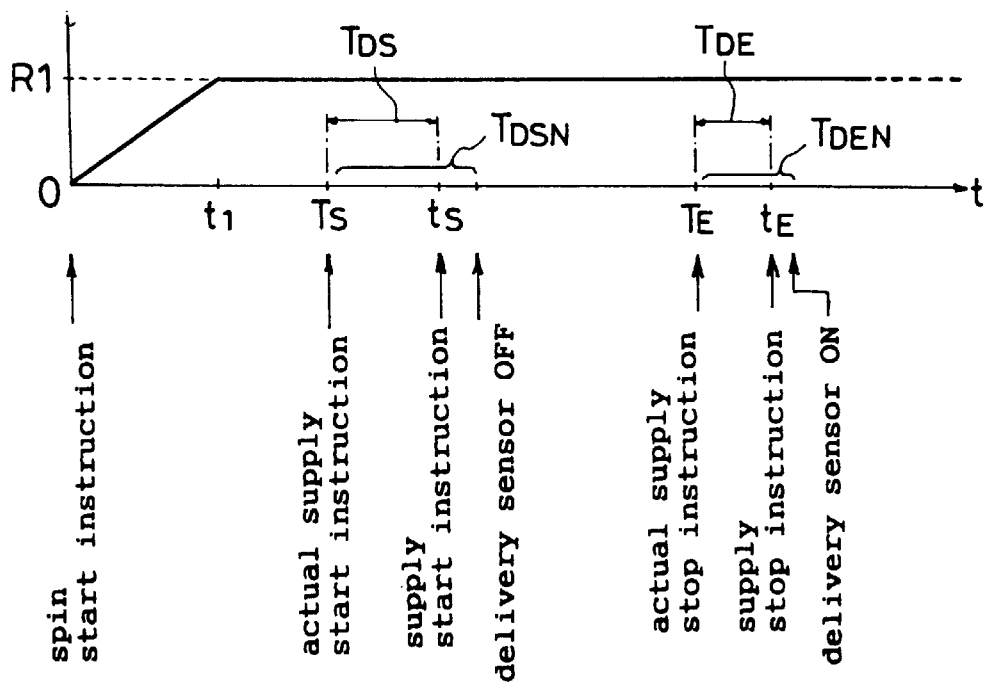
FIGS. 17A and 17B are time charts showing an operation carried out in the event of a new time lag.
Figure 17B:
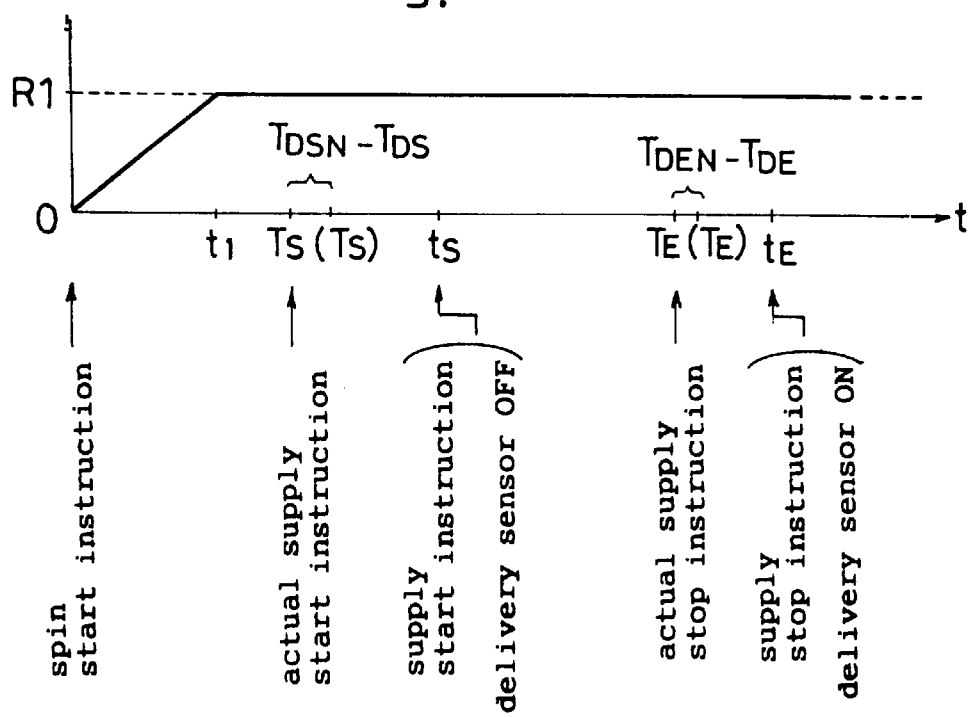

As seen from FIG. 17A, the new time lags $T_{DSN}$ and $T_{DEN}$ found in the treatment of the first wafer W, are deviations from the points of time $T_S$ and $T_E$ of actual supply start instruction and actual supply stop instruction, and include the time lags $T_{DS}$ and $T_{DE}$ determined in the measuring process. The periods to be adjusted correspond to differences between the new time lags $T_{DSN}$ and $T_{DEN}$ and the time lags $T_{DS}$ and $T_{DE}$. Thus, the controller 20a derives these differences ($T_{DSN}-T_{DS}$ and $T_{DEN}-T_{DE}$) and, as shown in FIG. 17B, advances the times for executing the actual supply start instruction and actual supply stop instruction based on these differences for treating the second wafer W. The supply start instruction is executed at a new point of time $T_S$ advanced from the point of time ($T_S$) in the treatment of the preceding wafer. The supply stop instruction is executed at a new point of time $T_E$ advanced from the point of time ($T_E$) in the treatment of the preceding wafer. If the new time lags $T_{DSN}$ and $T_{DEN}$ are equal to the two time lags $T_{DS}$ and $T_{DE}$ measured in the measuring process, i.e. if no variation has occurred, the differences are zero and the controller 20a effects no substantial correction to the execution timing.

The correction process has been described, exemplifying a case of new time lags $T_{DSN}$ and $T_{DEN}$ being longer than the time lags $T_{DS}$ and $T_{DE}$. A case of new time lags $T_{DSN}$ and $T_{DEN}$ being shorter than the time lags $T_{DS}$ and $T_{DE}$ will be described next with reference to the time charts shown in FIGS. 18A and 18B.

Figure 18A:
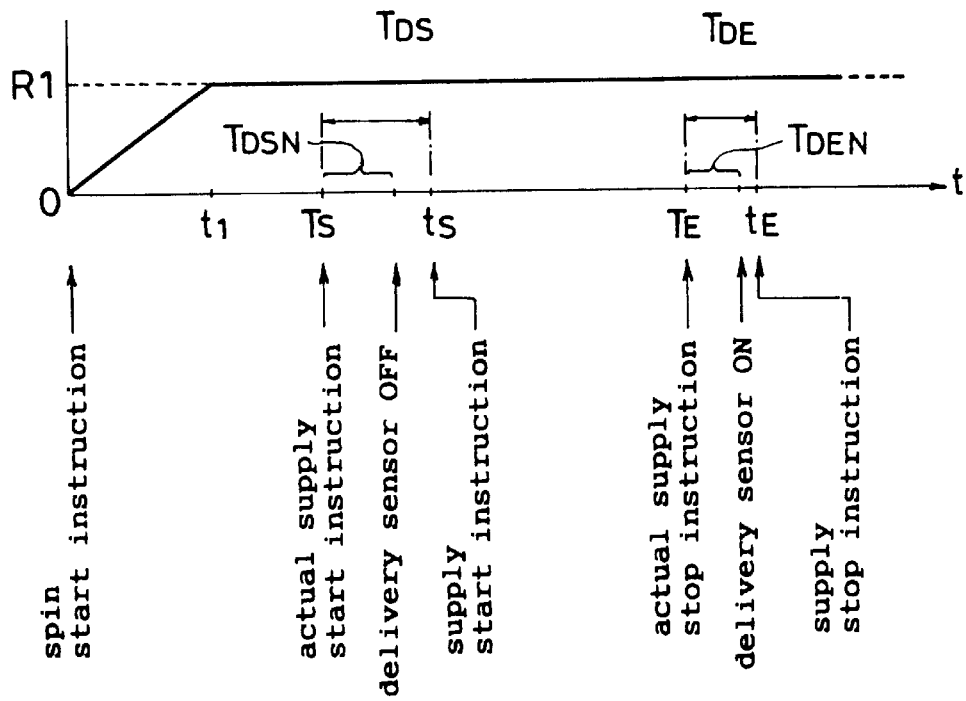
FIGS. 18A and 18B are time charts showing an operation carried out in the event of a new time lag.

In treating the first wafer W, the actual supply start instruction and actual supply stop instruction are executed at the points of time $T_S$ and $T_E$ (advanced from the times written in the processing program). During this treatment new time lags $T_{DSN}$ and $T_{DEN}$ are measured which, as shown in FIG. 18A, correspond to the periods from the points of time $T_S$ and $T_E$ to the points of time of detection by the delivery detecting sensor 6. As seen from FIG. 18A, the periods to be adjusted as a result of the treatment of the first wafer correspond to differences ($T_{DSN}-T_{DS}$ and $T_{DEN}-T_{DE}$) between the new time lags $T_{DSN}$ and $T_{DEN}$ and the time lags $T_{DS}$ and $T_{DE}$. Since the time lags $T_{DS}$ and $T_{DE}$ are the larger, the results become "minus" time lags. That is, the photoresist solution has been delivered and stopped before lapse of the time lags $T_{DS}$ and $T_{DE}$ from the points of time $T_S$ and $T_E$ of execution of the actual supply start instruction and actual supply stop instruction. It is necessary to advance the times of execution "in the negative direction", i.e. to delay the times of execution.

Figure 18B:
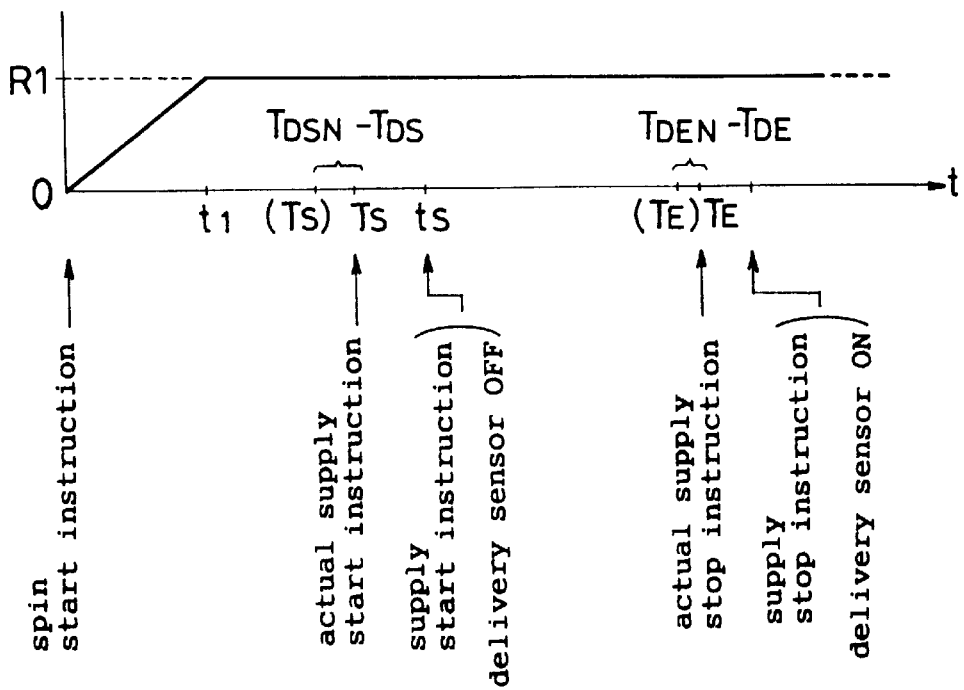

Thus, the controller 20a derives the differences ($T_{DSN}-T_{DS}$ and $T_{DEN}-T_{DE}$) and advances "in the negative direction", i.e. delays, the times for executing the actual supply start instruction and actual supply stop instruction based on these differences for treating the second wafer W. As shown in FIG. 18B, the supply start instruction is executed at a new point of time $T_S$ delayed from the point of time ($T_S$) in the treatment of the preceding wafer. The supply stop instruction is executed at a new point of time $T_E$ delayed from the point of time ($T_E$) in the treatment of the preceding wafer.

Thus, even in the event of variations occurring in the time lags due to variations of the utilities, such variations are fed back and absorbed to minimize influences of the variations on the wafer treatment as well as producing the effects described hereinbefore. Consequently, variations in treatment among different lots or within a lot are suppressed to assure steady treatment over a long period of time.

In the foregoing description, examples are taken in which both time lags are prolonged (FIGS. 17A and 17B) and both time lags are shortened (FIGS. 18A and 18B). Variations may be corrected in a similar way when one of the time lags is prolonged and the other shortened.

A new correction may be made even in the absence of deviation from the actual supply start instruction and actual supply stop instruction. For example, new time lags from the points of time $t_S$ and $t_E$ written in the processing program for executing the supply start instruction and supply stop instruction may be measured to correct execution timing based on the two time lags $T_{DS}$ and $T_{DE}$.

In the above processing program, the trigger signal output instruction is executed with the spin accelerate instruction, to pick up an image of the wafer surface at that point of time $t_S$. The trigger signal output instruction may be executed at any crucial moment in each processing program. In FIG. 15, for example, such crucial point may be found in the period from the point of time $T_S$ for executing the actual supply start instruction to the point of time TE for executing the actual supply stop instruction, or in the period of spin acceleration for increasing the rotational frequency from supplying rotational frequency R1 to film-forming rotational frequency R2.

The foregoing description has been made, taking no account of a time lag due to the distance L between the discharge opening 5a of the coating solution supply nozzle 5 and the surface of wafer W. This is because this time lag has minor influences compared with the time lags due to the coating solution supplying mechanism. However, where the time lag due to the distance L cannot be dismissed as negligible, execution of the various instructions may be advanced after detecting arrival of the photoresist solution at the wafer surface or after detecting cessation of the photoresist solution supply to the wafer surface. Such an apparatus is provided in the second embodiment described hereinafter.

Second Embodiment

FIG. 19 is a block diagram and vertical section showing an outline of a substrate spin coating apparatus in the second embodiment of the invention. In FIG. 19, like reference numerals are used to identify like elements in the first embodiment shown in FIG. 10, which will not be described again.

Figure 20:
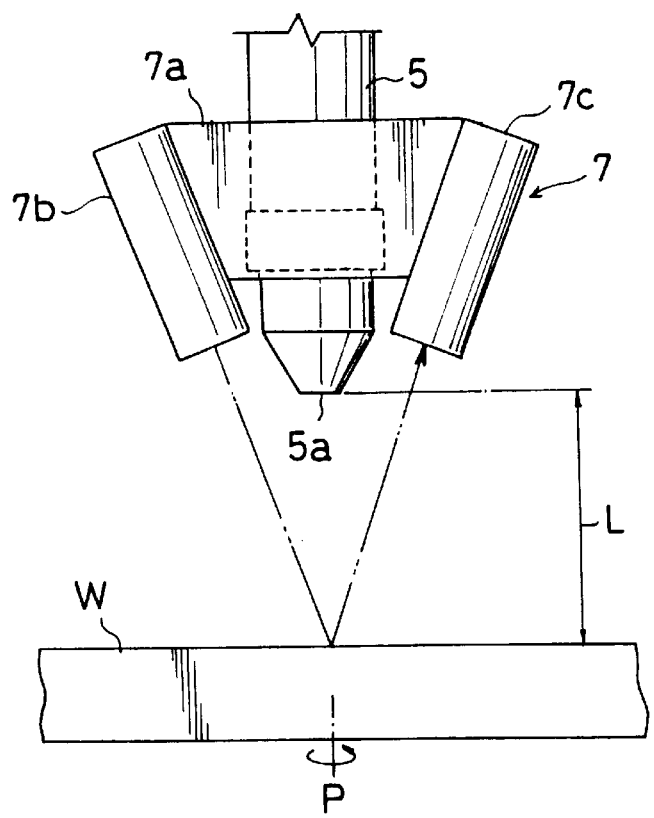
FIG. 20 is a view showing an arrival detecting sensor.

The second embodiment differs from the first embodiment in detection of the photoresist solution. The apparatus in the second embodiment includes an arrival detecting sensor 7 attached to the downwardly extending tip portion of the coating solution supply nozzle 5. As shown in FIG. 20, the sensor 7 includes a light projector 7b and a light receiver 7c attached to the tip portion of the supply nozzle 5 through a mounting element 7a. The light projector 7b and light receiver 7c are pointed to the spin center P on the surface of wafer W. Light in the infrared wavelength region projected from the light projector 7b is reflected by the region around the spin center P on the surface of wafer W to enter the light receiver 7c containing a photodiode sensitive to the infrared wavelength region and thereabouts. In this apparatus, for example, the arrival detecting sensor 7 outputs a detection signal which is turned on when the light is received. Thus, the detection signal is turned off when the photoresist solution delivered through the discharge opening 5a of the supply nozzle 5 reaches the surface of wafer W. The detection signal is turned on when the photoresist solution ceases to be applied to the surface of wafer W from the discharge opening 5a of the supply nozzle 5. This arrival detecting sensor 7 corresponds to the arrival detecting device of this invention.

The coating solution supply nozzle 5 is movable by a nozzle moving mechanism 10 between a supply position and a standby position as in the first embodiment. In the supply position, the discharge opening 5a of the nozzle 5 shown in FIG. 20 is located at a distance L upward from the surface of wafer W. The distance L is approximately 4 mm, for example. Preferably, as in the first embodiment, this distance is adjusted according to the viscosity of the photoresist solution, size of wafer W and surface condition of wafer W, to avoid irregularities occurring when the photoresist solution dripped to the surface of wafer W spreads over the entire surface.

The time lag storage 21 stores, as a start time lag, a deviation (delay) from a point of time the controller 20a executes the supply start instruction in the processing program to a point of time the photoresist solution discharged from the discharge opening 5a of the supply nozzle 5 actually reaches the surface of wafer W. The time lag storage 21 also stores, as a stop time lag, a deviation (delay) from a point of time the controller 20a executes the supply stop instruction to a point of time the photoresist solution supplied from the supply nozzle 5 actually ceases to reach the wafer W. Each of these two time lags is measured by the internal timer, not shown, as time taken from execution by the controller 20a of the supply start instruction or supply stop instruction to a change in the detection signal outputted from the arrival detecting sensor 7. The controller 20a corresponds to the time lag measuring device, measurement control device and control device of this invention. The time lag storage 21 corresponds to the time lag storing device of this invention.

<Measuring Process>

Figure 22:
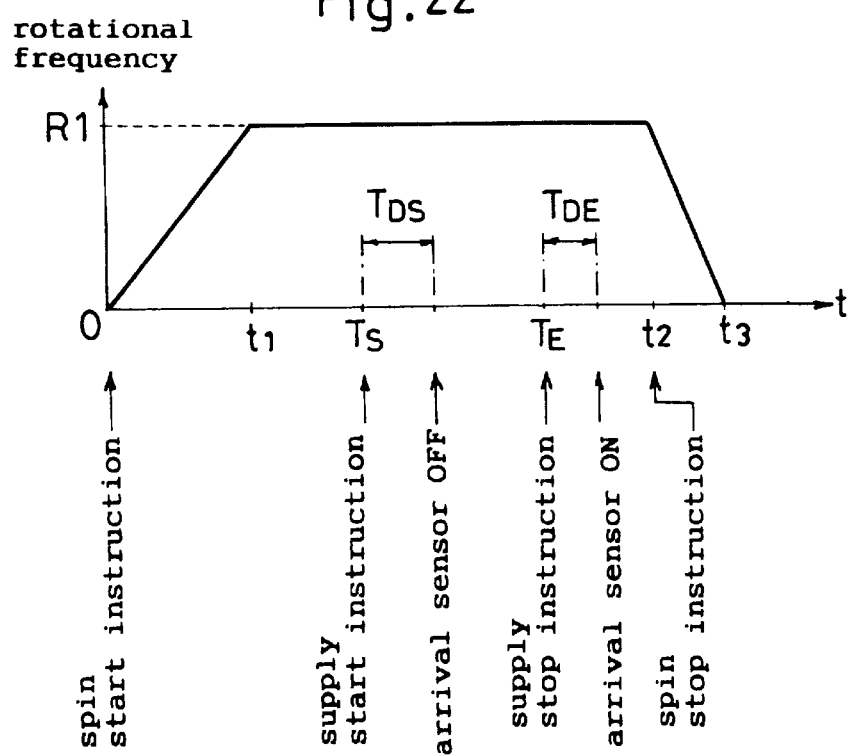
FIG. 22 is a time chart showing the measuring process.
Figure 21:
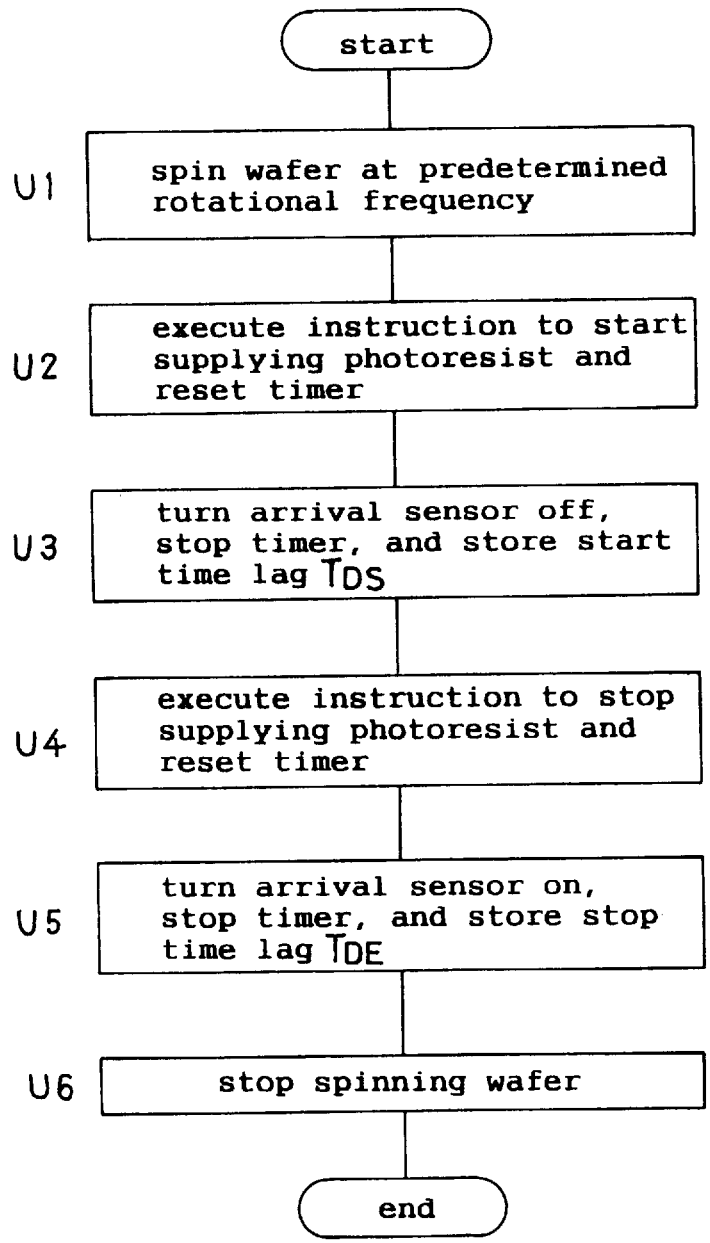
FIG. 21 is a flow chart showing a process of measuring a start time lag and a stop time lag.

The process of measuring the start time lag and stop time lag will be described next with reference to the flow chart shown in FIG. 21 and time chart shown in FIG. 22.

As in the first embodiment, this measuring process is carried out before a process of coating product wafers, by using, for example, dummy wafers different from the product wafers. This measuring process measures the time lags variable with degrees of adjustment of the suckback valve 13 and speed control valve assembly 18. Preferably, the measuring process is carried out each time the apparatus is started, or periodically based on management of use periods of the apparatus, or each time the suckback valve 13 or speed control valve assembly 18 is readjusted.

It is assumed that wafer W (dummy wafer) is already placed on the spin chuck 1 by the substrate transport mechanism not shown, and is suction-supported by the spin chuck 1. It is further assumed that the coating solution supply nozzle 5 has been moved to the supply position by the nozzle moving mechanism 10, with the delivery opening 5a situated at distance L (see FIG. 20) above the spin center P of wafer W.

At step U1, the wafer is spun at a predetermined rotational frequency. Specifically, as shown in FIG. 22 (in which the time origin corresponds to a point of time at which the controller 20a executes a spin start instruction contained in a measurement program), when the controller 20a executes the spin start instruction, the electric motor 3 is started rotating with an acceleration to reach the predetermined supplying rotational frequency R1 (e.g. 1,000 rpm) at point of time t1. This measuring process measures a time lag in supply. It is therefore unnecessary for the rotational frequency R1 to be equal to the supplying rotational frequency R1 in the "Product Wafer Process" described hereinafter. However, for expediency of description, as in the first embodiment, the rotational frequency R1 is regarded as the same for both processes.

Upon lapse of a predetermined period of time from the point of time t1 at which the rotational frequency of wafer W reaches a steady state at the predetermined supplying rotational frequency R1, the controller 20a executes the instruction to start supplying the photoresist solution, and resets the internal timer (step U2). This operation is carried out to prepare for measuring a period (start time lag $T_{DS}$) from execution of the supply start instruction to actual arrival of the photoresist solution at the surface of wafer W.

When the controller 20a executes the supply start instruction, the photoresist solution is supplied to the surface of wafer W as follows.

First, the suckback valve 13 is closed to cancel the suction applied to the supply nozzle 5, and one of the valves 18a of the speed control valve assembly 18 also is closed while the other valve 18b is opened. Consequently, the double-acting air cylinder 17 becomes operative to actuate the bellows pump 14 to feed a fixed quantity of the photoresist solution from the coating solution tank 16 into the supply pipe 12. With this series of operations, the photoresist solution begins to be supplied to the surface of wafer W through the discharge opening 5a of the supply nozzle 5. The valves 18a and 18b of the speed control valve assembly 18 are alternately closed and opened. The piston 17a of the air cylinder 17 is thereby raised and lowered to drive the bellows pump 14 repeatedly to supply the photoresist solution in the predetermined quantity through the supply nozzle 5 to the wafer W each time. When the leading end of the photoresist solution delivered from the discharge opening 5a arrives at the surface of wafer W after traversing the distance L, the light projected from the light projector 7b is intercepted by the photoresist solution. Since the light is stopped entering the light receiver 7c, the detection signal from the arrival detecting sensor 7 is turned off. At this time, the controller 20a stops the internal timer, and stores this time as start time lag $T_{DS}$ in the time lag storage 21 (step U3). This start time lag $T_{DS}$ represents a deviation from the supply start instruction, which results from the above series of operations.

After a predetermined period of time from execution of the supply start instruction, based on the measurement program, the controller 20a executes the instruction to stop the supply of the photoresist solution, and resets the internal timer (step U4). This operation is carried out to prepare for measuring a period (stop time lag $T_{DE}$) from the point of time $T_E$ of execution of the supply stop instruction to a complete stoppage of the photoresist solution supplied to the surface of wafer W through the discharge opening 5a of the coating solution supply nozzle 5.

When the supply stop instruction is executed, the supply of the photoresist solution is stopped as follows.

First, the alternate opening and closing of the two speed control valves 18a and 18b are stopped to place the air cylinder 17 in inoperative state, thereby to stop the supply of the photoresist solution. At the same time, the suckback valve 13 is opened to slightly draw the photoresist solution back from the tip portion of the supply nozzle 5. With this operation, the photoresist solution is stopped flowing from the coating solution tank 16 through the supply tube 12 and supply nozzle 5. However, the part of the photoresist solution present in the space of distance L from the discharge opening 5a to the surface of wafer W drops toward the surface of wafer W instead of being drawn backward. When this drop is completed (i.e. the supply of the photoresist solution to the surface of wafer W is terminated), the light from the light projector 7b is reflected by the surface of wafer W or the surface of the photoresist solution, and enters the light receiver 7c again to turn on the detection signal from the detecting sensor 7. Then, the controller 20a stops the internal timer, and stores this time as stop time lag $T_{DE}$ in the lag time storage 21 (step U5). This stop time lag $T_{DE}$ represents a deviation from the point of time $T_E$ of execution of the supply stop instruction, which results from the above series of operations.

At a point of time t2 which is a predetermined time from the point of time $T_E$ of execution of the supply stop instruction, the controller 20a executes a spin stop instruction to stop the electric motor 3 (step U6).

By executing the measurement program as described above, the start time lag $T_{DS}$ and stop time lag $T_{DE}$ are measured and stored in the time lag storage 21.

<Product Wafer Process>

After the measuring process described above, a plurality of product wafers are processed successively. This product wafer process will be described with reference to the time chart shown in FIG. 23.

Upon execution of a spin start instruction in the processing program prepared for this purpose, wafer W is spun with an acceleration to reach the predetermined supplying rotational frequency R1 (e.g. 1,000 rpm) at a point of time t1. At a point of time $T_S$ after the rotational frequency of wafer W reaches a steady state at the supplying rotational frequency R1, a supply start instruction is executed to start delivering the photoresist solution at the predetermined quantity. At a point of time $T_E$ a supply stop instruction is executed to stop the delivery of the photoresist solution. At a point of time t2, a spin accelerate instruction is executed to accelerate the spin of wafer W to the film forming rotational frequency R2 (e.g. 3,000 rpm). At a point of time t4, a spin stop instruction is executed, whereby the coating process is completed at a point of time t5. As in the first embodiment, it is preferable to add an instruction to deliver a cleaning solution from the back rinse nozzles 11 shown in FIG. 19, in order to remove unwanted part of the photoresist solution scattering in mist from the edge of wafer W and adhering to the back side surface of wafer W or flowing round the edge to the back side surface of wafer W to adhere thereto.

This processing program, as does the processing program in the first embodiment, further includes a trigger signal output instruction for causing the confirmation unit 50 to pick up an image of the surface of wafer W. This instruction is executed at the point of time t2, in parallel with the spin accelerate instruction.

Figure 23:
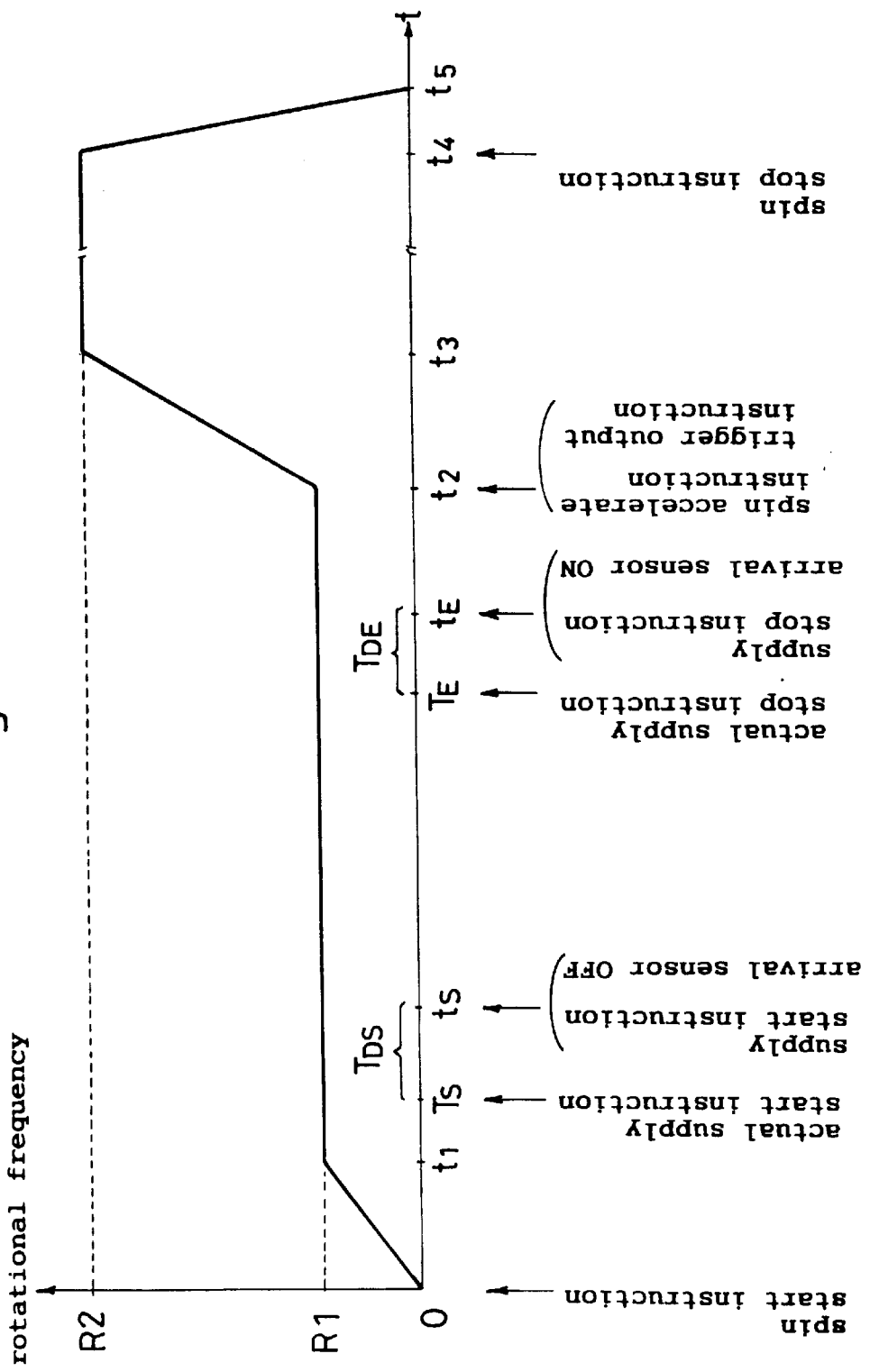
FIG. 23 is a time chart showing a product wafer process.

In carrying out this processing program, the controller 20a executes the supply start instruction and supply stop instruction at points of time adjusted by the two time lags $T_{DS}$ and $T_{DE}$ stored in the time lag storage 21. Specifically, since the points of time $t_S$ and $t_E$ for executing the supply start instruction and supply stop instruction are known before the controller 20a carries out the processing program, the timing for executing these instructions is advanced by the respective time lags. In FIG. 23, the word "actual" is prefixed to the names of instructions actually executed with such timing adjustment. The supply start instruction and supply stop instruction without the word "actual" are written in the processing program, but not actually executed by the controller 20a.

In this way, the controller 20a actually executes the (actual) supply start instruction and (actual) supply stop instruction at points of time advanced by the time lags $T_{DS}$ and $T_{DE}$. Consequently, the detection signal from the arrival detecting sensor 7 is turned on and off at the points of time $t_S$ and $t_D$ delayed from the times of execution by the time lags $T_{DS}$ and $T_{DE}$. That is, the photoresist solution arrives at the surface of wafer W and the supply of the photoresist solution to the surface of wafer W is stopped, respectively, at the intended supply starting point of time (at the point of time $t_S$ at which the supply start instruction is supposed to be executed) and at the intended supply stopping point of time (at the point of time $t_E$ at which the supply stop instruction is supposed to be executed) written in the processing program. This eliminates the trouble of preparing a processing program by taking into account the supply start/stop time lags (deviations) due to the distance L between the discharge opening 5a and the surface of wafer W and degrees of adjustment of the suckback valve 13 and speed control valve assembly 18 (as in the manual time lag correction in the prior art). The processing program may be prepared with facility since desired timing for the supply start instruction and supply stop instruction may be written in the processing program. In the operation based on this processing program, the photoresist solution supplying/stopping timing is automatically corrected with reference to the two time lags measured, whereby the photoresist solution is supplied and stopped accurately. Further, since the photoresist solution is supplied and stopped with precise timing, an excessive supply of photoresist solution to the wafer W is substantially eliminated to achieve resource-saving. The cost of treatment may be reduced drastically where, as in this product wafer process, a plurality of wafers are processed successively.

The first embodiment described hereinbefore takes no account of a time lag due to the distance L between the discharge opening 5a of the coating solution supply nozzle 5 and the surface of wafer W. However, the second embodiment takes such a time lag into account, thereby supplying and stopping the photoresist solution with high precision. This promotes precision in treating wafers W.

The controller 20a executes the spin accelerate instruction and trigger signal output instruction at the point of time t2. On the latter instruction, the controller 20a outputs a trigger signal to the confirmation unit 50. In response to the trigger signal, the confirmation unit 50 operates as in the first embodiment, as shown in the flow chart of FIG. 16.

As a result, a still picture is displayed on the monitor 59. The still picture corresponds to the image of the surface of wafer W picked up as described hereinbefore. The operator may determine behavior of the photoresist solution exhibited at the time of image pickup. In this way, the operator can readily determine whether or not the wafer W is treated properly with the timing correction. The operator may manually stop the apparatus at once if any abnormality is found in the behavior of the photoresist solution. Thus, an improper coating process is precluded from being applied to succeeding wafers. As described in the first embodiment, the technique of obtaining a still picture based on the trigger signal has advantages over the existing technique of making confirmation by using a high-speed video camera.

As in the first embodiment, the product wafer process is preceded by the measuring process carried out each time the apparatus is started, or periodically, or when the suckback valve 13 or speed control valve assembly 18 is readjusted to cope with variations in the time lags $T_{DS}$ and $T_{DE}$. The time lags $T_{DS}$ and $T_{DE}$ measured are subject to further deviations occurring with passage of time after the measuring process. The cause of such deviations is described hereinbefore. The following steps may be taken in the event of such deviations.

After the measuring process described hereinbefore, a similar measuring process is carried out for each wafer during the product wafer process. A first wafer is treated with execution timing corrected by the time lags $T_{DS}$ and $T_{DE}$ measured during the initial measuring process. Time lags are measured again at this time. A second wafer is treated with execution timing corrected based on the time lags $T_{DS}$ and $T_{DE}$ and the new time lags measured during the treatment of the first wafer. Subsequent wafers are treated similarly. A specific example of this process will be described with reference to the time charts shown in FIGS. 24A, 24B, 25A and 25B.

It is assumed that start time lag $T_{DS}$ and stop time lag $T_{DE}$ are already stored in the time lag storage 21 as a result of the measuring process carried out as described hereinbefore. For expediency of illustration, FIGS. 24A, 24B, 25A and 25B show only a portion of the time chart in FIG. 23 covering the process from the spin start instruction to a point of time before the spin accelerate instruction. The spin accelerate instruction, trigger signal output instruction and so on are actually executed after the illustrated portion to complete the process shown in FIG. 23.

In treating the first wafer W, the actual supply start instruction is executed at the time advanced by the start time lag $T_{DS}$ from the time written in the processing program. Similarly, the actual supply stop instruction is advanced by the stop time lag $T_{DE}$ from the time written in the processing program. If there is no variation in time lags $T_{DS}$ and $T_{DE}$, the arrival detecting sensor 7 is turned off at the point of time $t_S$ at which the supply start instruction is executed in the processing program shown in FIG. 24A. However, variations could occur in these time lags. Then, the start time lag $T_{DS}$ would not enable an accurate correction. As a result, for example, the detecting sensor 7 would be turned off slightly after the point of time $t_S$. To avoid this, the controller 20a resets the timer at the point of time $T_S$ for executing the actual supply start instruction, and stops the timer when the arrival detecting sensor 7 is turned off. A timer count of this time is stored in the time lag storage 21 as a new start time lag $T_{DSN}$. Similarly, a period from the point of time $T_E$ of execution of the actual supply stop instruction to the point of time at which the arrival detecting sensor 7 is turned on is stored in the time lag storage 21 as a new stop time lag $T_{DEN}$.

In treating the second wafer W, the instructions are executed at corrected times based on the time lags $T_{DS}$ and $T_{DE}$ and new time lags $T_{DSN}$ and $T_{DEN}$ stored in the time lag storage 21. A specific example of correction will be described with reference to FIG. 24B.

Figure 24A:
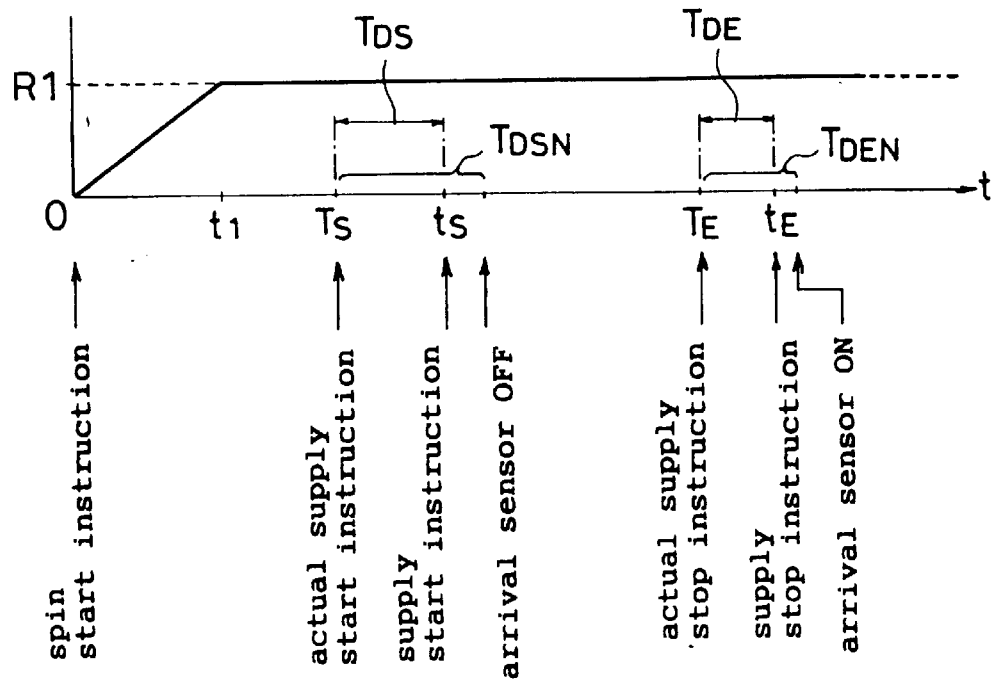
FIGS. 24A and 24B are time charts showing an operation carried out in the event of a new time lag.
Figure 24B:
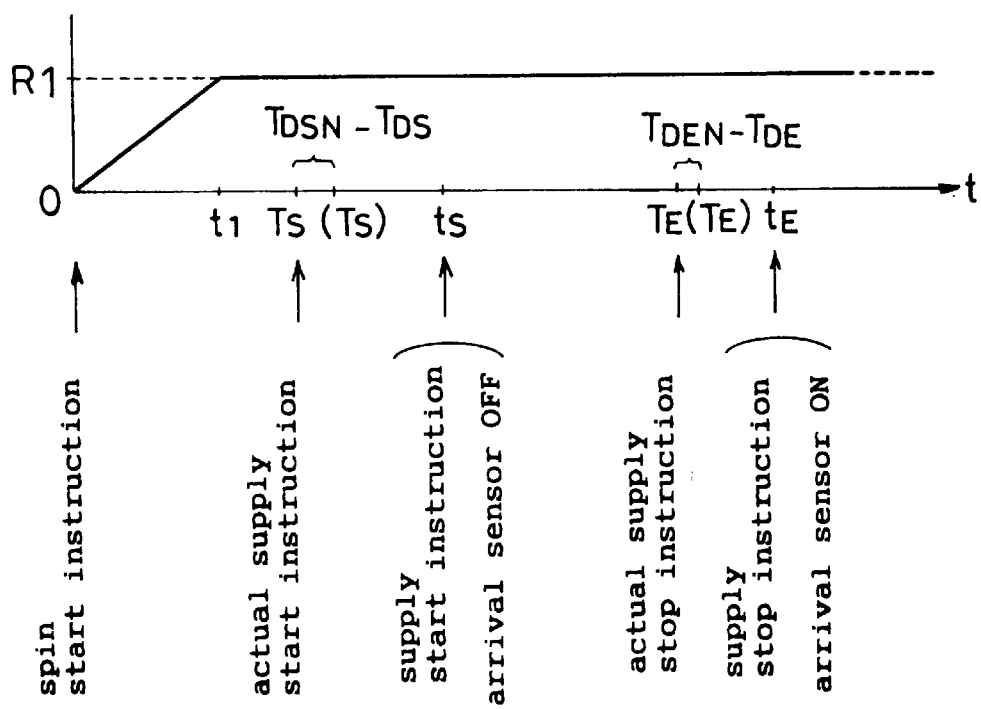

As seen from FIG. 24A, the new time lags $T_{DSN}$ and $T_{DEN}$ found in the treatment of the first wafer W are deviations from the points of time $T_S$ and $T_E$ of actual supply start instruction and actual supply stop instruction, and include the time lags $T_{DS}$ and $T_{DE}$ determined in the measuring process. The periods to be adjusted correspond to differences between the new time lags $T_{DSN}$ and $T_{DEN}$ and the previous time lags $T_{DS}$ and $T_{DE}$. Thus, the controller 20a derives these differences ($T_{DSN}-T_{DS}$ and $T_{DEN}-T_{DE}$) and, as shown in FIG. 24B, advances the points of time for executing the actual supply start instruction and actual supply stop instruction based on these differences for treating the second wafer W. The supply start instruction is executed at a new point of time $T_S$ advanced from the point of time ($T_S$) in the treatment of the preceding wafer. The supply stop instruction also is executed at a new point of time $T_E$ advanced from the point of time ($T_E$) in the treatment of the preceding wafer. If the new time lags $T_{DSN}$ and $T_{DEN}$ are equal to the two time lags $T_{DS}$ and $T_{DE}$ measured in the measuring process, i.e. if no variation has occurred, the differences are zero and the controller 20a effects no substantial correction to the execution timing.

The correction process has been described, exemplifying a case of new time lags $T_{DSN}$ and $T_{DEN}$ longer than the time lags $T_{DS}$ and $T_{DE}$. A case of new time lags $T_{DSN}$ and $T_{DEN}$ shorter than the time lags $T_{DS}$ and $T_{DE}$ will be described next with reference to the time charts shown in FIGS. 25A and 25B.

Figure 25A:
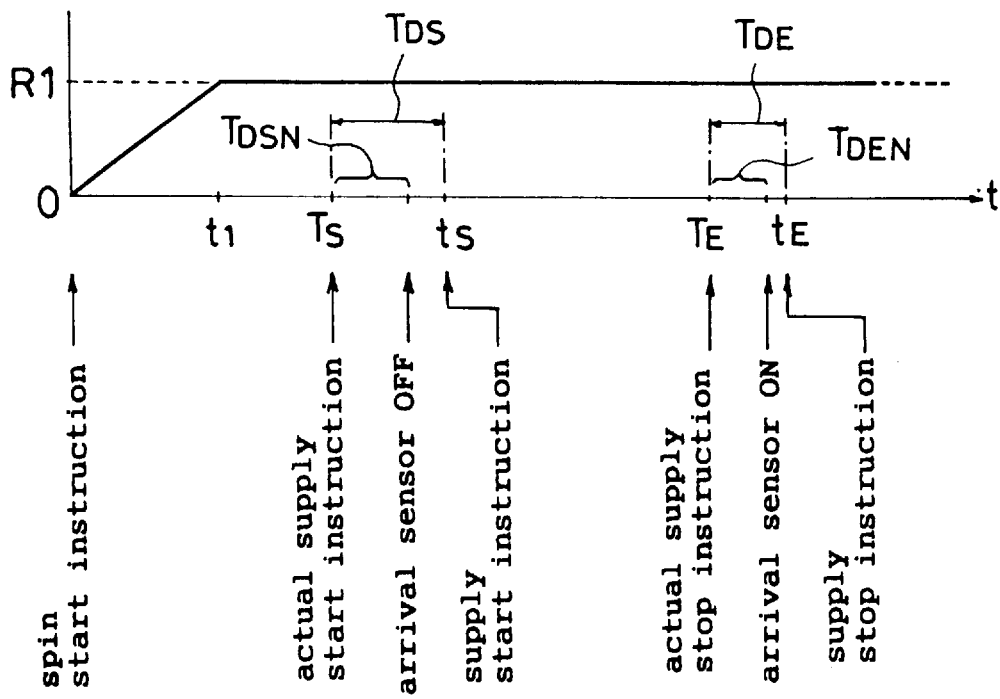
FIGS. 25A and 25B are time charts showing an operation carried out in the event of a new time lag.

In treating the first wafer W, the actual supply start instruction and actual supply stop instruction are executed at the points of time $T_S$ and $T_E$ (advanced from the points of time written in the processing program). During this treatment new time lags $T_{DSN}$ and $T_{DEN}$ are measured which, as shown in FIG. 25A, correspond to the periods from the points of time $T_S$ and $T_E$ to the points of time of detection by the arrival detecting sensor 7. As seen from FIG. 25A the periods to be adjusted as a result of the treatment of the first wafer correspond to differences ($T_{DSN}-T_{DS}$ and $T_{DEN}-T_{DE}$) between the new time lags $T_{DSN}$ and $T_{DEN}$ and the time lags $T_{DS}$ and $T_{DE}$. Since the time lags $T_{DS}$ and $T_{DE}$ are the larger, the results become "negative" time lags. That is, the photoresist solution has been delivered and stopped before lapse of the time lags $T_{DS}$ and $T_{DE}$ from the points of time $T_S$ and $T_E$ of execution of the actual supply start instruction and actual supply stop instruction. It is necessary to advance the times of execution "in the negative direction", i.e. to delay the times of execution.

Thus, the controller 20a derives the differences ($T_{DSN}-T_{DS}$ and $T_{DEN}-T_{DE}$) and advances "in the negative direction", i.e. delays, the times for executing the actual supply start instruction and actual supply stop instruction based on these differences for treating the second wafer W.

Figure 25B:
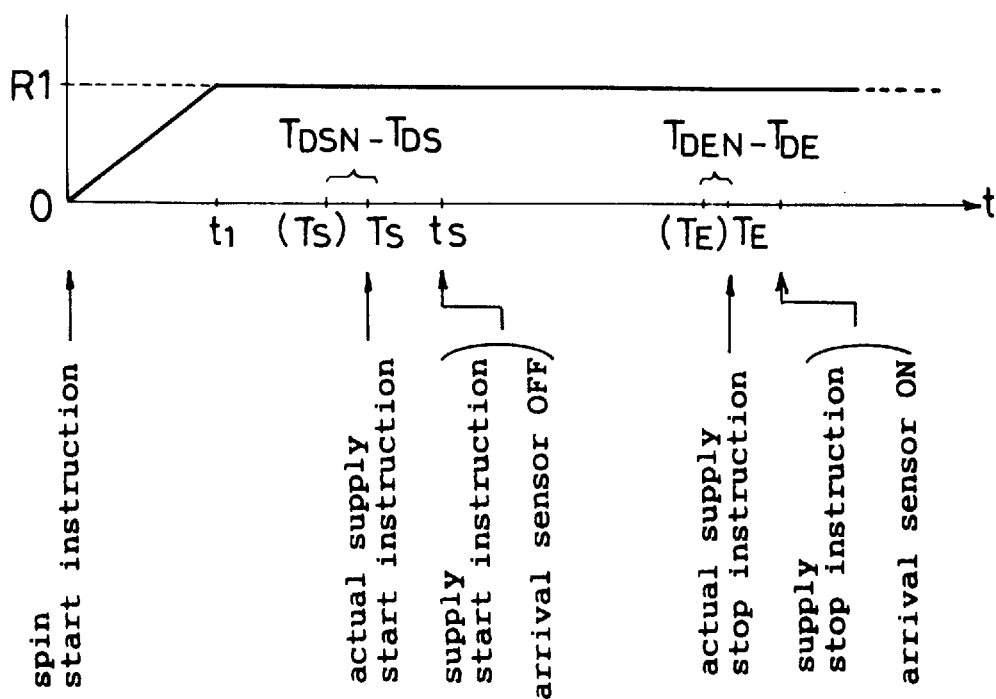

As shown in FIG. 25B, the supply start instruction is executed at a new point of time $T_S$ delayed from the point of time ($T_S$) in the treatment of the preceding wafer. The supply stop instruction is executed at a new point of time $T_E$ delayed from the point of time ($T_E$) in the treatment of the preceding wafer.

Thus, even in the event of variations occurring in the time lags due to variations of the utilities, such variations are fed back and absorbed to minimize influences of the variations on the wafer treatment as well as producing the above effects. Consequently, variations in treatment among different lots or within a lot are suppressed to assure steady treatment over a long period of time.

In the foregoing description, examples are taken in which both time lags are prolonged (FIGS. 24A and 24B) and both time lags are shortened (FIGS. 25A and 25B). Variations may be corrected in a similar way when one of the time lags is prolonged and the other shortened.

A new correction may be made even in the absence of deviation from the actual supply start instruction and actual supply stop instruction. For example, new time lags from the points of time ts and $t_E$ written in the processing program for executing the supply start instruction and supply stop instruction may be measured to correct execution timing based on the two time lags $T_{DS}$ and $T_{DE}$.

In the above processing program, the trigger signal output instruction is executed with the spin accelerate instruction, to pick up an image of the wafer surface at that point of time. The trigger signal output instruction may be executed at any crucial moment in each processing program.

The first and second embodiments have been described on the assumption that the operation starts with the coating solution supply nozzle 5 already placed in the supply position. For example, the processing program may instruct selection of One of coating solution supply nozzles 5, and commencement of photoresist solution supply at a point of time at which the selected nozzle has been moved to the position to place its tip portion adjacent the spin center of wafer W. Such a program may be carried out by advancing the time for executing the instruction to move the nozzle.

The Coating Solution Applying Method described hereinbefore (FIG. 5) may be employed in the first and second embodiments. Operations of the apparatus taking place in this case will be described with reference to the time chart shown in FIG. 26.

The photoresist solution R behaves as shown in FIGS. 3A through 3F when the photoresist solution R is applied according to the processing program shown in the flow chart of FIG. 15 (first embodiment) or FIG. 23 (second embodiment). This results in a very low use efficiency of the photoresist solution as described hereinbefore.

Figure 26:
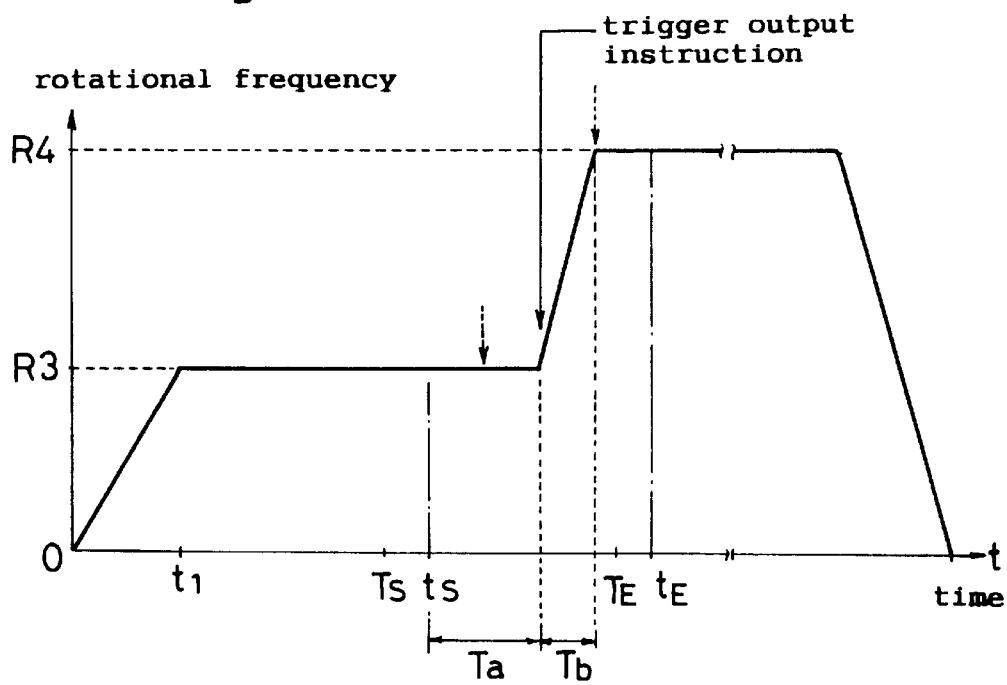
FIG. 26 is a time chart showing employment of the coating solution applying method according to the present invention.

Thus, as shown in FIG. 26, after lapse of time Ta from the point of time $t_S$ at which the photoresist solution R is delivered from the coating solution supply nozzle 5 in the first embodiment, or from the point of time $t_S$ at which the photoresist solution R arrives at the surface of wafer W in the second embodiment, the controller 20a controls the electric motor 3 to switch the rotational frequency of wafer W from low supplying rotational frequency R3 to high target rotational frequency R4 (=film-forming rotational frequency) with a predetermined acceleration (to switch to a high-speed spin within a period of time Tb). As a result, the photoresist solution behaves as shown in FIGS. 6A through 6F.

Figure 1:
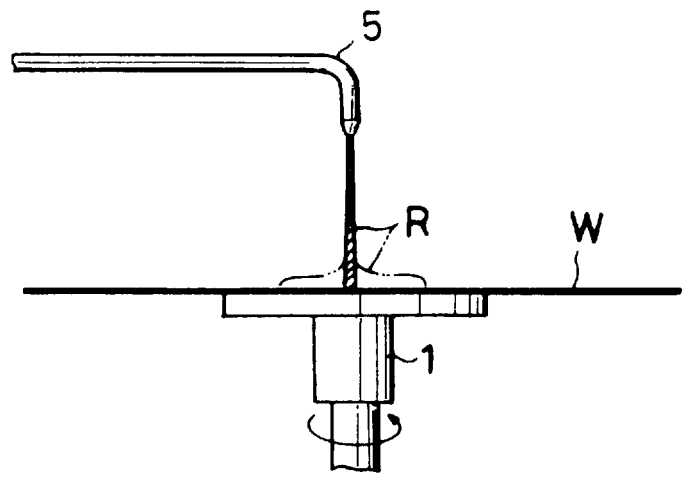
FIG. 1 is a view showing a principal portion of a conventional substrate spin coating apparatus.
Figure 2:
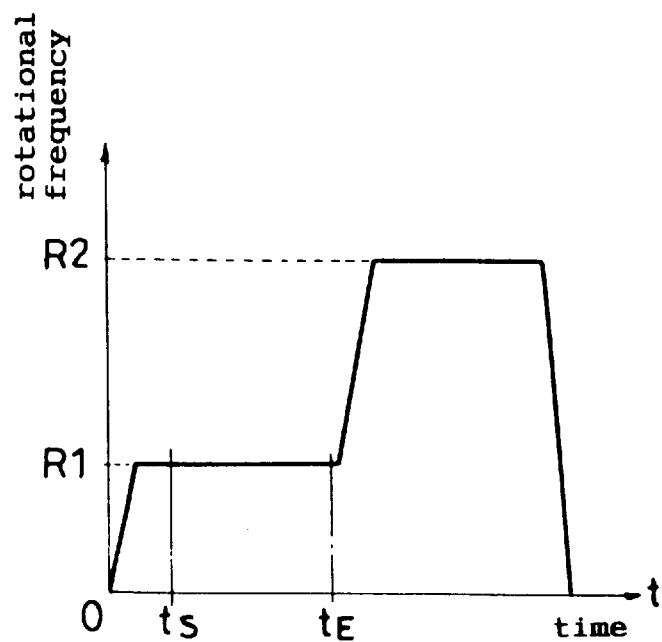
FIG. 2 is a time chart showing a conventional coating solution applying method.
Figure 3A:
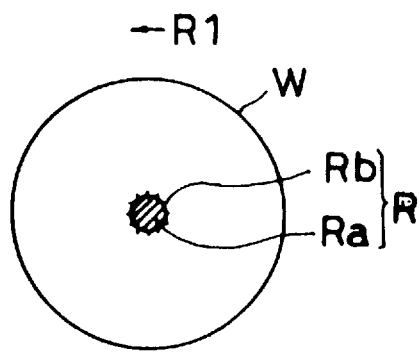
FIGS. 3A, 3B, 3C, 3D, 3E, and 3F are explanatory views illustrating the conventional coating solution applying method.
Figure 3B:
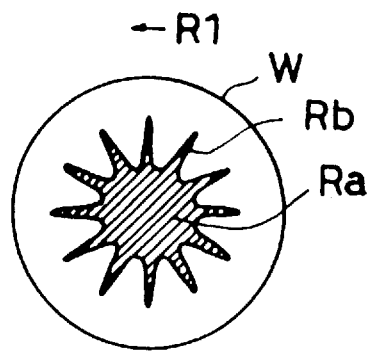
Figure 3C:
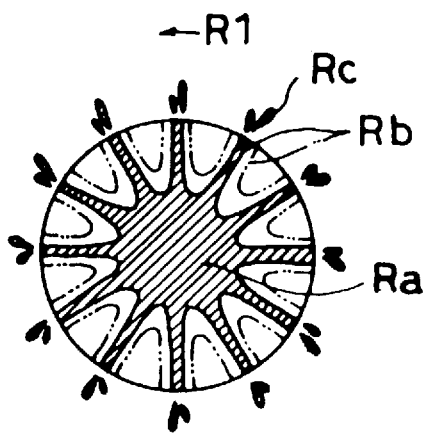
Figure 3D:
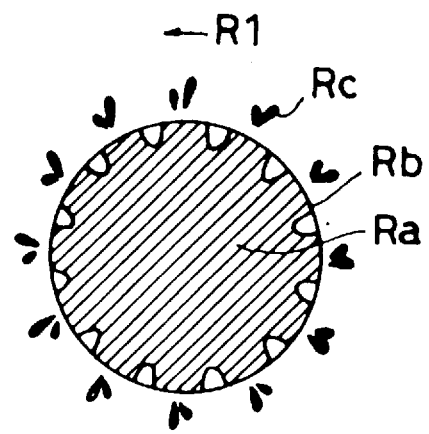
Figure 3E:
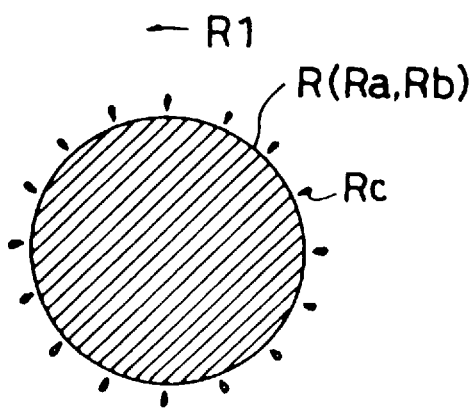
Figure 3F:
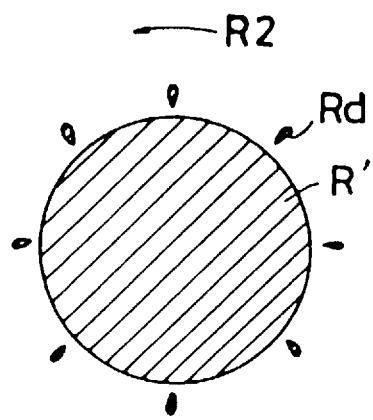

That is, by increasing the rotational frequency from low supplying rotational frequency R3 to high target rotational frequency R4, the fingers Rb are subjected to a force of inertia due to an acceleration occurring in the course of increase in the rotational frequency as well as the centrifugal force generated by the spin. The resultant force causes the fingers Rb, which would otherwise grow linearly toward the edge of wafer W (as shown in the solid lines and two-dot-and-dash lines in FIG. 7), to grow in directions curved circumferentially, thereby enlarging widths thereof (the dotted lines in FIG. 7). The diameter of the core Ra increases also. With this action, the spaces between the fingers Rb diminish rapidly, to reduce the time taken for the photoresist solution R to cover the entire surface of wafer W. As a result, a reduced quantity of photoresist solution R scatters to the ambient after flowing through the fingers Rb extending as shown in FIG. 3C.

In this way, the rotational frequency is increased with the predetermined acceleration while the photoresist solution is supplied. Preferably, this frequency increase is effected, as noted in the <Coating Solution Applying Method>, after the fingers Rb begin to develop from the core Ra (FIG. 3A) and before the fingers Rb reach the edge of wafer W (FIG. 3C). It has been found through experiment that, when the photoresist solution is supplied to a region around the spin center of 8-inch wafer W spinning at approximately 2,000 rpm, the fingers Rb reach the edge of wafer W within approximately 0.5 sec (hereinafter "reaching time") of delivery of the photoresist solution. In the time chart of the processing program shown in FIG. 26, therefore, time Ta (period from point of time $t_S$ of delivery or arrival of the photoresist solution to the point of time for increasing the rotational frequency toward target rotational frequency R4) must be set precisely within the above reaching time. In the prior art, start time lag $T_{DS}$ occurs from an instruction to start supplying the photoresist solution and the lag is variable. Consequently, the point of time $t_S$ in FIG. 26 is variable (delayed), so that time Ta cannot be set accurately. The variations in the time lag may result in varied shapes of the photoresist solution on the surface of wafer W at the time the rotational frequency is increased. Then, there would arise an inconvenience that the photoresist solution spreads unevenly over each wafer W.

According to the apparatus in the first and second embodiments, on the other hand, no variation occurs with the point of time $t_S$ at which the photoresist solution is delivered or the photoresist solution arrives at the surface of wafer W. The shape of the photoresist solution on the surface of wafer W is almost invariable when the acceleration is applied, thereby spreading the photoresist solution uniformly over each wafer W. That is, since the foregoing Coating Solution Applying Method is executed appropriately, a drastically reduced quantity of photoresist solution may be supplied to form a film of desired thickness, and the photoresist solution may be spread uniformly over each wafer.

In the above applying method, preferably, the controller 20a also executes a trigger signal output instruction (indicated by a solid line arrow in FIG. 26) to output a trigger signal to the I/O controller 53, when executing the spin accelerate instruction upon lapse of time Ta from the point of time $t_S$ at which the photoresist solution is delivered or the photoresist solution arrives at the surface of wafer W. Then, the CCD camera 30 picks up a still image of wafer W at this point of time, which is displayed on the monitor 59. This enables the operator to observe growth and bending of the fingers Rb and determine whether anything is mistimed or not. In the event of an abnormality found in the growth or bending of the fingers Rb which indicates a mistiming, the operator may manually stop the apparatus at once.

The time for executing the trigger signal output instruction to pick up an image of the surface of wafer W is not limited to the point of time noted above. This output instruction may be executed at a point of time at which the rotational frequency of wafer W has increased from supplying rotational frequency R3 to film-forming rotational frequency R4 (i.e. after time Tb from the spin accelerate instruction) as indicated by a dotted line arrow in FIG. 26, or at a point of time after detection of the photoresist solution by the delivery detecting sensor 6 or arrival detecting sensor 7 and before execution of the spin accelerate instruction. This modification also allows the operator to determine a mistiming as described above. Further, the trigger signal output instruction may be executed at any point of time between execution of the spin accelerate instruction and attainment of the predetermined target rotational frequency. A plurality of trigger signals may be outputted instead of one. For example, two trigger signals may be outputted to obtain two still pictures. In this case, the image memory 55 should have a capacity for storing at least two still pictures.

The apparatus in the first and second embodiments are capable of carrying out the processing program accurately by advancing execution of the supply start instruction and supply stop instruction based on the two time lags measured. These apparatus are suited for carrying out such a subtle coating program as the Coating Solution Applying Method which requires precise timing for supplying and stopping the coating solution.

The apparatus in the first embodiment (FIG. 10) employs, as the delivery detecting device, the delivery detecting sensor 6 including the light projector 6b and light receiver 6c. The apparatus in the second embodiment (FIG. 19) employs, as the arrival detecting device, the arrival detecting sensor 7 including the light projector 7b and light receiver 7c. Instead, the delivery or arrival detecting device may have a CCD camera for detecting supply of the photoresist solution to the surface of wafer W. Further, the delivery or arrival detecting device may be disposed adjacent the opening of the scatter preventive cup 4a instead of being attached to the tip portion of the coating solution supply nozzle 5.

Third Embodiment

Figure 27:
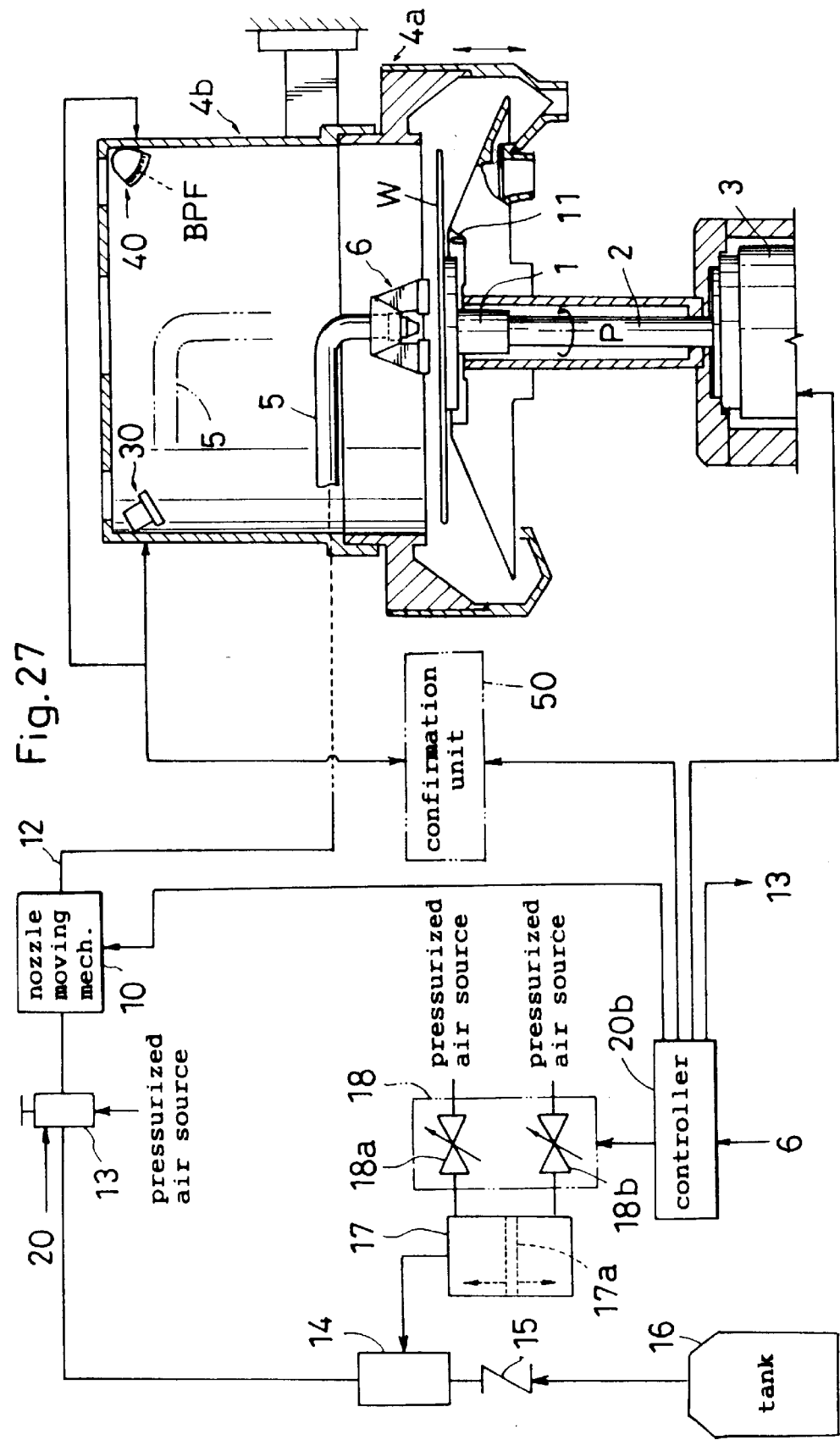
FIG. 27 is a block diagram and vertical sectional view showing an outline of a substrate spin coating apparatus in a third embodiment of the present invention.

FIG. 27 is a block diagram and vertical section showing an outline of a substrate spin coating apparatus which is one example of the coating solution applying apparatus according to the present invention. Like reference numerals are used to identify like elements in the first and second embodiments, which will not particularly be described again.

Reference numeral 1 in FIG. 27 denotes a suction type spin chuck attached to a rotary shaft 2 which is rotatable by an electric motor 3. A wafer W suction-supported by the spin chuck 1 is spun in a substantially horizontal posture about a spin center P. The electric motor 3 is operable under control of a controller 20b described hereinafter. The spin chuck 1, rotary shaft 2 and electric motor 3 constitute the rotary supporting device of the present invention.

The spin chuck 1 is surrounded by a scatter preventive cup 4a. An upper lid 4b fixed to a frame of the apparatus extends over an upper opening of the scatter preventive cup 4a. When a transport mechanism, not shown, places untreated wafer W on the spin chuck 1 or removes treated wafer W from the spin chuck 1, a lift mechanism, not shown, lowers only the scatter preventive cup 4a away from the upper lid 4b, whereby the spin chuck 1 projects upward through the upper opening of the scatter preventive cup 4a. Alternatively, the upper lid 4b and rotary shaft 2 may be raised by a lift mechanism, not shown, relative to a fixed scatter preventive cup 4b.

A movable coating solution supply nozzle 5 is disposed outside the scatter preventive cup 4a. The supply nozzle 5 has a delivery detecting sensor 6 attached to a downwardly extending tip portion thereof. This delivery detecting sensor 6 is identical to the sensor employed in the first embodiment (see FIG. 11). That is, the sensor 6 includes a light projector 6b and a light receiver 6c attached to the tip portion of the supply nozzle 5 through a mounting element 6a. The light projector 6b and light receiver 6c are opposed to each other across the supply nozzle 5. Light projected from the light projector 6b enters the light receiver 6c. In this apparatus, for example, the delivery detecting sensor 6 outputs a detection signal which is turned on when the light is received. Thus, the detection signal is turned off when the photoresist solution is delivered through a discharge opening 5a of the supply nozzle 5. The detection signal is turned on when the photoresist solution ceases to be delivered through the discharge opening 5a of the supply nozzle 5. This delivery detecting sensor 6 corresponds to the delivery detecting device of the present invention.

The coating solution supply nozzle 5 is movable by a nozzle moving mechanism 10 between a supply position and a standby position. In the supply position, the discharge opening 5a of the nozzle 5, shown in FIG. 11, is located at a distance L upward from the surface of wafer W. The distance L is approximately 4 mm, for example. Preferably, this distance is adjusted according to the viscosity of the photoresist solution, size of wafer W and surface condition of wafer W, to avoid irregularities occurring when the photoresist solution dripped to the surface of wafer spreads over the entire surface. Further, back rinse nozzles 11 are arranged inside the scatter preventive cup 4a, below the wafer W and adjacent the spin center P. The back rinse nozzles 11 deliver a cleaning solution under control of the controller 20b, described hereinafter.

The coating solution supply nozzle 5 is connected through a supply pipe 12, a suckback valve 13, a bellows pump 14 and a check valve 15 to a coating solution tank 16 which store the photoresist solution. The suckback valve 13 is operable to slightly draw back part of the photoresist solution remaining in the tip portion of the supply nozzle 5 to prevent inadvertent dripping onto the wafer W and curing of the photoresist solution exposed from the discharge opening 5a. When pressurized air is exhausted therefrom, the suckback valve 13 becomes inoperative, i.e. cancels the action to draw the photoresist solution back from the supply nozzle 5. The operation of the suckback valve 13 is controlled by an electric signal outputted from the controller 20b. The suckback valve 13 performs the suckback action with an adjustable pressure. Thus, operating speeds of the suckback valve 13 in drawing back the photoresist solution and in canceling the action after input of the electric signal are variable with the degree of pressure adjustment and the pressure of a pressurized air source.

The bellows pump 14 is operable by a double-acting air cylinder 17 to cause the photoresist solution to flow from the coating solution tank 16 into the supply pipe 12. The check valve 15 prevents the photoresist solution from flowing back to the tank 16 during the above feeding operation. The double-acting air cylinder 17 is operable by pressurized air supplied from the pressurized air source through a speed control valve assembly 18. The valve assembly 18 includes speed control valves 18a and 18b for supplying and exhausting the pressurized air to/from the two spaces partitioned by a piston 17a. The valve assembly 18 is manually adjustable to adjust flow rates of pressurized air supplied from the pressurized air source and exhausted from the air cylinder 17. The operating speed of the air cylinder 17 is variable with the degree of pressure adjustment and the pressures of the pressurized air source. This results in an adjustment of operation of the bellows pump 14, the speed of its operation to supply or stop the photoresist solution from the supply nozzle 5. The supply nozzle 5, supply pipe 12, bellows pump 14, check valve 15, coating solution tank 16, double-acting air cylinder 17 and speed control valve assembly 18 constitute the coating solution supplying device of this invention.

The speed control valve assembly 18 is operable by an electric signal from the controller 20b to feed pressurized air from the pressurized air source to the double-acting air cylinder 17, and is made inoperative by the electric signal to exhaust the pressurized air from the air cylinder 17. The controller 20b includes a clock, timer and RAM not shown. The RAM stores the processing program and the like prepared in advance. This processing program is executed based on the clock and timer. The processing program includes a supply start instruction for delivering the photoresist solution through the supply nozzle 5. After execution of this supply start instruction, subsequent instructions are executed following output of a "delivery detection signal" from the delivery detecting sensor 6 as described in detail hereinafter. The controller 20b corresponds to the control device of this invention.

The upper lid 4b includes a CCD camera 30 attached to a left inner periphery thereof, and a strobe 40 attached to a right inner periphery. The CCD camera 30 includes a CCD acting as a solid-state image sensor, an electronic shutter and a lens, and its field of view covers a region around the spin center of wafer W including a spacing between the discharge opening 5a of the coating solution supply nozzle 5 and the surface of wafer W, i.e. including a position in which the photoresist solution delivered from the supply nozzle 5 reaches the wafer W. It appears from FIG. 27 as if a horizontally extending portion of the supply nozzle 5 blocked the view of the region around the spin center of wafer W. However, the CCD camera 30 and the supply nozzle 5 are staggered sideways from each other to enable imaging of the region around the spin center including the above-mentioned spacing. The strobe 40 is used to illuminate the wafer W for image pickup since the apparatus per se is installed in a dark-room to prevent exposure of the photoresist solution. The strobe 40 is, for example, a combination of a xenon lamp and a band-pass filter BPF which passes wavelengths of 500 nm and above. The CCD camera 30 and strobe 40 are connected to a confirmation unit 50. The strobe 40 may employ, instead of the xenon lamp, a high intensity infrared light emitting diode or an infrared light emitting diode array having spectral sensitivity to the infrared and adjacent regions. Then, the band-pass filter BPF may be omitted. The strobe 40 may be designed suitably according to the spectral sensitivity with respect to the photoresist solution supplied.

The confirmation unit 50 will be described with reference to FIG. 12.

The strobe 40 is continuously lit by a predetermined supply of power from a strobe power source 51. The CCD camera 30 is operable under control of a camera controller 52. An image pickup instruction is given to the camera controller 52 from an I/O controller 53 which receives a trigger signal from the controller 20b. Upon input of the trigger signal, the CCD camera 30 is operated to pick up an image of the wafer surface. Image signals of the wafer surface are transmitted through the camera controller 52 and I/O controller 53 to an image processor 54 to be stored as a still picture in an image memory 55. The strobe 40 may be lit intermittently rather than continuously, by the strobe power source 51 supplying power to the strobe 40 only for appropriate periods of time to pick up the images of wafer surfaces. Preferably, the CCD camera 30 has a field of view determined by taking the speed of this image processing into account.

The image processor 54 outputs the still picture in the image memory 55 to a monitor 59 through I/O controller 53. The operator observes the still picture displayed on the monitor 49, and decides whether the coating process is conducted properly or not. An unsatisfactory still picture indicates that operations of the various components are mistimed. Then, the operator can manually stop the operation of the apparatus. In this way, an improper coating process is precluded from being applied to all succeeding wafers.

Figure 16:
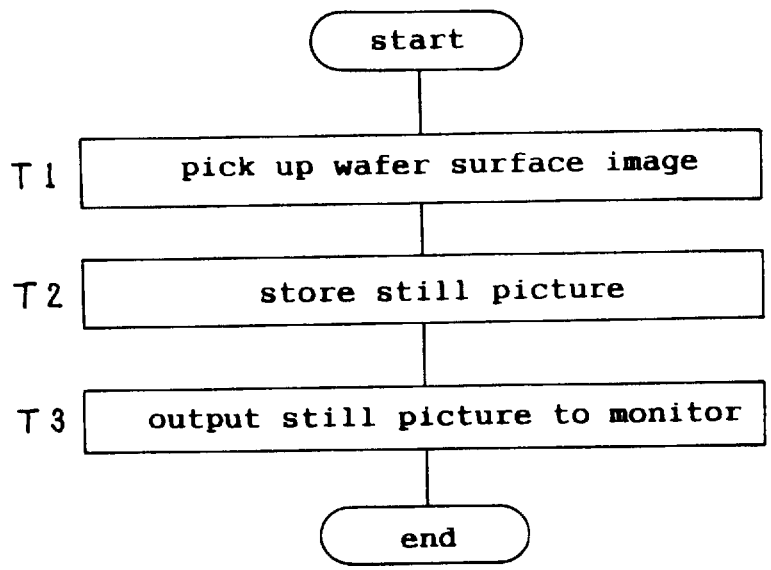
FIG. 16 is a flow chart showing an operation of the confirmation unit based on a trigger signal.
Figure 28:
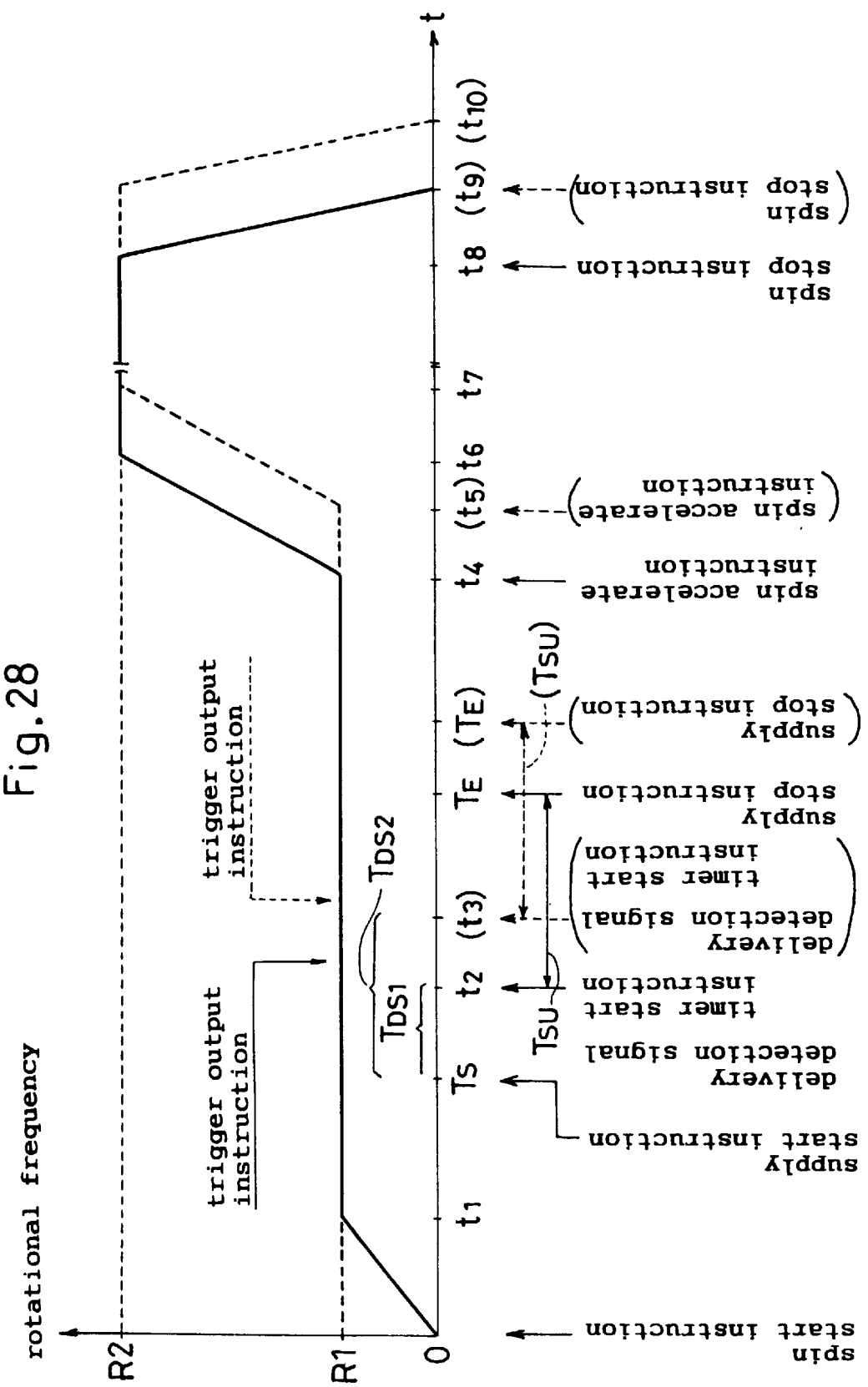
FIG. 28 is a time chart showing a coating process.
Figure 29:
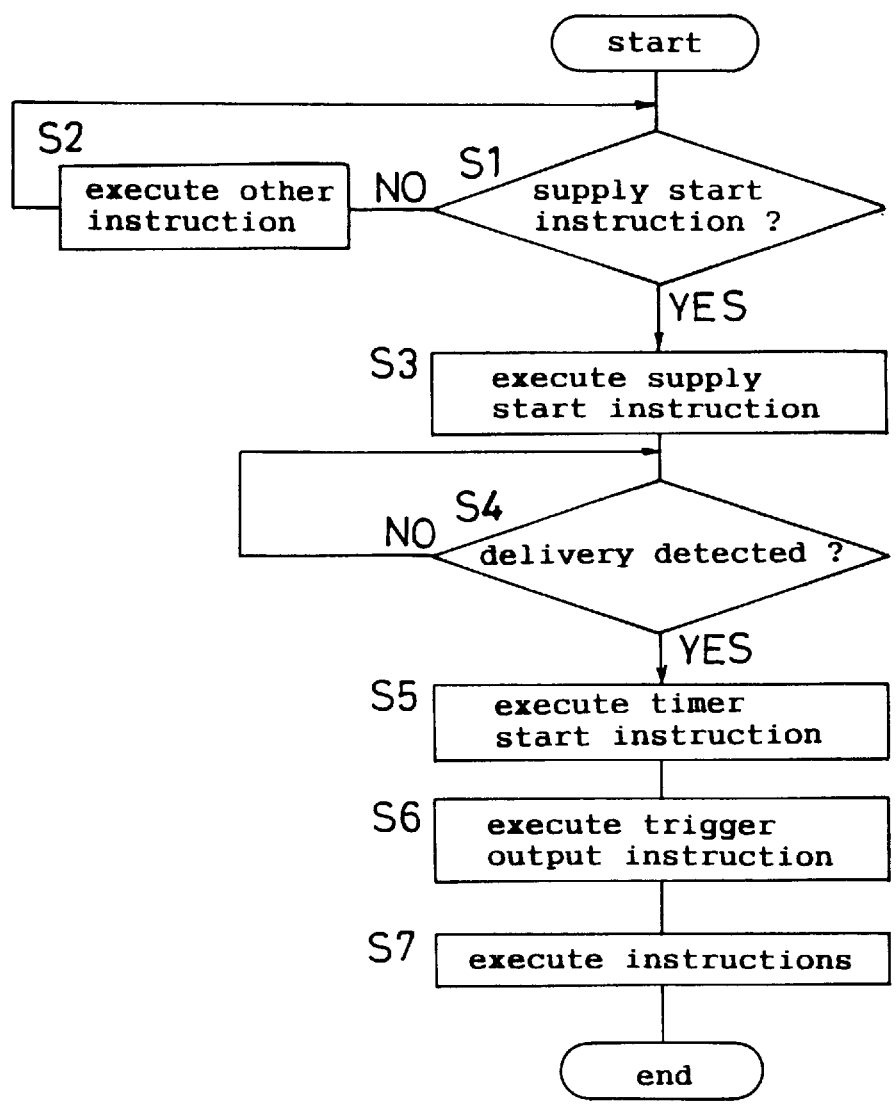
FIG. 29 is a flow chart showing an operation of a controller.

Next, a process carried out by the above apparatus for coating wafer W with the photoresist solution will be described with reference to the time chart shown in FIG. 28 and the flow charts shown in FIGS. 16 and 29. The time chart of FIG. 28 shows a coating process. The flow chart of FIG. 29 shows operation of the controller 20$b$. The flow chart of FIG. 16 shows operation of the confirmation unit 50. It is assumed that wafer W to be coated is already placed on the spin chuck 1 by the substrate transport mechanism not shown, and is suction-supported by the spin chuck 1. It is further assumed that the coating solution supply nozzle 5 has been moved to the supply position by the nozzle moving mechanism 10 (as shown in solid lines in FIG. 27), with the delivery opening 5$a$ situated at distance L above the spin center P of wafer W.

The coating process based on this processing program has the following basic sequence.

Upon execution of a spin start instruction in the processing program prepared for this purpose, wafer W is spun with an acceleration to reach predetermined supplying rotational frequency R1 (e.g. 1,000 rpm) at a point of time t1. At a point of time $T_S$, a supply start instruction is executed to start delivering the photoresist solution in a predetermined quantity. At a point of time t2 at which the photoresist solution is delivered from the discharge opening 5$a$ of the supply nozzle 5, a timer start instruction is executed to measure a period of time from point of time t2. At a point of time $T_E$ when the photoresist solution has been supplied for a period of time $T_{SU}$, a supply stop instruction is executed to stop supplying the photoresist solution. At a point of time t4, a spin accelerate instruction is executed to accelerate the spin of wafer W to attain film-forming rotational frequency R2 (e.g. 3,000 rpm) at a point of time t6. At a point of time t8, a spin stop instruction is executed to end the coating process at a point of time t9.

It is preferable to add an instruction to the above process to deliver a cleaning solution from the back rinse nozzles 11 shown in FIG. 27, in order to remove unwanted part of the photoresist solution scattering in mist from the edge of wafer W and adhering to the back side surface of wafer W or flowing round the edge to the back side surface of wafer W to adhere thereto.

The above processing program further includes a trigger signal output instruction executed upon lapse of a predetermined period of time from point of time t2 at which the "delivery detection signal" is outputted. Then, a trigger signal is outputted to the I/O controller 53 for picking up an image of the field of view noted hereinbefore.

Step S1 (supply start instruction?):

In successively executing a plurality of instructions included in the processing program, the controller 20$b$ determines whether or not each instruction is a supply start instruction for delivering the photoresist solution from the coating solution supply nozzle 5, and chooses a process based on the result.

S2 (execution of instruction):

As shown in the time chart of FIG. 28, the first instruction executed is a spin start instruction for starting a spin of wafer W. The controller 20$b$ executes this instruction at the time origin, and controls the spin to become supplying rotational frequency R1 at point of time t1. Then, the controller 20$b$ executes step S1 again.

Step S3 (execution of supply start instruction):

As shown in the time chart of FIG. 28, the next instruction is a supply start instruction for starting delivery of the photoresist solution from the supply nozzle 5. The process is branched from step S1 to step S3 to execute the supply start instruction for starting delivery of the photoresist solution from the supply nozzle 5.

When the supply start instruction is executed at point of time $T_S$, the photoresist solution is delivered from the supply nozzle 5 as follows.

First, the suckback valve 13 is closed to cancel the suction applied to the supply nozzle 5, and one of the valves 18$a$ of the speed control valve assembly 18 also is closed while the other valve 18$b$ is opened. Consequently, the double-acting air cylinder 17 becomes operative to actuate the bellows pump 14 to feed a fixed quantity of photoresist solution from the coating solution tank 16 into the supply pipe 12. With this series of operations, the photoresist solution begins to be delivered from the discharge opening 5$a$ of the supply nozzle 5. The valves 18$a$ and 18$b$ of the speed control valve assembly 18 are alternately closed and opened. The piston 17$a$ of the air cylinder 17 is thereby raised and lowered to drive the bellows pump 14 repeatedly to deliver the photoresist solution in the predetermined quantity through the supply nozzle 5 each time. In this way, the photoresist solution is delivered by successively operating the different components after execution of the supply start instruction. Thus, the photoresist solution is not immediately delivered from the discharge opening 5$a$ of the supply nozzle 5 at point of time $T_S$ of execution of the supply start instruction. The photoresist solution is actually delivered from the discharge opening 5$a$ with a certain time lag (start time lag). This start time lag is variable with use situations of the pressurized air source. Here, description will be made assuming the above start time lag to be $T_{DS1}$.

Step S4 (delivery detected?):

After the supply start instruction is executed at step S3 for delivering the photoresist solution, step S4 is repeatedly executed until the delivery detecting sensor 6 outputs the "delivery detection signal" to the controller 20$b$. That is, execution of the next instruction is suspended until the photoresist solution is delivered from the discharge opening 5$a$. As noted above, the photoresist solution is delivered from the discharge opening 5$a$ with start time lag $T_{DS1}$ from point of time $T_S$ at which the supply start instruction is executed. Step S4 is repeated during this period.

When the delivery detecting sensor 6 outputs the "delivery detection signal" to the controller 20$b$, the repetition of step S4 is terminated to execute step S5.

Step S5 (execution of timer start instruction):

The controller 20$b$ executes a timer start instruction at point of time t2 in response to the "delivery detection signal". The timer start instruction is an instruction for resetting and starting the internal timer, not shown, of the controller 20b to count supplying period $T_{SU}$ set to the processing program in advance.

Step S6 (execution of trigger signal output instruction):

The controller 20b executes the trigger signal output instruction upon lapse of a predetermined time after the timer start instruction is executed at point of time t2. Upon the trigger signal output instruction, the controller 20b outputs the trigger signal for causing the I/O controller 53 of the confirmation unit 50 to pick up an image of the surface of wafer W. The operation of the confirmation 50 to which the trigger signal is inputted will be described hereinafter.

Step S7 (execution of instructions):

After the above instructions, subsequent instructions are executed successively.

In the time chart shown in FIG. 28, a supply stop instruction is executed at point of time $T_E$ at which the internal timer, not shown, reaches a count corresponding to the supplying period $T_{SU}$. Subsequently, at point of time t4, a spin accelerate instruction is executed to increase the rotational frequency of wafer W from supplying rotational frequency R1 to film-forming rotational frequency R2. At point of time t8, a spin stop instruction is executed.

When the supply stop instruction is executed at point of time $T_E$, the delivery of the photoresist solution is stopped as follows.

First, the alternate opening and closing of the two speed control valves 18a and 18b are stopped to place the air cylinder 17 in inoperative state, thereby to stop the supply of the photoresist solution. At the same time, the suckback valve 13 is opened to slightly draw the photoresist solution back from the tip portion of the supply nozzle 5. With this operation, the photoresist solution is stopped flowing from the coating solution tank 16 through the supply tube 12 and supply nozzle 5. As noted hereinbefore, when the photoresist solution is delivered, start time lag $T_{DS1}$ occurs from point of time $T_S$ at which the supply start instruction is executed. In the case of the supply stop instruction, the delivery of the photoresist solution is substantially completely stopped at the point of time at which the two speed control valves 18a and 18b are placed in inoperative state. This brings about a delay (stop time lag) which is much shorter than the start time lag $T_{DS1}$, and may be disregarded.

As described above, the timer start instruction next to the supply start instruction is executed in response to the delivery of the photoresist solution. Thus, the execution timing of the instructions following the supply start instruction may be made dependent on the point of time at which the photoresist solution is delivered. It is therefore possible to absorb start time lag $T_{DS1}$ from execution of the supply start instruction to actual delivery of the photoresist solution through the supply nozzle 5, thereby to fix the photoresist solution supplying period $T_{SU}$.

At the point of time at which step S6 in FIG. 29 is executed, i.e. execution of the trigger signal output signal, the confirmation unit 50 operates as in the first embodiment (flow chart of FIG. 16).

That is, an image of the surface of wafer W is picked up at step T1, the image is stored as a still picture at step T2, and the still picture is outputted to the monitor at step T3.

In this way, an image of the surface of wafer W is picked up based on the "delivery detection signal", and the still picture thereof is outputted to the monitor 59. The operator observes the still picture, and decides whether the delivery is detected at a proper time or not. For example, the operator may readily discover an inconvenience of the "delivery detection signal" being outputted though the photoresist solution is not delivered from the discharge opening 5a of the supply nozzle 5, which is due to mist or part of the photoresist solution adhering to the light receiver 6c. In the event of such an inconvenience, the operator can manually stop the apparatus, thereby to preclude an improper coating process from being applied to all succeeding wafers.

A new wafer W is treated after completing the treatment of the above wafer W. This case will be described next. In the treatment of preceding wafer W, the photoresist solution is delivered with start time lag $T_{DS1}$ from point of time $T_S$ of execution of the supply start instruction. The treatment of new wafer W will be described on the assumption that the photoresist solution is delivered with start time lag $T_{DS2}$ larger than start time lag $T_{DS1}$ (see FIG. 28). This increase in the start time lag is due, for example, to an increase in the use of the pressurized air source by other apparatus, resulting in a pressure variation (drop). The instructions executed in the treatment of new wafer W at different times from those in the treatment of preceding wafer W are shown in parentheses and dotted line arrows in the time chart of FIG. 28.

In this case, although the supply start instruction is executed at the same point of time $T_S$ as in the preceding treatment, the start time lag is increased ($T_{DS2} > T_{DS1}$). Consequently, the "delivery detection signal" is inputted to the controller 20b at point of time t3 delayed by start time lag $T_{DS2}$. The timer start instruction is delayed correspondingly, and so is execution of the supply stop instruction (at point of time $T_E$). As a result, the interval from the point of time t3 at which the "delivery detection signal" is inputted to point of time $T_E$ for executing the supply stop instruction is the same as supplying period $T_{SU}$ in the preceding treatment. That is, the supplying period $T_{SU}$ is invariable for supplying the photoresist solution in the fixed quantity from the supply nozzle 5 to the wafer W. The same quantity of photoresist solution is supplied to each wafer W. Thus, even in the event of variations occurring in the start time lag due to pressure variations of the pressurized air source during successive treatment of a plurality of wafers, such variations are absorbed to fix the supplying period $T_{SU}$. When, for example, the operating speed of the speed control valve assembly 18 is adjusted, variations in the start time lag due to the adjustment may also be absorbed.

With a delay in execution of the supply stop instruction (at point of time $T_E$), as noted above, execution of the subsequent instructions will also be delayed. Specifically, as shown in the dotted lines in FIG. 28, the execution of the spin accelerate instruction is delayed from t4 to (t5), and the spin stop instruction from t8 to (t9). This results in the unchanged period of time from cessation of the photoresist supply to acceleration of the spin, to provide the same period of time for spreading the photoresist solution supplied at supplying rotational frequency R1 over the entire surface of wafer W. The time taken from the increase of rotational frequency to film-forming rotational frequency R2 to termination of the spin also remains the same, to provide the same period of time for scattering away a superfluous part of the photoresist solution spread over the entire surface of wafer W. As a result, the photoresist film may be formed in a uniform thickness on the respective wafers. Different lots or different wafers within a lot may be treated uniformly to assure steady treatment over a long period of time.

In the above apparatus, the delivery detecting device comprises an optical sensor. Instead, a CCD camera may be disposed adjacent the discharge opening 5a of the coating solution supply nozzle 5 to detect delivery of the photoresist solution.

An operation of the third embodiment in which the Coating Solution Applying Method described hereinbefore (FIG. 5) is employed will be described with reference to the time chart shown in FIG. 30.

The photoresist solution R behaves as shown in FIG. 3A through 3F when the photoresist solution R is supplied according to the processing program shown in the flow chart of FIG. 28. This results in a very low use efficiency of the photoresist solution as described hereinbefore.

Figure 30:
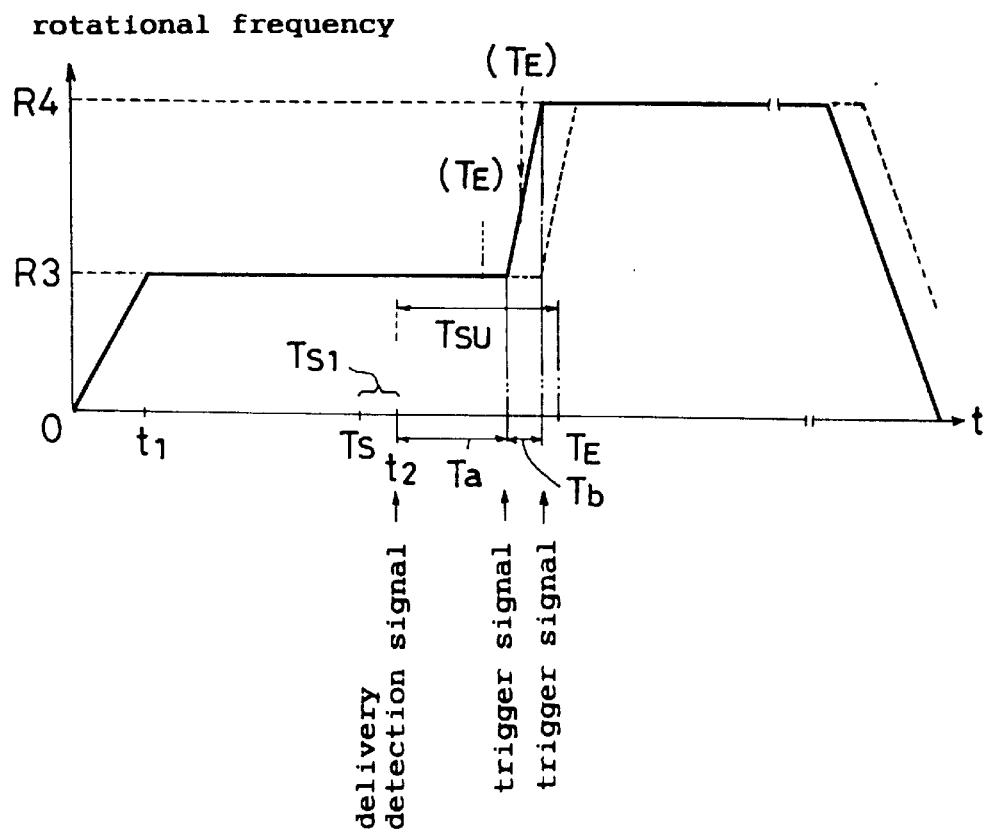
FIG. 30 is a time chart showing employment of the coating solution applying method according to the present invention.

Thus, as shown in FIG. 30, after lapse of start time lag $T_{DS1}$ from the point of time $T_S$ at which the supply start instruction is executed for supplying the photoresist solution R, i.e. after lapse of time Ta from the point of time $t_S$ at which the photoresist solution R is actually delivered from the discharge opening 5a of the supply nozzle 5, the controller 20b controls the electric motor 3 to switch the rotational frequency of wafer W from low supplying rotational frequency R3 to high target rotational frequency R4 (=film-forming rotational frequency) with a predetermined acceleration (to switch to a high-speed spin within a period of time Tb). As a result, the photoresist solution behaves as shown in FIGS. 6A through 6F. This behavior has already been described in the <Coating Solution Applying Method> and the second embodiment.

In this way, the rotational frequency is increased with the predetermined acceleration while the photoresist solution is supplied. Preferably, this frequency increase is effected, as described hereinbefore, after the fingers Rb begin to develop (FIG. 3A) and before the fingers Rb reach the edge of wafer W (FIG. 3C). As also noted hereinbefore, the fingers Rb reach the edge of wafer W within approximately 0.5 sec of delivery of the photoresist solution. In the time chart of the processing program shown in FIG. 30, therefore, time Ta (period from point of time t2 of delivery of the photoresist solution to the point of time for increasing the rotational frequency) must be set precisely within the above reaching time. In the prior art, a start time lag occurs from an instruction to start supplying the photoresist solution and this time lag is variable. Consequently, the point of time t2 in FIG. 30 is variable, so that time Ta cannot be set accurately. The variations in the time lag may result in varied shapes of the photoresist solution on the surface of wafer W at the time the rotational frequency is increased. Then, there would arise an inconvenience that the photoresist solution spreads unevenly over each wafer W.

According to the apparatus in the third embodiment, on the other hand, the subsequent instruction is executed upon output of the "delivery detection signal", as described hereinbefore, even if variations occur with the point of time t2 at which the photoresist solution is actually delivered. Time Ta is counted from point of time t2 at which the "delivery detection signal" is outputted, and the spin accelerate instruction is executed after time Ta. The shape of the photoresist solution on the surface of wafer W is invariable when the acceleration is applied, thereby spreading the photoresist solution uniformly over each wafer W. That is, since the foregoing Coating Solution Applying Method is executed appropriately, a drastically reduced quantity of photoresist solution may be supplied to form a film of desired thickness, and the photoresist solution may be spread uniformly over each wafer.

In the above applying method, the controller 20b may output a trigger signal to the I/O controller 53 at the point of time for executing the spin accelerate instruction in FIG. 30 (after lapse of time Ta from the "delivery detection signal"). Then, the CCD camera 30 picks up a still image of wafer W at this point of time, which is displayed on the monitor 59. This enables the operator to observe growth and bending of the fingers Rb and determine whether anything is mistimed or not. In the event of an abnormality found in the growth or bending of the fingers Rb which indicates a mistiming, the operator may manually stop the apparatus.

As shown in FIG. 30, a trigger signal may be outputted at a point of time at which the rotational frequency of wafer W has increased from supplying rotational frequency R3 to target rotational frequency R4 (=film-forming rotational frequency). This modification also allows the operator to determine a mistiming as described above. The preceding trigger signal and this trigger signal may both be outputted to obtain two still pictures. In this case, the image memory 55 should have a capacity for storing at least two still pictures.

In the processing program shown in the time chart of FIG. 30, the supply of the photoresist solution is stopped after the rotational frequency is increased from supplying rotational frequency R3 to target rotational frequency R4 (at point of time $T_E$). As shown in dotted line arrows and $T_E$ in parentheses, the rotational frequency may be increased to target rotational frequency R4 after the delivery of the photoresist solution is stopped, or the delivery of the photoresist solution may be stopped during the acceleration to target rotational frequency R4. That is, it is in accordance with this invention if the fingers Rb are bent circumferentially by the acceleration, which may be realized by varied processing programs. In this case, a trigger signal may be outputted at the point of time ($T_E$) for stopping the supply of the photoresist solution, at the point of time for starting the acceleration, at an appropriate time during the acceleration, or after completion of the acceleration.

Fourth Embodiment

FIG. 31 is a block diagram and vertical section showing an outline of a substrate spin coating apparatus which is one example of the coating solution applying apparatus according to this invention. Like reference numerals are used to identify like elements in the third embodiment shown in FIG. 27, which will not be described again.

The fourth embodiment differs from the third embodiment in detection of the photoresist solution. The apparatus in the fourth embodiment has no delivery detecting sensor 6 attached to the coating solution supply nozzle 5.

The mechanism for supplying the photoresist solution from the coating solution tank 16 to the wafer W through the supply nozzle 5 is the same as in the third embodiment. That is, there occurs a time lag (start time lag) from execution of the supply start instruction to actual arrival of the photoresist solution at the surface of wafer W. The controller 20b includes a clock, timer and RAM not shown. The RAM stores the processing program and the like prepared in advance. This processing program is executed based on the clock and timer. Though not particularly described here, after execution of the supply start instruction included in the processing program, subsequent instructions are executed following output of an "arrival detection signal" from an arrival detection/confirmation unit 50a described hereinafter. The controller 20b corresponds to the control device of this invention.

As in the third embodiment, the upper lid 4b includes a CCD camera 30 attached to a left inner periphery thereof, and a strobe 40 attached to a right inner periphery. The CCD camera 30 has a field of view covering a region around the spin center of wafer W, i.e. a region including a position in which the photoresist solution delivered from the supply nozzle 5 reaches the wafer W. The CCD camera 30 and the supply nozzle 5 are staggered sideways from each other to enable imaging of the region around the spin center. The strobe 40 is, for example, a combination of a xenon lamp and a band-pass filter BPF which passes wavelengths of 500 nm and above. The CCD camera 30 and strobe 40 are connected to the arrival detection/confirmation unit 50a.

The strobe 40 may employ a high intensity infrared light emitting diode or an infrared light emitting diode array having spectral sensitivity to the infrared and adjacent regions. Then, the band-pass filter BPF may be omitted. The strobe 40 may be designed suitably according to the spectral sensitivity with respect to the photoresist solution supplied.

Figure 32:
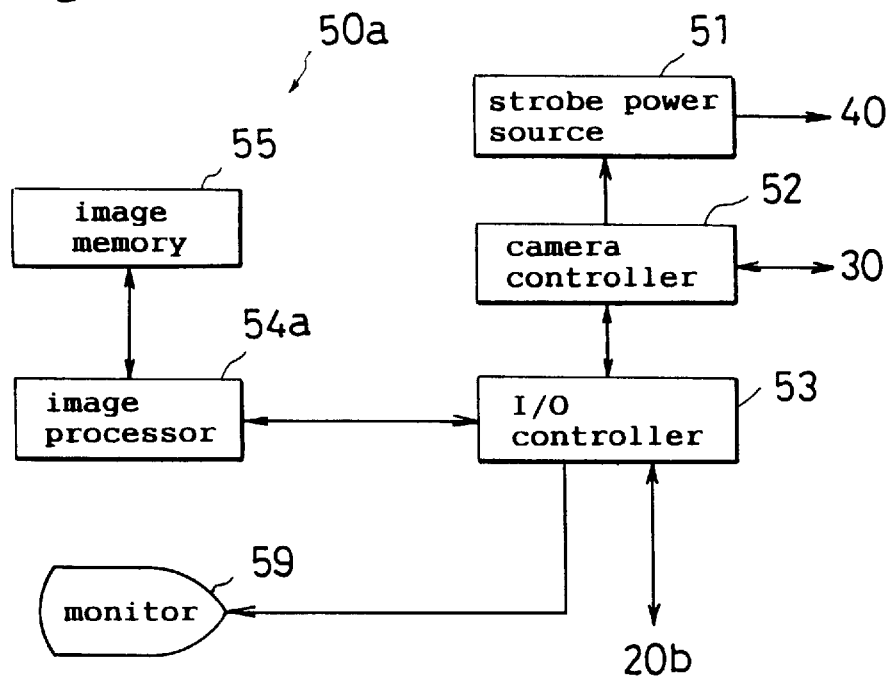
FIG. 32 is a block diagram of an arrival detection/confirmation unit.

The arrival detection/confirmation unit 50a will be described with reference to FIG. 32.

The strobe 40 is continuously lit by a predetermined supply of power from a strobe power source 51. The operation of CCD camera 30, e.g. operation of an electronic shutter to determine image pickup timing, is controlled by a camera controller 52. An image pickup instruction is given to the camera controller 52 from an I/O controller 53 which receives trigger signals from the controller 20b. The trigger signals include a "reference trigger signal" for picking up a reference still image" and a "normal trigger signal" for successively picking up images at predetermined intervals of time.

Upon input of the reference trigger signal, the CCD camera 30 is operated to pick up a reference image of the wafer surface at the point of time of its input. When the normal trigger signal is inputted, the CCD camera is operated to pick up images successively at the predetermined intervals from the point of time of its input. Image signals of the wafer surface resulting from the reference trigger signal are transmitted through the camera controller 52 and I/O controller 53 to an image processor 54a where the image signals are digitized to be stored as a reference still picture in an image memory 55. Image signals of the wafer surface successively obtained based on the normal trigger signal are similarly transmitted to the image processor 54a where the image signals are digitized to be stored as still pictures in the image memory 55. The strobe 40 may be lit intermittently rather than continuously, by the strobe power source 51 supplying power to the strobe 40 only for appropriate periods of time to pick up the images of wafer surfaces.

Based on a density variation between reference still picture and other still picture stored in the image memory 55, the image processor 54a determines that the photoresist solution has arrived at the wafer W when a variation is detected, and outputs the "arrival detection signal" through I/O controller 53 to the controller 20b. Various techniques are conceivable for determining arrival based on density level. For example, "1" in respective binary data may be counted to determine arrival when a difference between counts reaches a predetermined value. Preferably, the CCD camera 30 has a field of view determined by taking the speed of this image processing and the predetermined image pickup intervals into account.

After outputting the "arrival detection signal" through I/O controller 53 to the controller 20b, the image processor 54 outputs the still picture in the image memory 55 reflecting the arrival of the photoresist solution at the wafer W, to a monitor 59 through I/O controller 53. The operator observes the still picture displayed on the monitor 49, and decides whether the coating process is conducted properly or not. If the still picture is defective, the operator can manually stop the operation of the apparatus. In this way, an improper coating process is precluded from being applied to all succeeding wafers.

The above CCD camera 30 and arrival detection/ confirmation unit 50a constitute the arrival detecting device of this invention. The CCD camera 30 corresponds to the image pickup device. The image processor 54a corresponds to the image fetching device and density determining device.

Next, a process carried out by the above apparatus for coating wafer W with the photoresist solution will be described with reference to the time chart shown in FIG. 33.

It is assumed that wafer W to be coated is already placed on the spin chuck 1 by the substrate transport mechanism not shown, and is suction-supported by the spin chuck 1. It is further assumed that the coating solution supply nozzle 5 has been moved to the supply position by the nozzle moving mechanism 10 (as shown in solid lines in FIG. 31), with the discharge opening 5a situated at distance L above the spin center P of wafer W (FIG. 20).

The coating process based on this processing program has the following basic sequence.

Upon execution of a spin start instruction in the processing program prepared for this purpose, wafer W is spun with an acceleration to reach predetermined supplying rotational frequency R1 (e.g. 1,000 rpm) at a point of time t1. At a point of time $T_S$, a supply start instruction is executed to start supplying the photoresist solution in a predetermined quantity. At a point of time t2 at which arrival of the photoresist solution at the surface of wafer W is detected, a timer start instruction is executed to measure a period of time from point of time t2. At a point of time $T_E$ when the photoresist solution has been supplied for a period $T_{SU}$, a supply stop instruction is executed to stop supplying the photoresist solution. At a point of time t4, a spin accelerate instruction is executed to accelerate the spin of wafer W to attain film-forming rotational frequency R2 (e.g. 3,000 rpm) at a point of time t6. At a point of time t8, a spin stop instruction is executed to end the coating process at a point of time t9.

It is preferable to add an instruction to the above process to deliver a cleaning solution from the back rinse nozzles 11 shown in FIG. 31, in order to remove unwanted part of the photoresist solution scattering in mist from the edge of wafer W and adhering to the back side surface of wafer W or flowing round the edge to the back side surface of wafer W to adhere thereto.

The above processing program further includes a reference trigger signal output instruction for outputting the "reference trigger signal" to I/O controller 53 to pick up a reference still image. This instruction is executed at point of time Tp between point of time t1 at which the rotational frequency of wafer W reaches supplying rotational frequency R1 and point of time for executing the supply start instruction to start supplying the photoresist solution. The processing program further includes a normal trigger signal output instruction for outputting the "normal trigger signal" to I/O controller 53 to pick up still images at the predetermined intervals. This instruction is executed at point of time $T_S$ simultaneously with the supply start instruction.

Figure 34:
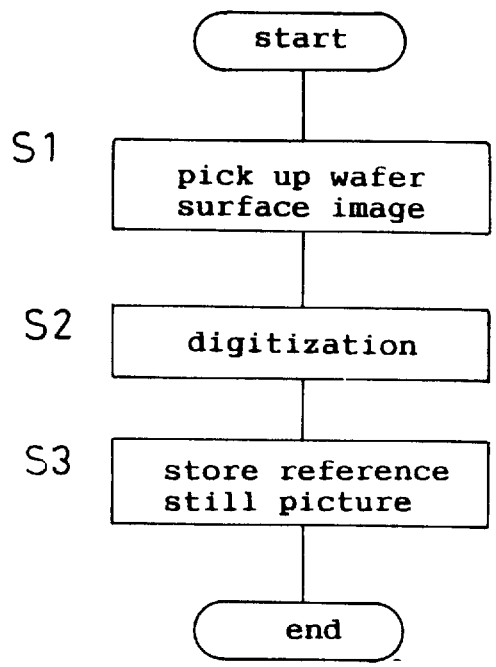
FIG. 34 is a flow chart showing an operation of the arrival detection/confirmation unit based on a reference trigger signal.

Upon execution of the reference trigger signal output instruction at point of time Tp, the arrival detection/ confirmation unit 50a operates as shown in the flow chart of FIG. 34.

Step S1 (pick up image of wafer surface):

The I/O controller 53 causes CCD camera 30 through the camera controller 52 to pick up an image of the region around the spin center of wafer W. Resultant image signals are transmitted through I/O controller 53 to the image processor 54a.

Step S2 (digitization):

The image signals transmitted to the image processor 54a are digitized by an appropriate technique to form a still picture. In this digitizing process, for example, "0" is assigned to surface portions of wafer W having high reflectance, i.e. portions whose image signals have intensity levels exceeding a predetermined vale (whitish regions), and "1" is assigned to surface portions of signal intensity levels not exceeding the predetermined level (dark regions).

Step S3 (store reference still picture):

The digitized still picture is stored as a reference still picture in the image memory 55. This reference still picture is compared with still pictures obtained subsequently. It is therefore preferable to pick up images of wafer W synchronously with rotation of the electric motor 3, so that wafer W always is at a particular angle of rotation to be in the same orientation as seen from CCD camera 30. Generally, the surface of wafer W has minute irregularities formed thereon through varied processes. Depending on angles of rotation of the wafer, such level differences may cause an irregular reflection of the light emitted from the strobe 40. In the digitizing process, "1" could be assigned to regions causing the irregular reflection. Thus, the subsequent still images may be picked up of the surface of wafer W at the same particular angle of rotation as when the reference still image is picked up. This effectively avoids an error in arrival detection due to such irregular reflection.

When the supply start instruction is executed at point of time $T_S$, the photoresist solution is supplied to the wafer W as follows.

First, the suckback valve 13 is closed to cancel the suction applied to the supply nozzle 5, and one of the valves 18a of the speed control valve assembly 18 also is closed while the other valve 18b is opened. Consequently, the doubleacting air cylinder 17 becomes operative to actuate the bellows pump 14 to feed a fixed quantity of photoresist solution from the coating solution tank 16 into the supply pipe 12. With this series of operations, the photoresist solution begins to be supplied to the wafer W from the discharge opening 5a of the supply nozzle 5. The valves 18a and 18b of the speed control valve assembly 18 are alternately closed and opened. The piston 17a of the air cylinder 17 is thereby raised and lowered to drive the bellows pump 14 repeatedly to supply the photoresist solution in the predetermined quantity through the supply nozzle 5 to the wafer W each time. In this way, the photoresist solution is supplied by successively operating the different components after execution of the supply start instruction. Because of this and because the discharge opening 5a of the supply nozzle 5 is spaced upward from the surface of wafer W by distance L, the photoresist solution does not arrive at the surface of wafer W at point of time $T_S$ of execution of the supply start instruction. The photoresist solution actually arrives at the surface of wafer W with a certain time lag. This start time lag is variable with use situations of the pressurized air source. Here, description will be made assuming the above start time lag to be $T_{DS1}$.

Simultaneously with execution of the above supply start instruction, the controller 20b executes the normal trigger signal output instruction. Upon execution of this instruction, the controller 20b outputs the normal trigger signal to I/O controller 53 of the arrival detection/confirmation unit 50a. In response to the normal trigger signal, I/O controller 53 instructs the camera controller 52 to pick up images of the surface of wafer W successively at the predetermined intervals of time. Preferably, each of the above intervals is much shorter than start time lag $T_{DS1}$. For example, the interval is in the order of 10 msec. while start time lag $T_{DS1}$ is 100 msec. After executing the supply start instruction (and normal trigger signal output instruction), the controller 20b is prohibited from executing subsequent instructions in the processing program. This state is maintained until the "arrival detection signal" is inputted to the controller 20b from the arrival detection/confirmation unit 50a.

Figure 35:
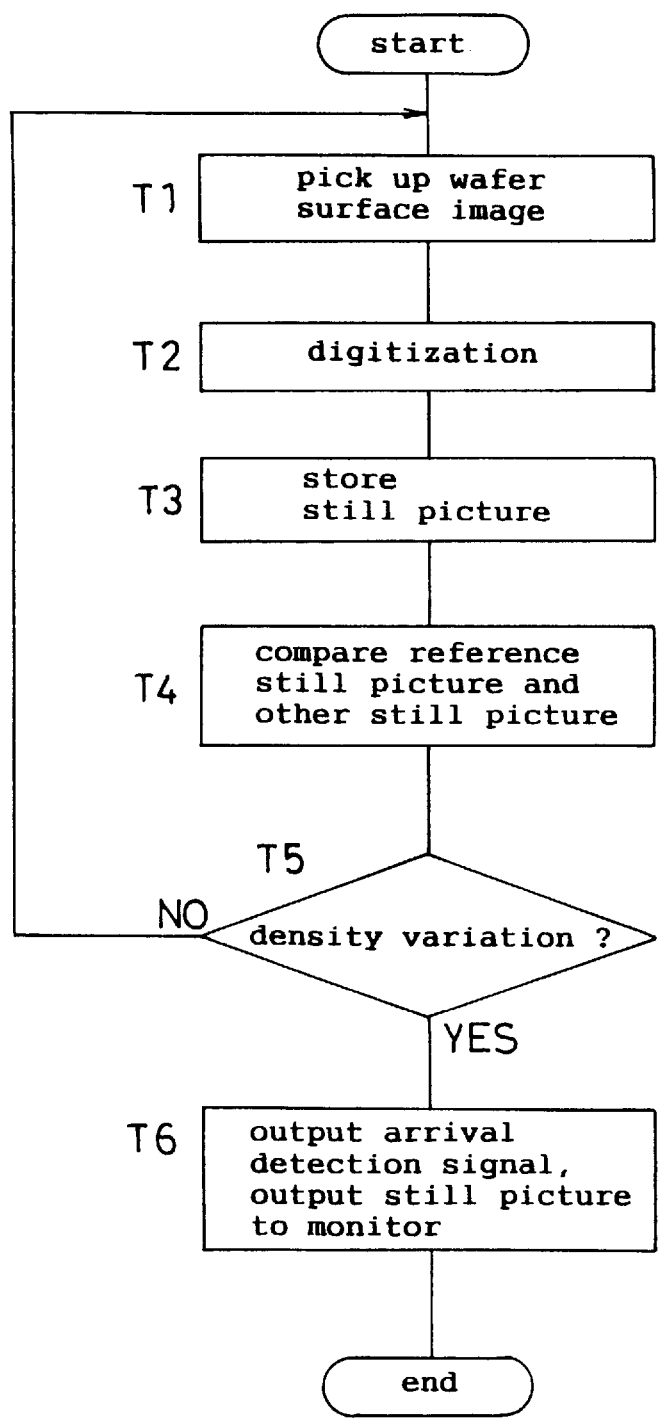
FIG. 35 is a flow chart showing an operation of the arrival detection/confirmation unit in response to a normal trigger signal.

An operation of the arrival detection/confirmation unit 50a based on the normal trigger signal output instruction will be described with reference to the flow chart of FIG. 35.

Step T1 (pick up images of wafer surface):

The I/O controller 53 causes CCD camera 30 through the camera controller 52 to pick up images of the region around the spin center of wafer W. For the reason noted hereinbefore, these images preferably are picked up with the same timing as the reference still image, i.e. when the wafer W is in the same orientation with respect to CCD camera 30 as when the reference image is picked up.

Step T2 (digitization):

The image processor 54a digitizes the image signals of the surface of wafer W as described above.

Step T3 (store still picture):

The digitized image signals are stored as a still picture in the image memory 55. Thus, at this point of time, the image memory 55 stores the reference still picture and this still picture. Still pictures obtained thereafter successively replaces an immediately preceding still picture in the image memory 55. Therefore, the storage capacity of image memory 55 may be sufficient if at least two images can be stored. Where the image memory 55 has a large capacity, still pictures may be successively stored therein without replacing the preceding pictures.

Step T4 (comparison between reference still picture and other still pictures):

The image processor 54a compares the reference still picture and other still picture stored in the image memory 55. Specifically, a comparison is made in density between the two pictures. There are various techniques for comparing densities of digitized images. For example, "1" in the reference and other still pictures may be counted for comparison. When a difference between the counts of "1" reaches a predetermined value, it is determined that a density variation has occurred, i.e. the photoresist solution has arrived at the surface of wafer W.

Step T5 (Density Variation?):

The process is divided according to results of the comparison in density made by the image processor 54a. In the absence of any variation, which indicates that the photoresist solution has not arrived at the surface of wafer W, the operation returns to step T1 to pick up an image of the surface of wafer W again. If a variation is found, this indicates that the photoresist solution has arrived at the surface of wafer W, and the operation moves to step T6. Each of the predetermined image pickup intervals noted hereinbefore corresponds to a period of execution from step T1 to step T5.

It is assumed here that, after repeating steps T1 through T5, a density variation is found at step T5, at point of time t2 with start time lag $T_{DS1}$ from point of time $T_S$ at which the supply start instruction is executed as shown in FIG. 33.

Step T6 (output arrival detection signal, and output still picture to monitor):

The image processor 54a outputs the "arrival detection signal" to the controller 20b through I/O controller 53, and reads the still picture from the image memory 55 and outputs the picture to the monitor 59 through I/O controller 53.

Upon receipt of the "arrival detection signal", the controller 20a executes a timer start instruction at the point of time T2 for resetting the timer and starting the counter, and executes the supply stop instruction at point of time $T_E$ at which supplying period $T_{SU}$ has elapsed. Then, the supply of the photoresist solution is stopped as follows.

First, the alternate opening and closing of the two speed control valves 18a and 18b are stopped to place the air cylinder 17 in inoperative state, thereby to stop the supply of the photoresist solution. At the same time, the suckback valve 13 is opened to slightly draw the photoresist solution back from the tip portion of the supply nozzle 5. With this operation, the photoresist solution is stopped flowing from the coating solution tank 16 through the supply tube 12 and supply nozzle 5. As noted hereinbefore, when the photoresist solution is supplied, start time lag $T_{DS1}$ occurs from point of time $T_S$ at which the supply start instruction is executed. In the case of the supply stop instruction, the supply of the photoresist solution is substantially completely stopped at the point of time at which the two speed control valves 18a and 18b are placed in inoperative state. This brings about a time lag which is much shorter than the start time lag $T_{DS1}$, and may be disregarded.

As described above, the timer start instruction next to the supply start instruction is executed in response to arrival of the photoresist solution at the surface of wafer W. Thus, the execution timing of the instructions following the supply start instruction may be made dependent on the point of time at which the photoresist solution arrives at the surface of wafer W. It is therefore possible to absorb start time lag $T_{DS1}$ from execution of the supply start instruction to actual arrival of the photoresist solution at the surface of wafer W, thereby to fix the photoresist solution supplying period $T_{SU}$.

The "arrival detection signal" is outputted, and the still picture is outputted to the monitor 59 through I/O controller 53. The operator observes the still picture, and determines whether the picture reflecting the arrival is proper or not. For example, the operator may readily discover an inconvenience of the "arrival detection signal" being outputted though the photoresist solution has not arrived at wafer W, which is due to mist adhering to a lens surface of CCD camera 30 disposed in the upper inner surface of the upper lid 4b. In the event of such an inconvenience, the operator can manually stop the apparatus at once, thereby to preclude an improper coating process from being applied to succeeding wafers.

A new wafer W is treated after completing the treatment of the above wafer W. This case will be described next. In the treatment of preceding wafer W, the photoresist solution arrives at the wafer start time lag $T_{DS1}$ from point of time $T_S$ of execution of the supply start instruction. The treatment of new wafer W will be described on the assumption that the photoresist solution is delivered with start time lag $T_{DS2}$ larger than start time lag $T_{DS1}$ (see FIG. 33). This increase in the start time lag is due, for example, to an increase in the use of the pressurized air source by other apparatus, resulting in a pressure variation (drop). The instructions executed in the treatment of new wafer W at different times from those in the treatment of preceding wafer W are shown in parentheses and dotted line arrows in the time chart of FIG. 33.

In this case, although the supply start instruction is executed at the same point of time $T_S$ as in the preceding treatment, the start time lag is increased ($T_{DS2}$>$T_{DS1}$). Consequently, the "arrival detection signal" is inputted to the controller 20b at point of time t3 delayed by start time lag $T_{DS2}$. The timer start instruction is delayed correspondingly, and so is execution of the supply stop instruction (at point of time $T_E$). As a result, the interval from the point of time t3 at which the "arrival detection signal" is inputted to point of time $T_E$ for executing the supply stop instruction is the same as supplying period $T_{SU}$ in the preceding treatment. That is, the supplying period $T_{SU}$ is invariable for supplying the photoresist solution in the fixed quantity from the supply nozzle 5 to the wafer W. The same quantity of photoresist solution is supplied to each wafer W. Thus, even in the event of variations occurring in the start time lag due to pressure variations of the pressurized air source during successive treatment of a plurality of wafers, such variations are absorbed to fix the supplying period. When, for example, the operating speed of the speed control valve assembly 18 is adjusted, variations in the start time lag due to the adjustment may also be absorbed.

With a delay in execution of the supply stop instruction (at point of time $T_E$), as noted above, execution of the subsequent instructions will also be delayed. Specifically, the execution of the spin accelerate instruction is delayed from t4 to (t5), and the spin stop instruction from t8 to (t9). This results in the unchanged period of time from cessation of the photoresist supply to acceleration of the spin, to provide the same period of time for spreading the photoresist solution supplied at supplying rotational frequency R1 over the entire surface of wafer W. The time taken from the increase of rotational frequency to film-forming rotational frequency R2 to termination of the spin also remains the same, to provide the same period of time for scattering away a superfluous part of the photoresist solution spread over the entire surface of wafer W. As a result, the photoresist film may be formed in a uniform thickness on the respective wafers. Different lots or different wafers within a lot may be treated uniformly to assure steady treatment over a long period of time.

In the above description, the reference trigger signal is outputted at point of time Tp before the photoresist solution is supplied, and the reference still picture is obtained from an image of the surface of wafer W picked up at this point of time. After point of time $T_S$, the normal trigger signals are successively outputted at the predetermined periods of time to pick up images of wafer W. The still pictures thereby obtained are compared with the reference still picture to detect arrival of the photoresist solution. However, the image pickup for providing the reference still picture may not be carried out at point of time Tp before the photoresist solution is supplied. In this case, a comparison is made between a still picture obtained by outputting a first (n−1th) normal trigger signal, and a still picture obtained by a second (nth) normal trigger signal, and arrival of the photoresist solution is detected based on a density variation between these pictures. That is, a comparison is made by using, as a reference still picture, the still picture obtained from an immediately preceding normal trigger signal outputted. This means that there is no reference still picture for the still picture resulting from the first normal trigger signal. However, no inconvenience will arise since the photoresist solution is unlikely to arrive at the wafer W at the point of time the first normal trigger signal is outputted along with execution of the supply start instruction, which is due to the start time lag.

In the apparatus described above, the images picked up by CCD camera 30 are used for detecting arrival of the photoresist solution. It is possible to use, instead, the arrival detecting sensor 7 as in the second embodiment shown in FIG. 20.

Figure 36:
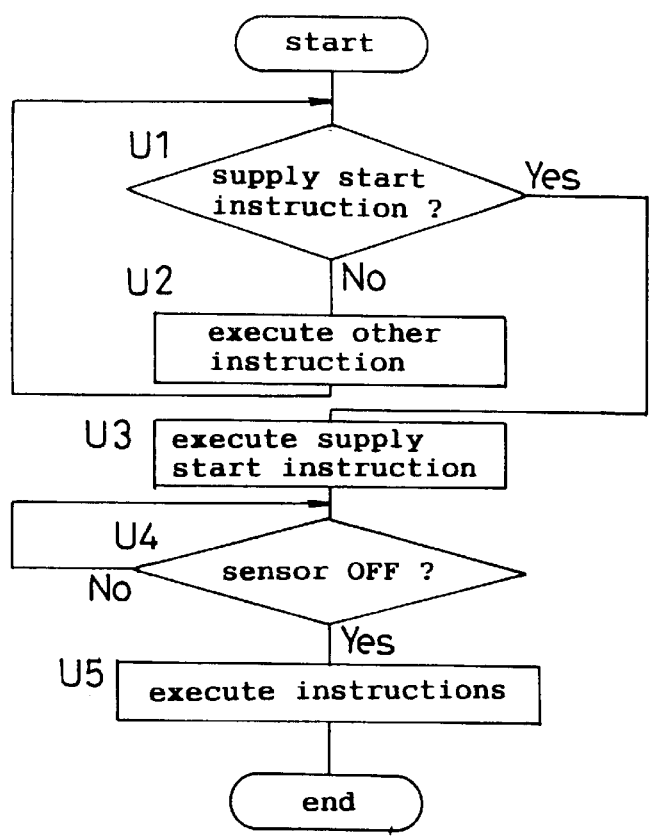
FIG. 36 is an outline flow chart showing execution of a process employing the arrival detecting sensor.

In this case, since the detection signal of the arrival detecting sensor 7 is turned on when light is received, the detection signal is turned off when the photoresist solution delivered from the discharge opening 5a of the supply nozzle 5 and traversing the distance L arrives at the surface of wafer W. The detection signal turned off is outputted to the controller 20b as the "arrival detection signal". The arrival detecting sensor 7 corresponds to the arrival detecting device of this invention.

Where the arrival detecting sensor 7 is employed for detecting arrival of the photoresist solution, the apparatus operates as shown in the flow chart of FIG. 36.

Step U1 is executed to determine whether the instruction is a supply start instruction or not. If it is not a supply start instruction, the instruction is executed (step U2). This instruction may be a spin start instruction, for example. On the other hand, if the instruction is a supply start instruction, this instruction is executed at step U3. Subsequent instructions are suspended while step U4 is repeated until the arrival detecting sensor 7 is turned off, i.e. until the arrival detecting sensor 7 outputs the "arrival detection signal" to the controller 20b. When the arrival detecting sensor 7 is found to be off at step U4, the operation moves to step U5 to execute subsequent instructions. In this way, the apparatus employing the arrival detecting sensor 7 produces the same effect.

Preferably, the controller 20b receives the "arrival detection signal" from the arrival detecting sensor 7, and outputs a trigger signal to I/O controller 53 to pick up an image of the surface of wafer W at this point of time. A still picture of the surface of wafer W at this point of time is outputted to the monitor 59. This allows the operator to determine whether or not the arrival detecting sensor 7 is operating properly to detect arrival of the photoresist solution.

Besides the foregoing construction, two CCD cameras 30 may be provided, one of which is used for detecting arrival of the photoresist solution, and the other for confirming the detection of arrival.

An operation of the fourth embodiment in which the Coating Solution Applying Method described hereinbefore (FIG. 5) is employed will be described with reference to the time chart shown in FIG. 37.

The photoresist solution R behaves as shown in FIGS. 3A through 3F when the photoresist solution R is supplied according to the processing program shown in the flow chart of FIG. 33. This results in a very low use efficiency of the photoresist solution as described hereinbefore.

Figure 37:
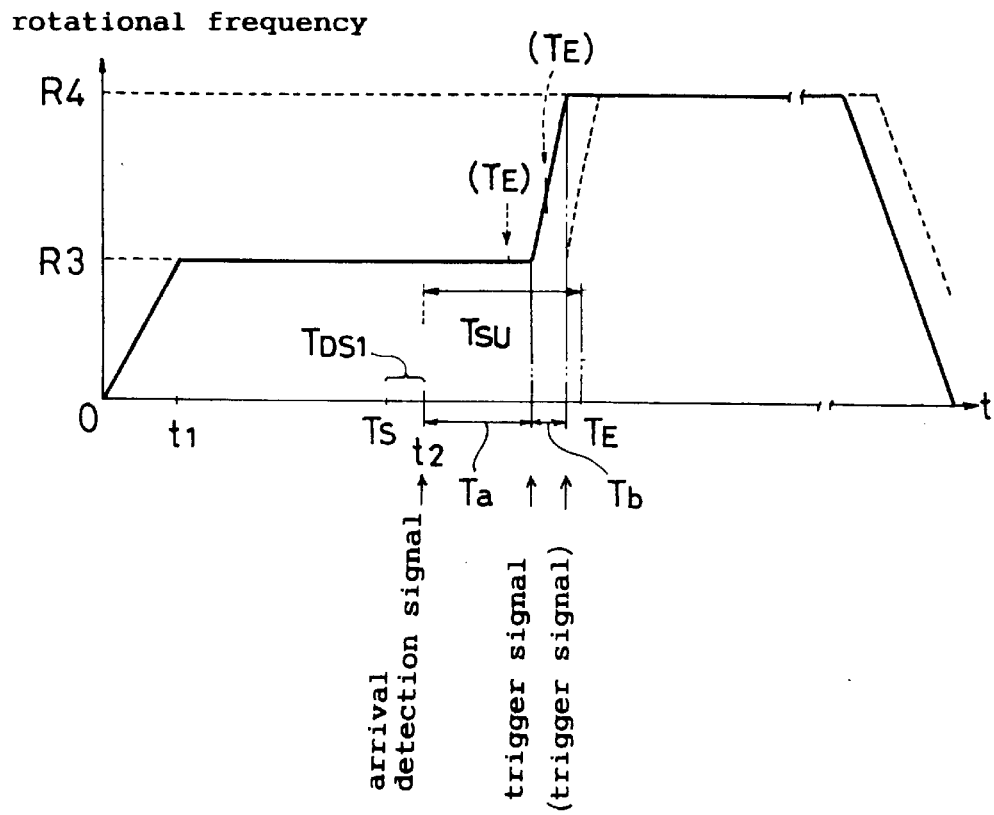
FIG. 37 is a time chart showing employment of the coating solution applying method according to this invention.

Thus, as shown in FIG. 37, after lapse of start time lag $T_{DS1}$ from the point of time $T_S$ at which the supply start instruction is executed for supplying the photoresist solution R, i.e. after lapse of time Ta from the point of time $t_S$ at which the photoresist solution R actually arrives at the surface of wafer W, the controller 20b controls the electric motor 3 to switch the rotational frequency of wafer W from low supplying rotational frequency R3 to high target rotational frequency R4 (=film-forming rotational frequency) with a predetermined acceleration (to switch to a high-speed spin within a period of time Tb). As a result, the photoresist solution behaves as shown in FIGS. 6A through 6F. This behavior has already been described.

In this way, the rotational frequency of wafer W is increased from supplying rotational frequency R3 to target rotational frequency R4 with the predetermined acceleration while the photoresist solution is supplied. Preferably, this frequency increase is effected after the fingers Rb begin to develop from the core Ra (FIG. 3A) and before the fingers Rb reach the edge of wafer W (FIG. 3C). As also noted hereinbefore, the fingers Rb reach the edge of wafer W within approximately 0.5 sec. In the time chart of the processing program shown in FIG. 37, therefore, time Ta (period from point of time t2 of arrival of the photoresist solution at the wafer surface to the point of time for increasing the rotational frequency to target rotational frequency R4) must be set precisely within the above reaching time. In the prior art, a start time lag occurs from an instruction to start supplying the photoresist solution and the time lag is variable. Consequently, the point of time t2 in FIG. 37 is variable, so that time Ta cannot be set accurately. The variations in the time lag may result in varied shapes of the photoresist solution on the surface of wafer W at the time the rotational frequency is increased. Then, there would arise an inconvenience that the photoresist solution spreads unevenly over each wafer W.

According to the apparatus in the fourth embodiment, on the other hand, subsequent instructions are executed upon output of the "arrival detection signal", as described hereinbefore, even if variations occur with the point of time t2 at which the photoresist solution arrives at the surface of wafer W. Time Ta is counted from point of time t2 at which the "arrival detection signal" is outputted, and the spin accelerate instruction is executed after time Ta. The shape of the photoresist solution on the surface of wafer W is invariable when the acceleration is applied, thereby spreading the photoresist solution uniformly over each wafer W. That is, since the foregoing Coating Solution Applying Method is executed appropriately, a drastically reduced quantity of photoresist solution may be supplied to form a film of desired thickness, and the photoresist solution may be spread uniformly over each wafer.

In the above applying method, the controller 20b may output a trigger signal to the I/O controller 53 at the point of time for executing the spin accelerate instruction in FIG. 37 (after lapse of time Ta from the "arrival detection signal"). Then, the CCD camera 30 picks up a still image of wafer W at this point of time, which is displayed on the monitor 59. This enables the operator to observe growth and bending of the fingers Rb and determine whether anything is mistimed or not. In the event of an abnormality found in the growth or bending of the fingers Rb which indicates a mistiming, the operator may manually stop the apparatus at once.

As indicated by "trigger signal" in parentheses in FIG. 37, a trigger signal may be outputted at a point of time at which the rotational frequency of wafer W has increased from supplying rotational frequency R3 to target rotational frequency R4. This modification also allows the operator to determine a mistiming as described above. The preceding trigger signal and this trigger signal may both be outputted to obtain two still pictures. In this case, the image memory 55 should have a capacity for storing at least two still pictures.

In the processing program shown in the time chart of FIG. 37, the supply of the photoresist solution is stopped after the rotational frequency is increased from supplying rotational frequency R3 to target rotational frequency R4 (at point of time $T_E$). As shown in dotted line arrows and $T_E$ in parentheses, the rotational frequency may be increased to target rotational frequency R4 after the delivery of the photoresist solution is stopped, or the delivery of the photoresist solution may be stopped during the acceleration to target rotational frequency R4. That is, it is in accordance with this invention if the fingers Rb are bent circumferentially by the acceleration, which may be realized by varied processing programs. In this case, a trigger signal may be outputted at the point of time ($T_E$) for stopping the supply of the photoresist solution, at the point of time for starting the acceleration, at an appropriate time during the acceleration, or after completion of the acceleration.

The first to fourth embodiments have been described, exemplifying the photoresist solution used as the coating solution. These apparatus produce the same effects where the coating solution is a solution of polyimide resin or SOG (Spin On Glass) used for surface protection or insulation.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method of applying a coating solution to spinning substrates, comprising the steps of:
   (a) operating control means to spin a substrate supported by rotary support means at a predetermined supplying rotational frequency;
   (b) supplying said coating solution through coating solution supply means to a central region of said substrate spinning at said supplying rotational frequency;
   (c) operating said control means to increase the rotational frequency of said substrate to a target rotational frequency higher than said supplying rotational frequency before said coating solution supplied to said substrate spreads over an entire surface of said substrate, in order to apply a force of inertia to rivulets of said coating solution extending radially from periphery of said coating solution; and
   (d) operating said control means to spin said substrate supported by said rotary support means at a predetermined film-forming rotational frequency, thereby coating said surface of said substrate with a film of a desired thickness.

2. A method as defined in claim 1, wherein the step of increasing the rotational frequency of said substrate to said target rotational frequency is initiated after a point of time at which radial flows of said coating solution begin to occur from edges of said coating solution supplied to said surface of said substrate and spread thereon in a circular shape in plan view, and before said radial flows reach edges of said substrate.

3. A method as defined in claim 2, wherein said target rotational frequency equals said film-forming rotational frequency.

4. A method as defined in claim 3, wherein the rotational frequency is increased from said supplying rotational frequency to said target rotational frequency with an acceleration of 7,500 to 50,000 rpm/sec.

5. A method as defined in claim 2, wherein said target rotational frequency is higher than said film-forming rotational frequency.

6. A method as defined in claim 5, wherein the rotational frequency is increased from said supplying rotational frequency to said target rotational frequency with an acceleration of 7,500 to 50,000 rpm/sec.

7. A method as defined in claim 2, wherein said target rotational frequency is lower than said film-forming rotational frequency.

8. A method as defined in claim 7, wherein the rotational frequency is increased from said supplying rotational frequency to said target rotational frequency with an acceleration of 7,500 to 50,000 rpm/sec.

9. A method as defined in claim 2, wherein the rotational frequency is increased from said supplying rotational frequency to said target rotational frequency with an acceleration of 7,500 to 50,000 rpm/sec.

10. A method as defined in claim 1, wherein said target rotational frequency equals said film-forming rotational frequency.

11. A method as defined in claim 10, wherein the rotational frequency is increased from said supplying rotational frequency to said target rotational frequency with an acceleration of 7,500 to 50,000 rpm/sec.

12. A method as defined in claim 1, wherein said target rotational frequency is higher than said film-forming rotational frequency.

13. A method as defined in claim 12, wherein the rotational frequency is increased from said supplying rotational frequency to said target rotational frequency with an acceleration of 7,500 to 50,000 rpm/sec.

14. A method as defined in claim 1, wherein said target rotational frequency is lower than said film-forming rotational frequency.

15. A method as defined in claim 14, wherein the rotational frequency is increased from said supplying rotational frequency to said target rotational frequency with an acceleration of 7,500 to 50,000 rpm/sec.

16. A method as defined in claim 1, wherein the rotational frequency is increased from said supplying rotational frequency to said target rotational frequency with an acceleration of 7,500 to 50,000 rpm/sec.

17. A method of applying a coating solution to spinning substrates, comprising the steps of:
   (a) operating a control device to spin a substrate, supported by a rotary support device, with a predetermined supplying rotational frequency;
   (b) supplying said coating solution through coating a solution supply device to a central region of said substrate spinning at said supplying rotational frequency;
   (c) operating said control device to increase the rotational frequency of said substrate to a target rotational frequency higher than said supplying rotational frequency before said coating solution supplied to said substrate spreads over an entire surface of said substrate, in order to apply a force of inertia to rivulets of said coating solution extending radially from periphery of said coating solution; and
   (d) operating control device to spin said substrate supported by said rotary support device at a predetermined film-forming rotational frequency, thereby coating said surface of said substrate with a film of desired thickness.

18. A method as defined in claim 17, wherein the step of increasing the rotational frequency of said substrate to said target rotational frequency is initiated after a point of time at which radial flows of said coating solution begin to occur from edges of said coating solution supplied to said surface of said substrate and spread thereon in a circular shape in plan view, and before said radial flows reach edges of said substrate.

19. A method as defined in claim 18, wherein said target rotational frequency equals said film-forming rotational frequency.

20. A method as defined in claim 18, wherein said target rotational frequency is higher than said film-forming rotational frequency.

21. A method as defined in claim 17, wherein said target rotational frequency equals said film-forming rotational frequency.

22. A method as defined in claim 17, wherein said target rotational frequency is higher than said film-forming rotational frequency.

23. A method as defined in claim 17, wherein said target rotational frequency is lower than said film-forming rotational frequency.

24. A method of applying a coating solution to spinning substrates, comprising the steps of:
   (a) operating a control device to spin a substrate, supported by a rotary support device, with a predetermined supplying rotational frequency;
   (b) supplying said coating solution through a coating solution supply device to a central region of said substrate spinning at said supplying rotational frequency;

(c) operating said control device to increase the rotational frequency of said substrate to a target rotational frequency higher than said supplying rotational frequency before said coating solution supplied to said substrate spreads over an entire surface of said substrate, in order to apply a force of inertia to rivulets of said coating solution extending radially from periphery of said coating solution which increases the speed by which the entire surface of the substrate is covered by the coating solution and thereby reduces the quantity of coating solution needed to cover the entire surface to a desired thickness.

25. A method as defined in claim 24, including the further step of operating said control device to spin said substrate supported by said rotary support device at a predetermined film-forming rotational frequency, thereby coating said surface of said substrate with a film of desired thickness.

* * * * *